(12) United States Patent  
Hayles et al.

(10) Patent No.: US 7,996,782 B2  
(45) Date of Patent: *Aug. 9, 2011

(54) DATA TRANSFER INDICATOR ICON IN A DIAGRAM

(75) Inventors: Timothy J. Hayles, Austin, TX (US); David W Fuller, III, Austin, TX (US); Jeffrey N. Correll, Cedar Park, TX (US); John R. Breyer, Austin, TX (US)

(73) Assignee: National Instruments Corporation, Austin, TX (US)

( * ) Notice: Subject to any disclaimer, the term of this patent is extended or adjusted under 35 U.S.C. 154(b) by 1018 days.

This patent is subject to a terminal disclaimer.

(21) Appl. No.: 11/759,995

(22) Filed: Jun. 8, 2007

(65) Prior Publication Data

US 2008/0307332 A1    Dec. 11, 2008

(51) Int. Cl.  
*G06F 3/00* (2006.01)  
*G06F 9/44* (2006.01)

(52) U.S. Cl. ........ 715/763; 715/765; 715/835; 715/967; 717/109

(58) Field of Classification Search ................... 715/763, 715/764, 765, 769, 771, 835, 846, 967; 717/104–109  
See application file for complete search history.

(56) References Cited

U.S. PATENT DOCUMENTS

| | | | |
|---|---|---|---|
| 4,796,179 A | 1/1989 | Lehman et al. | |
| 4,831,580 A | 5/1989 | Yamada | |
| 4,901,221 A | 2/1990 | Kodosky et al. | |
| 4,914,568 A | 4/1990 | Kodosky et al. | |
| 5,089,973 A | 2/1992 | Furtek | |
| 5,210,837 A | 5/1993 | Wiecek | |
| 5,237,691 A | 8/1993 | Robinson | |
| 5,301,301 A | 4/1994 | Kodosky et al. | |
| 5,475,851 A | 12/1995 | Kodosky et al. | |

(Continued)

FOREIGN PATENT DOCUMENTS

EP    1077404    2/2001

OTHER PUBLICATIONS

Edwards, "The Specification and Execution of Heterogeneous Synchronous Reactive Systems", Doctoral Dissertation, University of California, Berkeley, 1997, 170 pages.

(Continued)

*Primary Examiner* — X. L Bautista  
(74) *Attorney, Agent, or Firm* — Meyertons Hood Kivlin Kowert & Goetzel, P.C.; Jeffrey C. Hood; Joel L. Stevens

(57) ABSTRACT

Configuring wires/icons in a diagram. The diagram may be an executable diagram such as a graphical program or a system diagram. The diagram may include a plurality of icons that are connected by wires, and the icons may visually represent functionality of the diagram. The diagram may be executable to perform the functionality. Displaying the diagram may include displaying a first wire in the diagram, where the first wire connects a first icon and a second icon. Data transfer functionality may be specified for the first wire and/or the first or second icon in the diagram. The data transfer functionality may be visually indicated in the diagram, e.g., by appearances of the first icon, the second icon, the first wire, and/or icons displayed proximate to these components of the diagram.

26 Claims, 26 Drawing Sheets

U.S. PATENT DOCUMENTS

| | | | |
|---|---|---|---|
| 5,481,712 | A | 1/1996 | Silver et al. |
| 5,481,741 | A | 1/1996 | McKaskle et al. |
| 5,576,946 | A | 11/1996 | Bender et al. |
| 5,612,866 | A | 3/1997 | Savanyo et al. |
| 5,732,277 | A | 3/1998 | Kodosky et al. |
| 5,742,504 | A | 4/1998 | Meyer et al. |
| 5,862,372 | A | 1/1999 | Morris et al. |
| 5,911,070 | A | 6/1999 | Solton et al. |
| 5,940,296 | A | 8/1999 | Meyer |
| 5,966,532 | A | 10/1999 | McDonald et al. |
| 6,053,951 | A | 4/2000 | McDonald et al. |
| 6,219,628 | B1 | 4/2001 | Kodosky et al. |
| 6,366,300 | B1 | 4/2002 | Ohara |
| 6,437,805 | B1 | 8/2002 | Soojoodi et al. |
| 6,453,464 | B1 | 9/2002 | Sullivan et al. |
| 6,865,429 | B1 | 3/2005 | Schneider et al. |
| 6,880,130 | B2 | 4/2005 | Makowski et al. |
| 7,000,190 | B2 | 2/2006 | Kudukoli et al. |
| 7,043,693 | B2 | 5/2006 | Wenzel et al. |
| 7,062,718 | B2 | 6/2006 | Kodosky et al. |
| 7,076,740 | B2 | 7/2006 | Santori et al. |
| 7,120,876 | B2 | 10/2006 | Washington et al. |
| 7,159,183 | B1 | 1/2007 | Kudukoli et al. |
| 7,200,838 | B2 | 4/2007 | Kodosky et al. |
| 7,210,117 | B2 | 4/2007 | Kudukoli et al. |
| 7,302,675 | B2 | 11/2007 | Rogers et al. |
| 7,606,950 | B2 | 10/2009 | Breyer |
| 2002/0129333 | A1 | 9/2002 | Chandhoke et al. |
| 2003/0071842 | A1 | 4/2003 | King et al. |
| 2003/0071845 | A1 | 4/2003 | King et al. |
| 2004/0031019 | A1 | 2/2004 | Lamanna et al. |
| 2004/0032429 | A1 | 2/2004 | Shah et al. |
| 2004/0034696 | A1 | 2/2004 | Joffrain et al. |
| 2004/0034847 | A1 | 2/2004 | Joffrain et al. |
| 2004/0158812 | A1 | 8/2004 | Dye et al. |
| 2004/0210592 | A1 | 10/2004 | Ciolfi |
| 2004/0230946 | A1 | 11/2004 | Makowski et al. |
| 2005/0028138 | A1 | 2/2005 | Case et al. |
| 2005/0091602 | A1 | 4/2005 | Ramamoorthy et al. |
| 2005/0177816 | A1 | 8/2005 | Kudukoli et al. |
| 2005/0235290 | A1 | 10/2005 | Jefferson et al. |
| 2005/0251789 | A1 | 11/2005 | Peck et al. |
| 2005/0257194 | A1 | 11/2005 | Morrow et al. |
| 2005/0257195 | A1 | 11/2005 | Morrow et al. |
| 2006/0225034 | A1 | 10/2006 | Peck et al. |
| 2006/0253835 | A1* | 11/2006 | Saelens .......... 717/108 |
| 2007/0044030 | A1 | 2/2007 | Hayles |
| 2007/0044071 | A1 | 2/2007 | Hayles |
| 2007/0088865 | A1 | 4/2007 | Breyer |
| 2008/0209392 | A1* | 8/2008 | Able et al. ..... 717/105 |
| 2008/0263456 | A1* | 10/2008 | Stults et al. ......... 715/751 |
| 2008/0263463 | A1* | 10/2008 | Neumann ....... 715/763 |

OTHER PUBLICATIONS

Pino, et al., "Cosimulating Synchronous DSP Designs with Analog RF Circuits", Hewlett Packard, 1999, 15 pages.
Altium Limited, "Altium Nexar release heads 'LiveDesign-enabled' 2004 product line-uo", Press Release, Feb. 17, 2004, 3 pages.
AXYS Design Automation, Inc., "Product Description for MaxCore", 2002, 2 pages.
AXYS Design Automation, Inc., "Product Description for MaxSim", 2002, 2 pages.
Chang, et al., "Heterogeneous Simulation—Mixing Discrete-Event Models with Dataflow", Journal of VLSI Signal Processing, The Netherlands, 1997, pp. 127-144.
Buck, et al., "Ptolemy: A Framework for Simulating and Prototyping Heterogeneous Systems", International Journal in Computer Simulation, vol. 4, No. 2, 1994, pp. 155-182.
Besnard, et al., "Design of a multi-formalism application and distribution in a data-flow context: an example", 12th International Symposium on Languages for International Programming, Athens, Greece, Jun. 1999, pp. 8-30.
Andrade, et al., "Software Synthesis form Dataflow Models for G and LabVIEW", IEEE Asilomar Conference on Signals, Systems, and Computers, Pacific Grove, California, Nov. 1998, pp. 1705-1709.
National Instruments, "The Measurement and Automation Catalog 2004", National Instruments, 2004, 3 pages.
The Mathworks, "Stateflow for State Diagram Modeling User's Guide", Version 4, 1997, 6 pages.
The Mathworks, "Simulink Model-Based and System-Based Design", Version 5, Jul. 2002, 598 pages.
Simulink, "Simulink Release Notes", Jun. 2, 2004, 78 pages.
Chandrachoodan, et al., "An Efficient Timing Model for Hardware Implementation of Multirate Dataflow Graphs", IEEE, 2001, pp. 1153-1156.
"Optilab: Image Processing and Analysis Software for the Apple Macintosh II User's Manual", GTFS Inc., 1990, 238 pages.
Rizzo, "Image Analyst and Enhance", MacUser, Jul. 1990, pp. 55-58.
Rosenthal, et al., "Integrated Approach to Machine Vision Application Development", SPIE vol. 1386, Nov. 8, 1990, pp. 158-162.
Villiger, et al., "Self-timed Ring for Globally-Asynchronous Locally-Synchronous Systems", Proceedings of the 9th International Symposium on Asynchronous Circuits and Systems, 2003, IEEE, pp. 1-10.
Automatix, "Vision for Process Feedback and Control", News Release, www.applefritter.com/macclones/automatix/newsrelease, Jul. 3, 2000, 4 pages.
"GUI Definition", www.whatis.com, http://searchvb.techtarget.com/sDefinition/0,290660,sid8_gci213989,00.html, retrieved May 14, 2007, 1 page.
Mort, et al., "Low Cost Image Analysis Workstation Which Is Menu Driven and Extensible", SPIE, vol. 1232, Feb. 4, 1990, pp. 380-389.
Signal Analytics, IPLab User's Guide, 1991, 268 pages.
Gitlow, "X-Ray Vision", MacGuide Magazine, vol. 2, Issue 4, Jun. 1989, pp. 89-94.
Ford, "Optimage Processes Scientific Images", 1994, 1 page.
Signal Analytics Corp., "Signal Analytics Brings Powerful Scientific Image Processing to the Macintosh II", News Release, Feb. 1, 1990, 2 pages.
Signal Analytics Corp., "IPLab: Serious Scientific Image Processing for the Macintosh II", 1992, 4 pages.
Signal Analytics Corp., "IPLab Gives You Unparalleled Value", 1992, 6 pages.
Signal Analytics Corp., "IPLab Brings Affordable Scientific Image Processing to the Macintosh II", estimated 1990, 2 pages.
Automatix, Inc., "A Seminar on Machine Vision & Image Analysis", 1993, 46 pages
National Instruments, "Measurement and Automation Catalogue 1999", pp. 518-520.
"Ultimage and IPLab Spectrum", MacUser, Jul. 1991, 5 pages.
Magnusson, "State diagram generation", term paper in the graduate course Attribute Grammars, Lund University, Spring 1999, 21 pages.
Vasilache, et al., Translating OMT State Diagrams with Concurrency into SDL Diagrams, University of Tsukuba, Japan, Aug. 28-31, 2000, 7 pages.
"Graphical User Interface (GUI)", The Motive Web Design Glossary, www.motive.co.nz/glossary/gui.php, retrieved May 14, 2007, 2 pages.
National Instruments, "IMAQ Vision Builder Tutorial", Jan. 1999, 73 pages.
"Special Report: Imaging and the Macintosh/Robust Image Databases", Advanced Imaging, Apr. 1991, pp. 18-32.
Bhattacharyya, et al., "Synthesis of Embedded Software from Synchronous Dataflow Specification", Journal of VLSI Signal Processing, vol. 21, 1999, pp. 151-166.
Hunt, "IDF: A graphical dataflow programming language for image processing and computer vision", IEEE, 1990, retrieved from the IEEE database, Jan. 7, 2003, pp. 351-360.
Keddy, et al., "DEDIP: A User-friendly environment for digital image processing algorithm development", IEEE, 1991, retrieved from the IEEE database on Jan. 1, 2003, pp. 733-736.
Konstantinides, et al., "The Khoros Software Development Environment for Image and Signal Processing", 1992 retrieved from http://www.hpl.hp.com/techreports/92/HPL-92-96.pdf on Jan. 7, 2003, p. 1-14.
Sim, et al., "Design and Implementation of the Visual Programming Environment for the Distributed Image Processing", IEEE, 1996, retrieved from IEEE database on Jan. 7, 2003, pp. 149-152.

"SILMA Products—Production PILOT", retrieved from Internet on May 24, 2001, www.adept.com/Silma/products/pd-productionpilothtml, 4 pages.

"RoboWorks", Newtonium, retrieved from Internet on Mar. 30, 2002, www.newtonium.com/public_html/Products/RoboWorks/RoboWorks.htm, 3 pages.

National Instruments, "The Measurement of Automation Catalog 2002", 19 pages.

Compumotor, "Motion Architect User Guide", Aug. 1994, 24 pages.

GE Fanuc, "GE Fanuc Automation—Software Solutions", 2002, 8 pages.

GE Industrial Systems, "CIMPLICITY Machine Edition—Motion Developer", Dec. 6, 2001, 4 pages.

GE Fanuc, "GE Fanuc Automation—CIMPLICITY Machine Edition", 2000, 4 pages.

"Motion Builder: Making Motion Control Programming Easy", Servo Catalogue, Parker Automation, undated, pp. 86-87.

Lee, Edward A., Stephen Neuendorffer, "Actor-Oriented Design of Embedded Hardware and Software Systems", Journal of Circuits, Systems, and Computers, vol. 12, No. 3, World Scientific Publishing Company, 2003, 30 pages.

Lee, Edward A., "Embedded Software", Advances in Computers, vol. 56, Academic Press, London, 2002, 34 pages.

Lee, Edward A., Stephen Neuendorffer, "Concurrent Models of Computation for Embedded Software", IEE Proc.-Comput. Digit. Tech., vol. 152, No. 2, Mar. 2005, 12 pages.

U.S. Appl. No. 11/759,991, titled "Diagram with Configurable Wires", filed Jun. 8, 2007, whose inventors are Jeffrey L. Kodosky, Jeffrey N. Correll, David W. Fuller III, Timothy J. Hayles, John R. Breyer, and Jacob Kornerup, 105 pages.

Lee, Edward A. et al, "Ptolemy II, Heterogeneous Concurrent Modeling and Design in Java", Jul. 29, 2004, http://ptolemy.eecs.berkeley.edu/papers/04/ptIIDesignIntro/ptIIdesign1-intro.pdf, 282 pages.

* cited by examiner

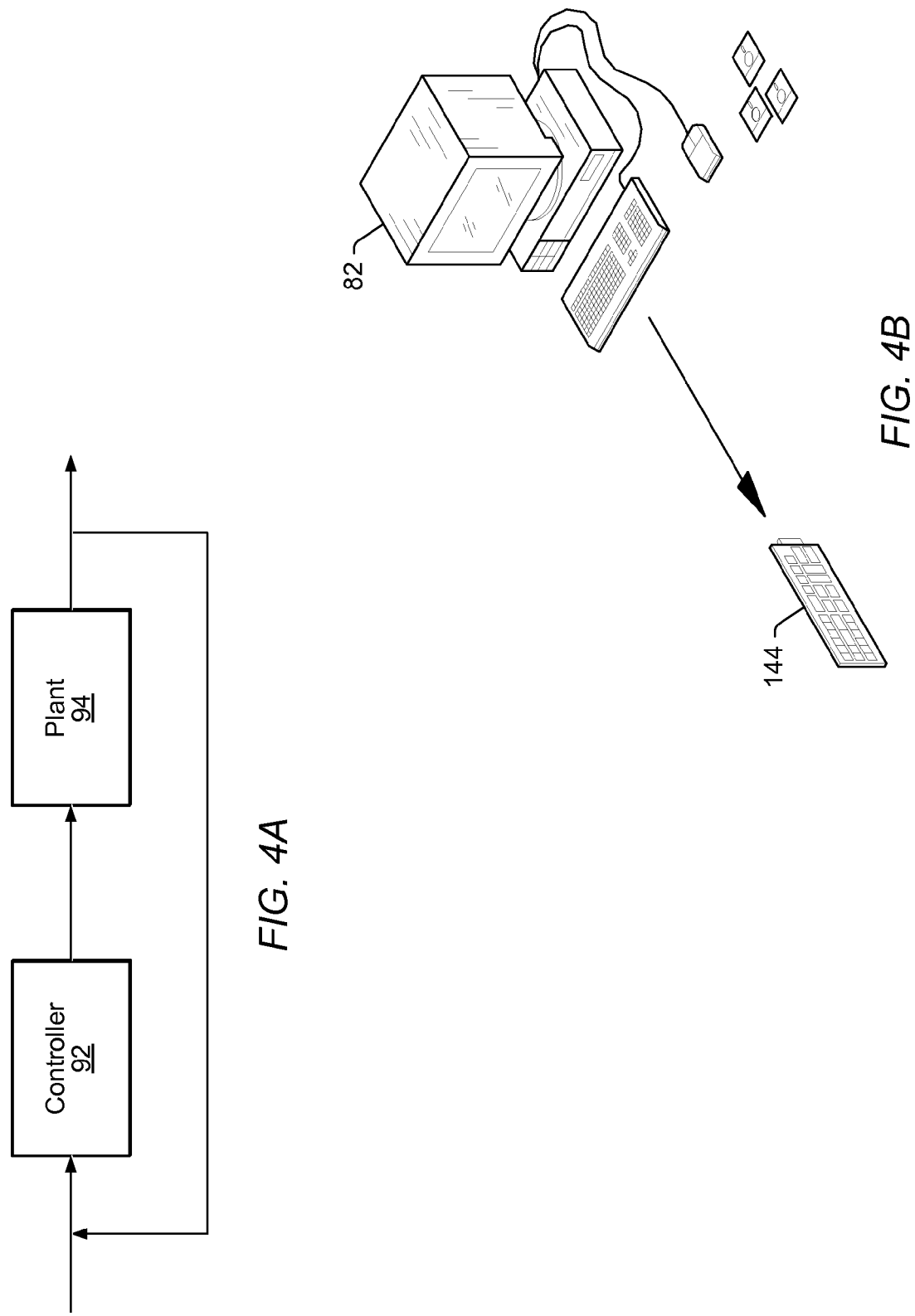

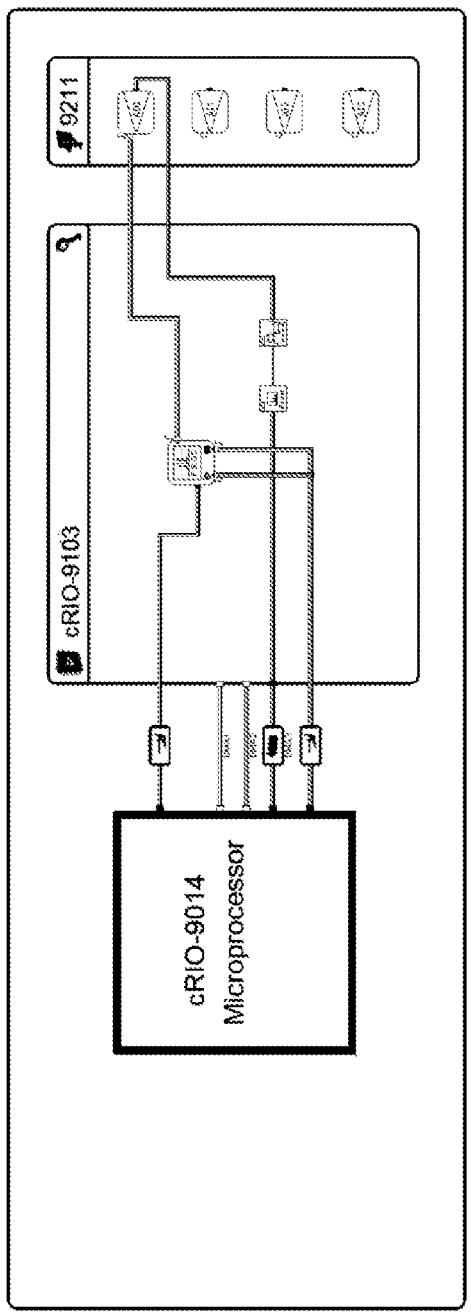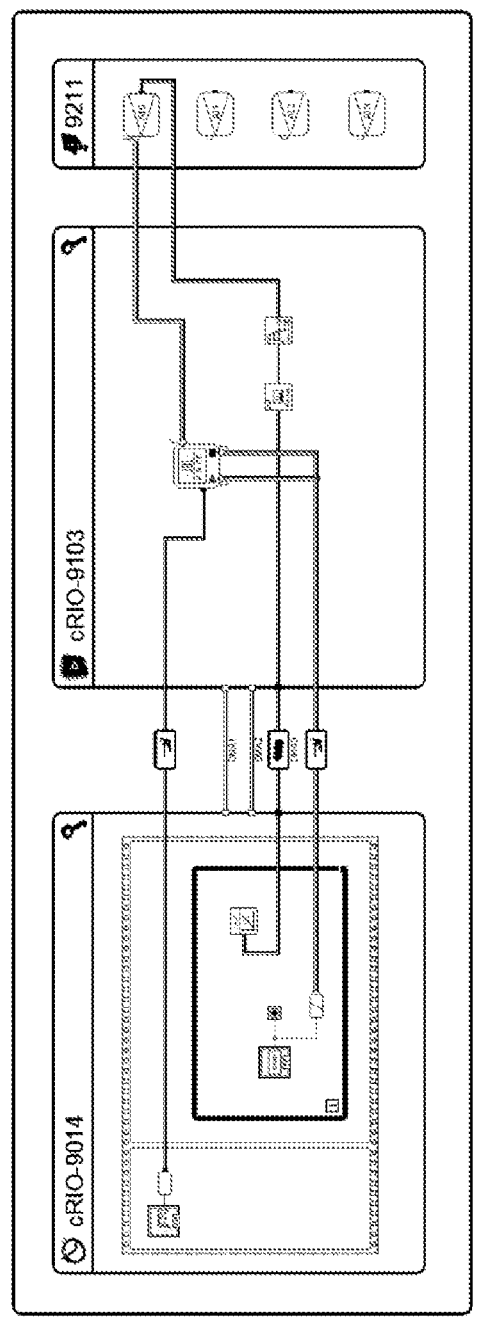
FIG. 9A
FIG. 9B

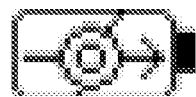
FIG. 16A          FIG. 16B          FIG. 16C
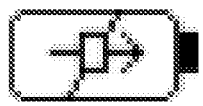
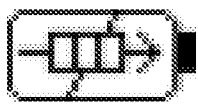
FIG. 16D          FIG. 16E          FIG. 16F
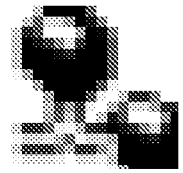
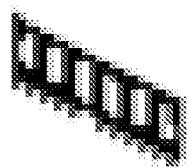
FIG. 16G          FIG. 16H
FIG. 16I
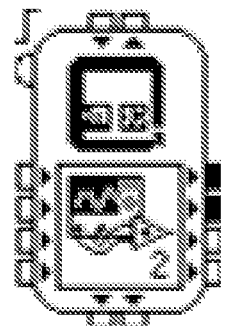
FIG. 16J Signal display (150 samples) 2210
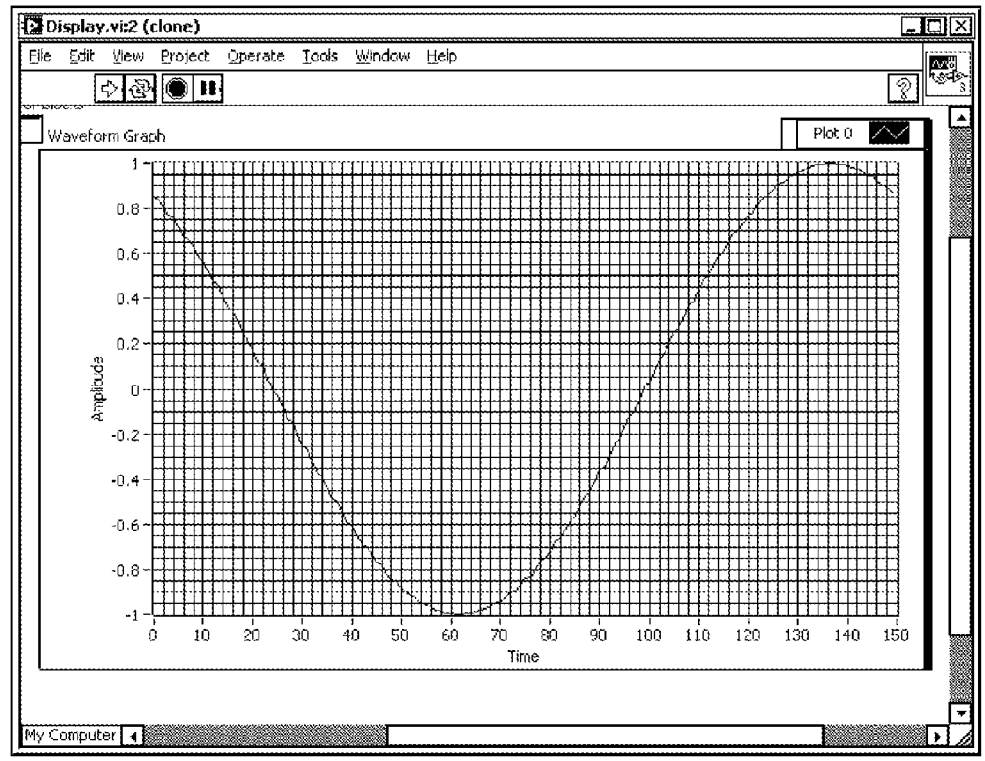
Signal display (300 samples) 2220
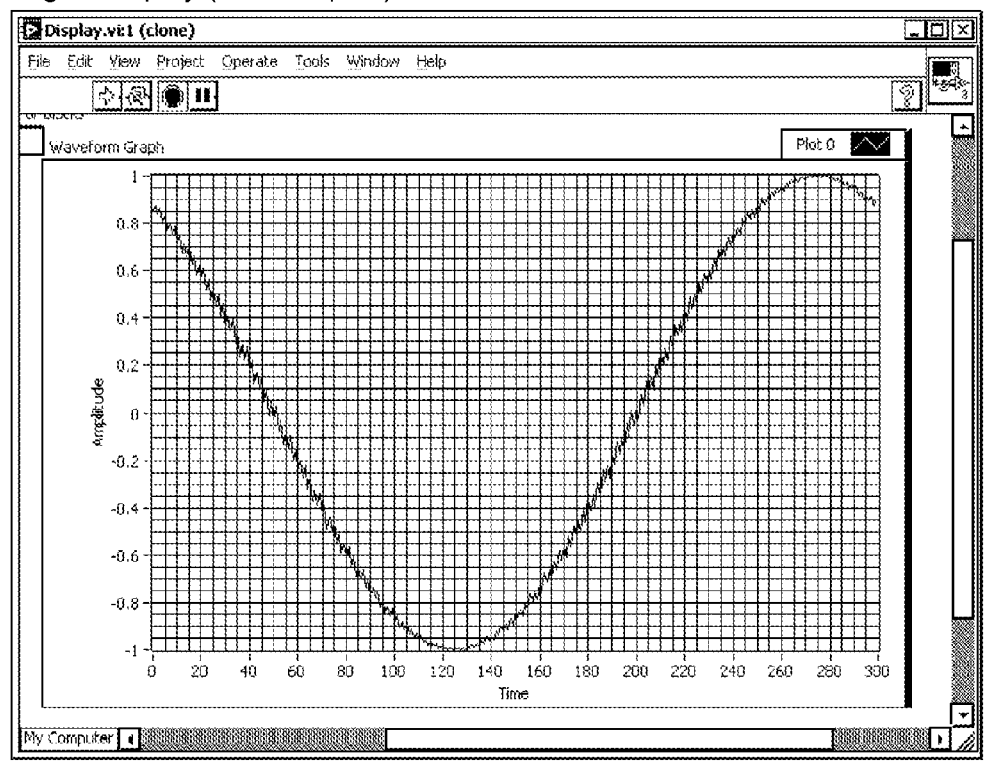
*FIG. 22*

DATA TRANSFER INDICATOR ICON IN A DIAGRAM

FIELD OF THE INVENTION

The present invention relates to the field of graphical programming, and more particularly to a system and method for wire configuration in a diagram.

DESCRIPTION OF THE RELATED ART

In data flow based graphical programs, the wires used to communicate between graphical program nodes (which may themselves be or represent graphical programs) are subject to data flow rules or protocols. For example, in graphical programs that are data flow diagrams, a node will not execute or "fire" until all necessary data inputs to the node are present. Thus communication between nodes via current data flow wires is constrained to be synchronous, which may limit the functionality and execution of graphical programs. This is especially true for diagrams that include multiple (substantially) concurrently executing portions, e.g., nodes, VIs, sub-VIs, or other graphical program elements or constructs, which may be referred to herein generally as nodes. In some prior art approaches to communication between nodes, variables, such as local or global variables, or queues, may be used to pass data back and forth between the nodes. For example, applications that include concurrent loops that communicate with each other typically require queues or global variables to transfer data between the loops. However, there is currently no graphical way of depicting this connection, and moreover, it is not very convenient to construct. For example, using global variables only provides the name association, and using built-in queues involves a non-intuitive construction where the queue is allocated at the top level diagram and the reference is passed down both to the writer and to the reader.

FIG. 1 illustrates communication between two while loops 102 and 104 via a shared variable, where, as may be seen, a random number is generated by a first node 103 represented by an icon of a pair of dice and contained in the top while loop 102, and placed in or written to a numeric variable, labeled "numeric". The numeric variable is then accessed or read by a second node 105, in this case, an add node (a triangle node labeled "+1", contained in the bottom while loop 104), and the value incremented by 1, and the result displayed (as a double).

As may be seen, there is no explicit indication of the variable-based means for communicating between the while loops. Thus, for program nodes, elements, etc., that are not placed near one another, it may not be clear that such communication is occurring or accommodated, possibly leading to confusion, and/or programming or operational errors.

Thus, improved means for communications between graphical program nodes are desired.

SUMMARY OF THE INVENTION

Various embodiments are presented of a diagram with configurable wires.

A diagram may be displayed on a display which includes a plurality of icons connected by wires. The plurality of interconnected icons may visually represent functionality of the diagram, and the diagram may be executable to perform the functionality. The diagram may be a graphical program or system diagram. The icons may represent software functions (e.g., similar to nodes in a graphical program) or may represent devices, as desired. For example, the icons in the diagram may represent logical elements, processing elements, configurable elements, and/or other devices/functions. Thus, in one embodiment, the diagram may include a data flow diagram, where the icons represent functions and the wires indicate that data produced by one icon is used by another icon. Additionally, the diagram may also include one or more processing elements or icons which represent devices for executing the nodes or functions. In some embodiments, the nodes executed by a device may be represented as a plurality of interconnected nodes or icons (e.g., a graphical program portion) that is included within a target execution icon which represents a device. Displaying the diagram may include displaying a first wire connecting a first icon and a second icon in the diagram.

The first wire or icon(s) may be configured. Configuring the wire or icon may include specifying data transfer functionality of the wire or icon. For example, configuring the wire or icon may include specification of data exchange semantics, data transport protocols, data transport mediums, and/or other specifications related to data transfers. The data exchange semantics may include the method by which the data may be transferred, e.g., using a circular buffer, register, queues, and/or other buffered semantics. The data transport protocol may specify a method for implementing the data exchange semantics for the first wire. For example, the data transport protocol may be the specific protocol used to transmit the data over the data transport medium (e.g., the networked connection, the PCI bus, etc.). Exemplary data transport protocols include TCP/IP, USB, DMA, register access, etc. Data transport mediums indicate the medium by which the data is transferred, e.g., physical media such as wires, busses, Ethernet, etc., and/or wireless means.

Configuring the wire or icon may also include specifying read or write policies for the first wire or icon, specifying directionality of the wire (e.g., the direction of data flow), semantics of wire branching, and/or specification of data structures associated with the first wire or icon. Additionally, the data transport protocol may be adapted to the data exchange semantics, e.g., by combining program logic with the data transport protocol to implement the data exchange semantics. In one embodiment, configuration of the wire or icon may include configuring the wire to provide transport status information. Thus, configuring the wire or icon may include specification of communication behavior for the first wire or icon(s).

In some embodiments, configuring the wire or icon may be performed automatically or manually as desired. Automatic configuration of the first wire or icon may be completely automatic (i.e., without any user input specifying the configuration) or partially automatic. For example, the user may specify data exchange semantics for the first wire or icon, and the data transport protocol and/or data transport medium for the data transfer may be automatically determined and specified for the first wire or icon. Similarly, any combination of the data transfer functionality (e.g., the semantics, protocol, or medium) may be automatically determined using the semantics, protocol, and/or medium already specified by the user. However, as noted above, the entire configuration may be performed automatically. Note that automatic determination of portions of the data transfer functionality (e.g., the data transport protocol) may be determined based on the communication properties (e.g., the communication policies) of the first wire and/or the endpoints (e.g., the icons) of the first wire.

Configuring the first wire or icon may include the user selecting the first wire or icon, and then configuring the first wire or icon using a graphical user interface (GUI) or a series of GUIs (e.g., a wizard). Additionally, or alternatively, configuring the first wire or icon may include specification of a graphical program which describes the data transfer functionality of the first wire or icon. In some embodiments, the user may select and/or configure the wire or icon by selecting an affordance of the wire. The affordance of the wire may be an icon displayed on or proximate to the wire or icon, or may be the entirety of the wire or icon, among other options.

In some embodiments, configuring the first wire or icon may include associating an already configured icon or wire with the first wire or icon. For example, the user may simply drag an already configured wire or icon onto the first wire or icon to configure the first wire or icon. In one embodiment, the user may select preconfigured wires or icons (e.g., data transfer icons) and use those icons to configure or connect icons in the diagram, thereby associating data transfer functionality with the icons or wires in the diagram.

After configuration, the first wire or icon may visually indicate that data from the first icon is provided to the second icon according to the data transfer functionality (e.g., the data exchange semantics specified during configuring of the first wire). For example, the first wire or icon may take on a new appearance after configuration indicating the specified configuration. For example, the first wire may take on a pattern, color, and/or thickness which indicates the configuration of the first wire. Additionally, the visual appearances of the wire (which indicate various different configurations) may include a 3D appearance, a tube appearance, a separated appearance, and/or a curved appearance (e.g., in addition to the patterns, colors, and/or thicknesses described above). Thus, the first wire may visually indicate the configuration of the first wire.

Alternatively, a data transfer icon (or data transfer indicator) may be displayed proximate to the wire to visually indicate the data transfer functionality of the wire. In some embodiments, the data transfer icon may be an affordance for the first wire, e.g., which may be used to configure the first wire. The data transfer icon may represent a circular buffer (e.g., including at least one circle and arrow), a FIFO (e.g., including a plurality of rectangles and an arrow), a register, a mailbox (e.g., including at least one rectangle and an arrow), and/or other semantics/appearances.

In some embodiments, where the icon is configured, the icon may take on a similarly take on a new appearance, or a data transfer icon/indicator may be displayed proximate to the icon. In one embodiment, the data transfer icon may be connected to the first icon via the first wire. Alternatively, the data transfer icon may be included within the first icon.

The diagram may be executed after configuration. During execution of the diagram, the data transfer functionality may be performed as specified by the first wire. For example, where the first wire specifies data transfer between two devices, the data may be transferred between the two devices as stipulated by the configured wire. Where the first wire specifies data transfer between two or more functions or code portions executing on a computer a system, the data transfer may be performed as specified for the first wire. Thus, during execution, the diagram may be executed according to the configured data transfer functionality of the first wire.

BRIEF DESCRIPTION OF THE DRAWINGS

A better understanding of the present invention can be obtained when the following detailed description of the preferred embodiment is considered in conjunction with the following drawings, in which:

FIG. 4A is a high-level block diagram of an exemplary system which may execute or utilize diagrams;

FIG. 4B illustrates an exemplary system that may perform control and/or simulation functions utilizing diagrams;

FIGS. 9A and 9B are screen shots of a composite view of a system diagram and a physical diagram according to one embodiment;

FIGS. 16A-16J are exemplary icons which may be used for indicating or configuring configurable wires according to one embodiment;

FIG. 22 illustrates exemplary output from the signal processing graphical program of FIG. 21.

Figure 1:
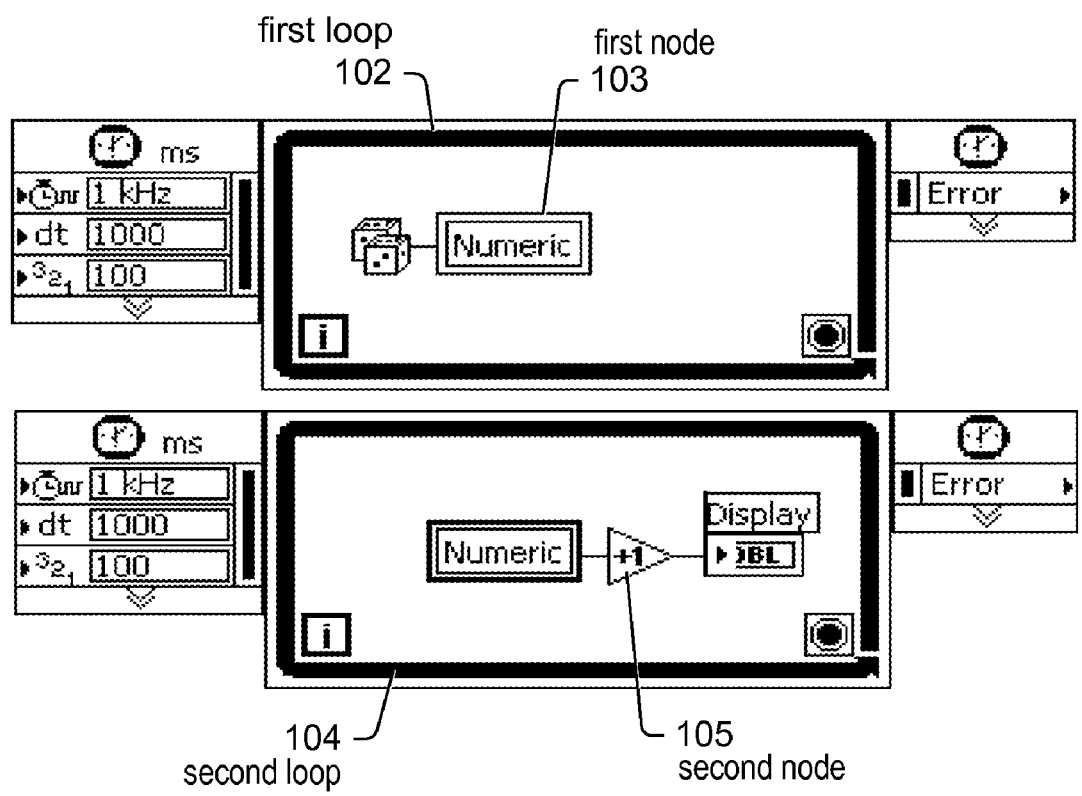
FIG. 1 illustrates a graphical program with communication between two while loops via a shared variable, according to the prior art.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE EMBODIMENTS

Incorporation by Reference

The following references are hereby incorporated by reference in their entirety as though fully and completely set forth herein:

U.S. Pat. No. 5,481,741 titled "Method and Apparatus for Providing Attribute Nodes in a Graphical Data Flow Environment".

U.S. Pat. No. 6,173,438 titled "Embedded Graphical Programming System" filed Aug. 18, 1997.

U.S. Pat. No. 6,219,628 titled "System and Method for Configuring an Instrument to Perform Measurement Functions Utilizing Conversion of Graphical Programs into Hardware Implementations," filed Aug. 18, 1997.

U.S. Pat. No. 6,763,515, titled "System and Method for Automatically Generating a Graphical Program to Perform an Image Processing Algorithm," filed Jun. 5, 2000.

U.S. Patent Application Publication No. 2001/0020291 (Ser. No. 09/745,023) titled "System and Method for Programmatically Generating a Graphical Program in Response to Program Information," filed Dec. 20, 2000.

U.S. patent application Ser. No. 11/462,393, titled "Asynchronous Wires for Graphical Programming", filed Aug. 4, 2006.

U.S. Pat. No. 7,042,469, titled "Multiple Views for a Measurement System Diagram," filed Dec. 23, 2002.

U.S. Patent Application Publication No. 2007/0044030, titled "Graphical Programming Methods for Generation, Control and Routing of Digital Pulses," filed Aug. 8, 2006.

U.S. Provisional Ser. No. 60/869,221, titled "System Diagram that Illustrates Programs in a Distributed System Having Multiple Targets," filed Dec. 8, 2006.

U.S. Provisional Ser. No. 60/821,512, titled "Execution Target Structure Node for a Graphical Program," filed Aug. 4, 2006.

U.S. application Ser. No. 10/893,745, titled Graphically Representing Timing in a Graphical Program, filed Jul. 16, 2004.

Terms

The following is a glossary of terms used in the present application:

Memory Medium—Any of various types of memory devices or storage devices. The term "memory medium" is intended to include an installation medium, e.g., a CD-ROM, floppy disks 104, or tape device; a computer system memory or random access memory such as DRAM, DDR RAM, SRAM, EDO RAM, Rambus RAM, etc.; or a non-volatile memory such as a magnetic media, e.g., a hard drive, or optical storage. The memory medium may comprise other types of memory as well, or combinations thereof. In addition, the memory medium may be located in a first computer in which the programs are executed, or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as a physical transmission medium, such as a bus, network, and/or other physical transmission medium that conveys signals such as electrical, electromagnetic, or digital signals.

Programmable Hardware Element—includes various hardware devices comprising multiple programmable function blocks connected via a programmable interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic".

Program—the term "program" is intended to have the full breadth of its ordinary meaning. The term "program" includes 1) a software program which may be stored in a memory and is executable by a processor or 2) a hardware configuration program useable for configuring a programmable hardware element.

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, such as C, C++, Pascal, Fortran, Cobol, Java, assembly language, etc.; graphical programs (programs written in graphical programming languages); assembly language programs; programs that have been compiled to machine language; scripts; and other types of executable software. A software program may comprise two or more software programs that interoperate in some manner.

Hardware Configuration Program—a program, e.g., a netlist or bit file, that can be used to program or configure a programmable hardware element.

Diagram—A graphical image displayed on a computer display which visually indicates relationships between graphical elements in the diagram. Diagrams may include configuration diagrams, system diagrams, physical diagrams, and/or graphical programs (among others). In some embodiments, diagrams may be executable to perform specified functionality, e.g., measurement or industrial operations, which is represented by the diagram. Executable diagrams may include graphical programs (described below) where icons connected by wires illustrate functionality of the graphical program. Alternatively, or additionally, the diagram may comprise a system diagram which may indicate functionality and/or connectivity implemented by one or more devices. Various graphical user interfaces (GUIs), e.g., front panels, may be associated with the diagram.

Graphical Program—A program comprising a plurality of interconnected nodes or icons, wherein the plurality of interconnected nodes or icons visually indicate functionality of the program. A graphical program is a type of diagram.

The following provides examples of various aspects of graphical programs. The following examples and discussion are not intended to limit the above definition of graphical program, but rather provide examples of what the term "graphical program" encompasses:

The nodes in a graphical program may be connected in one or more of a data flow, control flow, and/or execution flow format. The nodes may also be connected in a "signal flow" format, which is a subset of data flow.

Exemplary graphical program development environments which may be used to create graphical programs include LabVIEW, DasyLab, DiaDem and Matrixx/SystemBuild from National Instruments, Simulink from the MathWorks, VEE from Agilent, WiT from Coreco, Vision Program Manager from PPT Vision, SoftWIRE from Measurement Computing, Sanscript from Northwoods Software, Khoros from Khoral Research, SnapMaster from HEM Data, VisSim from Visual Solutions, ObjectBench by SES (Scientific and Engineering Software), and VisiDAQ from Advantech, among others.

The term "graphical program" includes models or block diagrams created in graphical modeling environments, wherein the model or block diagram comprises interconnected nodes or icons that visually indicate operation of the model or block diagram; exemplary graphical modeling environments include Simulink, SystemBuild, VisSim, Hypersignal Block Diagram, etc.

A graphical program may be represented in the memory of the computer system as data structures and/or program instructions. The graphical program, e.g., these data structures and/or program instructions, may be compiled or interpreted to produce machine language that accomplishes the desired method or process as shown in the graphical program.

Input data to a graphical program may be received from any of various sources, such as from a device, unit under test, a process being measured or controlled, another computer program, a database, or from a file. Also, a user may input data to a graphical program or virtual instrument using a graphical user interface, e.g., a front panel.

A graphical program may optionally have a GUI associated with the graphical program. In this case, the plurality of interconnected nodes are often referred to as the block diagram portion of the graphical program.

Data Flow Graphical Program (or Data Flow Diagram)—A graphical program or diagram comprising a plurality of interconnected nodes, wherein the connections between the nodes indicate that data produced by one node is used by another node.

Physical Diagram—A diagram which visually indicates physical connectivity between physical devices. For example, a physical diagram may visually indicate the connectivity of various physical components in a measurement system, e.g., a computer connected to a measurement device via an Ethernet network. Thus the wires in a physical diagram represent physical connectivity between devices. A physical diagram may show the corresponding "real world" physical system/devices.

Configuration Diagram—A diagram which indicates connectivity between real and/or virtual devices. A configuration diagram may visually indicate physical connectivity between physical devices as shown in a physical diagram. However, in some embodiments, one or more of the devices (or all of the devices) in the configuration diagram may be virtual or simulated devices. Thus, some or all of the devices in the configuration diagram may not be physically present in the system represented by the configuration diagram.

System Diagram—A diagram with one or more device icons and graphical program code, wherein the device icons are use to specify and/or visually indicate where different portions of graphical program code are deployed/executed. A system diagram may indicate where (i.e., on which system/device) programs or code may be executed. For example, the system diagram may include graphical indications showing where portions of the displayed graphical program code are executed. In some embodiments, various ones of the icons may represent processing elements which have associated programs for execution. At least one of the icons may represent logical elements (e.g., executable software functions or graphical program code). One or more of the device icons may represent configurable elements. Thus, the system diagram may provide a system view which allows a user to easily understand where graphical program code is deployed among the various devices in the system.

Node—In the context of a graphical program, an element that may be included in a graphical program. The graphical program nodes (or simply nodes) in a graphical program may also be referred to as blocks. A node may have an associated icon that represents the node in the graphical program, as well as underlying code and/or data that implements functionality of the node. Exemplary nodes (or blocks) include function nodes, sub-program nodes (sub-VIs), terminal nodes, structure nodes, etc. Nodes may be connected together in a graphical program by connection icons or wires. The term "logical element" is used herein to refer to a "node". For example, the term "logical element: may refer to a software program portion or code that is executable by (or implementable on) a processing element, and which is represented iconically on a display. Logical elements include virtual instruments (VIs), primitives, etc. Logical elements may be displayed in various ones of the diagrams described herein, e.g., in graphical programs, system diagrams, etc.

Wire—a graphical element displayed in a diagram on a display that connects icons or nodes in the diagram. The diagram may be a graphical program (where the icons correspond to software functions), a system diagram (where the icons may correspond to hardware devices or software functions), etc. The wire is generally used to indicate, specify, or implement communication between the icons. Wires may represent logical data transfer between icons, or may represent a physical communication medium, such as Ethernet, USB, etc. Wires may implement and operate under various protocols, including data flow semantics, non-data flow semantics, etc. Some wires, e.g., buffered data transfer wires, may be configurable to implement or follow specified protocols or semantics. Wires may indicate communication of data, timing information, status information, control information, and/or other information between icons. In some embodiments, wires may have different visual appearances which may indicate different characteristics of the wire (e.g., type of data exchange semantics, data transport protocols, data transport mediums, and/or type of information passed between the icons, among others).

Graphical User Interface—this term is intended to have the full breadth of its ordinary meaning. The term "Graphical User Interface" is often abbreviated to "GUI". A GUI may comprise only one or more input GUI elements, only one or more output GUI elements, or both input and output GUI elements.

The following provides examples of various aspects of GUIs. The following examples and discussion are not intended to limit the ordinary meaning of GUI, but rather provide examples of what the term "graphical user interface" encompasses:

A GUI may comprise a single window having one or more GUI Elements, or may comprise a plurality of individual GUI Elements (or individual windows each having one or more GUI Elements), wherein the individual GUI Elements or windows may optionally be tiled together.

A GUI may be associated with a diagram, e.g., a graphical program. In this instance, various mechanisms may be used to connect GUI Elements in the GUI with nodes or icons in the diagram/graphical program. For example, when Input Controls and Output Indicators are created in the GUI, corresponding nodes (e.g., terminals) may be automatically created in the diagram or graphical program. Alternatively, the user can place terminal nodes in the diagram which may cause the display of corresponding GUI Elements front panel objects in the GUI, either at edit time or later at run time. As another example, the GUI may comprise GUI Elements embedded in the block diagram portion of the graphical program.

Front Panel—A Graphical User Interface that includes input controls and output indicators, and which enables a user to interactively control or manipulate the input being provided to a program or diagram, and view output of the program or diagram, during execution.

A front panel is a type of GUI. A front panel may be associated with a diagram or graphical program as described above.

In an instrumentation application, the front panel can be analogized to the front panel of an instrument. In an industrial automation application the front panel can be analogized to the MMI (Man Machine Interface) of a device. The user may adjust the controls on the front panel to affect the input and view the output on the respective indicators.

Graphical User Interface Element—an element of a graphical user interface, such as for providing input or displaying output. Exemplary graphical user interface elements comprise input controls and output indicators Input Control—a graphical user interface element for providing user input to a program. Exemplary input controls comprise dials, knobs, sliders, input text boxes, etc.

Output Indicator—a graphical user interface element for displaying output from a program. Exemplary output indicators include charts, graphs, gauges, output text boxes, numeric displays, etc. An output indicator is sometimes referred to as an "output control".

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Measurement Device—includes instruments, data acquisition devices, smart sensors, and any of various types of devices that are operable to acquire and/or store data. A measurement device may also optionally be further operable to analyze or process the acquired or stored data. Examples of a measurement device include an instrument, such as a traditional stand-alone "box" instrument, a computer-based instrument (instrument on a card) or external instrument, a data acquisition card, a device external to a computer that operates similarly to a data acquisition card, a smart sensor, one or more DAQ or measurement cards or modules in a chassis, an image acquisition device, such as an image acquisition (or machine vision) card (also called a video capture board) or smart camera, a motion control device, a robot having machine vision, and other similar types of devices. Exemplary "stand-alone" instruments include oscilloscopes, multimeters, signal analyzers, arbitrary waveform generators, spectroscopes, and similar measurement, test, or automation instruments.

A measurement device may be further operable to perform control functions, e.g., in response to analysis of the acquired or stored data. For example, the measurement device may send a control signal to an external system, such as a motion control system or to a sensor, in response to particular data. A measurement device may also be operable to perform automation functions, i.e., may receive and analyze data, and issue automation control signals in response.

Processing Element—A hardware component or device which is operable to execute software, implement code (e.g., program code), be configured according to a hardware description, etc. Processing elements include various processors and/or programmable hardware elements (e.g., field programmable gate arrays (FPGAs)), or systems that contain processors or programmable hardware elements, among others. For example, a processing element may refer to an individual processor in a computer system or the computer system itself.

Configurable Elements—Systems or devices that provide configurable functionality but do not themselves includes processors that process data. Configurable elements may produce and/or consume data that may be provided to or received from various processing elements. A configurable element may have or receive configuration data that specifies functionality of the configurable element. Configurable elements comprise data acquisition (DAQ) devices and/or other sensors/devices.

Figure 2A:
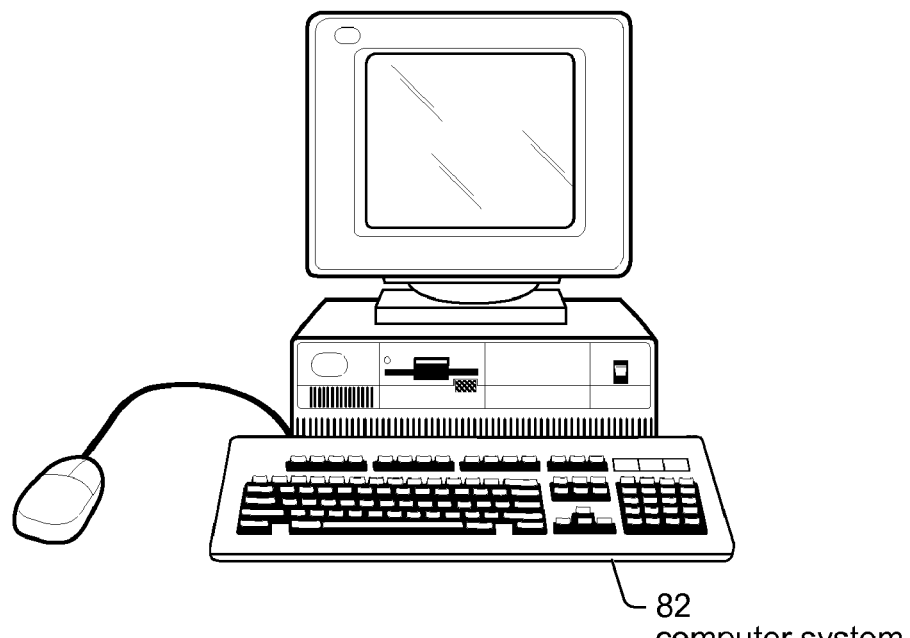
FIG. 2A illustrates a computer system operable to execute a diagram according to an embodiment of the present invention.

FIG. 2A—Computer System

FIG. 2A illustrates a computer system 82 operable to display and/or execute a diagram, e.g., a system diagram or graphical program, configured to utilize the various communication techniques disclosed herein. As shown in FIG. 2A, the computer system 82 may include a display device operable to display the diagram as the diagram is created and/or executed. The display device may also be operable to display a graphical user interface or front panel of the graphical program during execution of the graphical program. The graphical user interface may comprise any type of graphical user interface, e.g., depending on the computing platform.

The computer system 82 may include a memory medium(s) on which one or more computer programs or software components according to one embodiment of the present invention may be stored. For example, the memory medium may store one or more diagrams that are executable to perform the methods described herein. Also, the memory medium may store a development environment application used to create and/or execute such diagrams. The memory medium may also store operating system software, as well as other software for operation of the computer system. Various embodiments further include receiving or storing instructions and/or data implemented in accordance with the foregoing description upon a carrier medium.

Figure 2B:
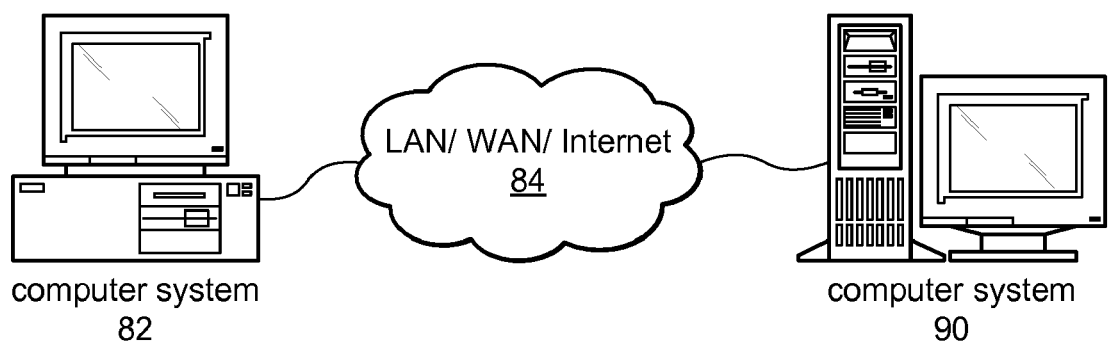
FIG. 2B illustrates a network system comprising two or more computer systems that may implement an embodiment of the present invention.

FIG. 2B—Computer Network

FIG. 2B illustrates a system including a first computer system 82 that is coupled to a second computer system 90. The computer system 82 may be connected through a network 84 (or a computer bus) to the second computer system 90. The computer systems 82 and 90 may each be any of various types, as desired. The network 84 can also be any of various types, including a LAN (local area network), WAN (wide area network), the Internet, or an Intranet, among others. The computer systems 82 and 90 may execute a diagram (e.g., a graphical program or system diagram) in a distributed fashion. For example, computer 82 may execute a first portion of the block diagram of a graphical program and computer system 90 may execute a second portion of the block diagram of the graphical program. As another example, computer 82 may display the graphical user interface of a graphical program and computer system 90 may execute the block diagram of the graphical program. Similar descriptions apply to other executable diagrams.

In one embodiment, a GUI of a diagram may be displayed on a display device of the computer system 82, and while at least a portion of the diagram executes on device 190 connected to the computer system 82. The device 190 may include a programmable hardware element and/or may include a processor and memory medium which may execute a real time operating system. In one embodiment, the diagram may be downloaded and executed on the device 190. For example, an application development environment with which the diagram is associated may provide support for downloading a diagram for execution on the device in a real time system.

Exemplary Systems

Embodiments of the present invention may be involved with performing test and/or measurement functions; controlling and/or modeling instrumentation or industrial automation hardware; modeling and simulation functions, e.g., modeling or simulating a device or product being developed or tested, etc. Exemplary test applications where the graphical program may be used include hardware-in-the-loop testing and rapid control prototyping, among others.

However, it is noted that the present invention can be used for a plethora of applications and is not limited to the above applications. In other words, applications discussed in the present description are exemplary only, and the present invention may be used in any of various types of systems. Thus, the system and method of the present invention is operable to be used in any of various types of applications, including the control of other types of devices such as multimedia devices, video devices, audio devices, telephony devices, Internet devices, etc., as well as general purpose software applications such as word processing, spreadsheets, network control, network monitoring, financial applications, games, etc.

Figure 3A:
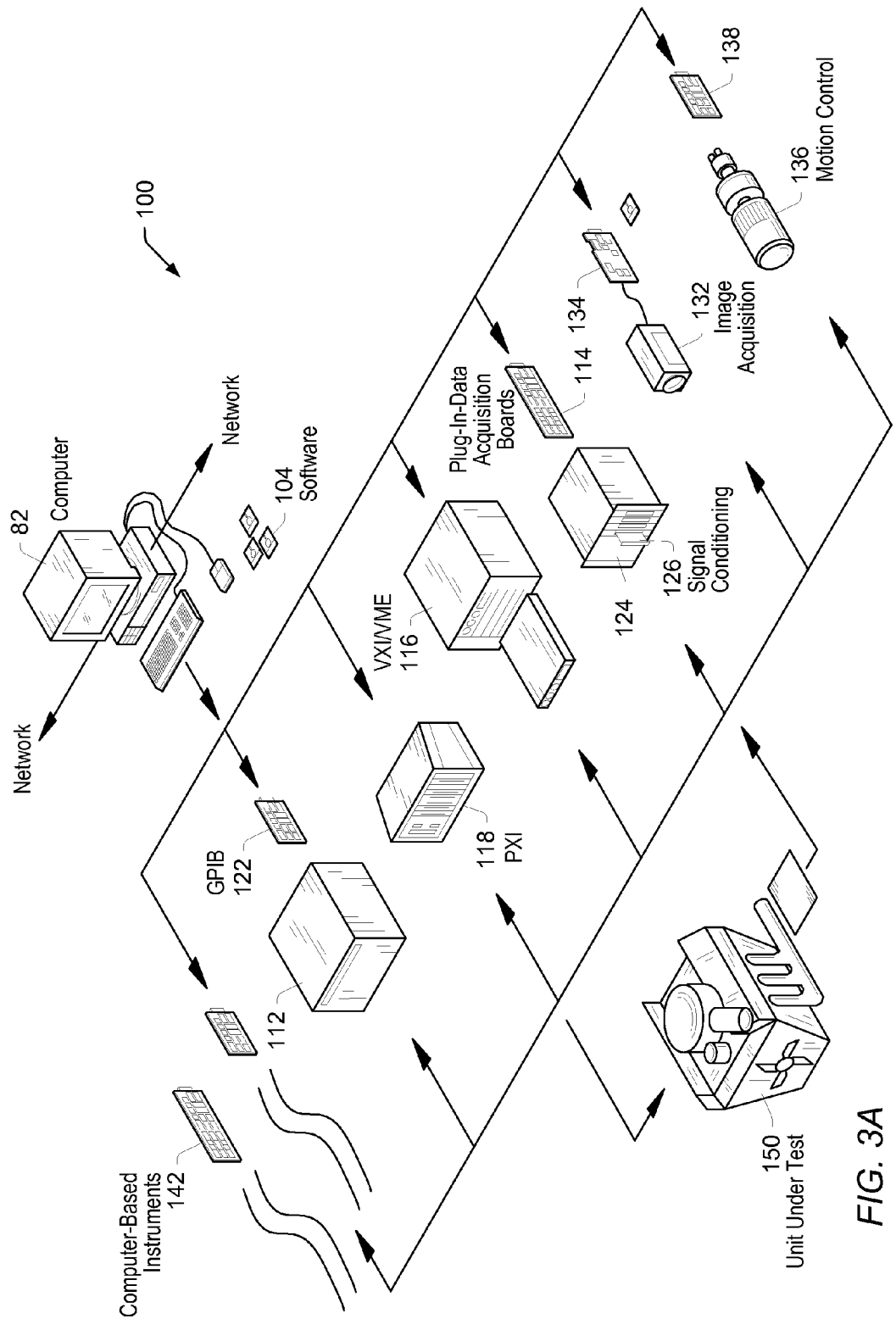
FIG. 3A illustrates an instrumentation control system according to one embodiment of the invention.

FIG. 3A illustrates an exemplary instrumentation control system 100 which may implement embodiments of the invention. The system 100 comprises a host computer 82 which connects to one or more instruments. The host computer 82 may comprise a CPU, a display screen, memory, and one or more input devices such as a mouse or keyboard as shown. The computer 82 may operate with the one or more instruments to analyze, measure or control a unit under test (WUT) or process 150.

The one or more instruments may include a GPIB instrument 112 and associated GPIB interface card 122, a data acquisition board 114 and associated signal conditioning circuitry 124, a VXI instrument 116, a PXI instrument 118, a video device or camera 132 and associated image acquisition (or machine vision) card 134, a motion control device 136 and associated motion control interface card 138, and/or one or more computer based instrument cards 142, among other types of devices. The computer system may couple to and operate with one or more of these instruments. The instruments may be coupled to a unit under test (UUT) or process 150, or may be coupled to receive field signals, typically generated by transducers. The system 100 may be used in a data acquisition and control application, in a test and measurement application, an image processing or machine vision application, a process control application, a man-machine interface application, a simulation application, or a hardware-in-the-loop validation application, among others.

Figure 3B:
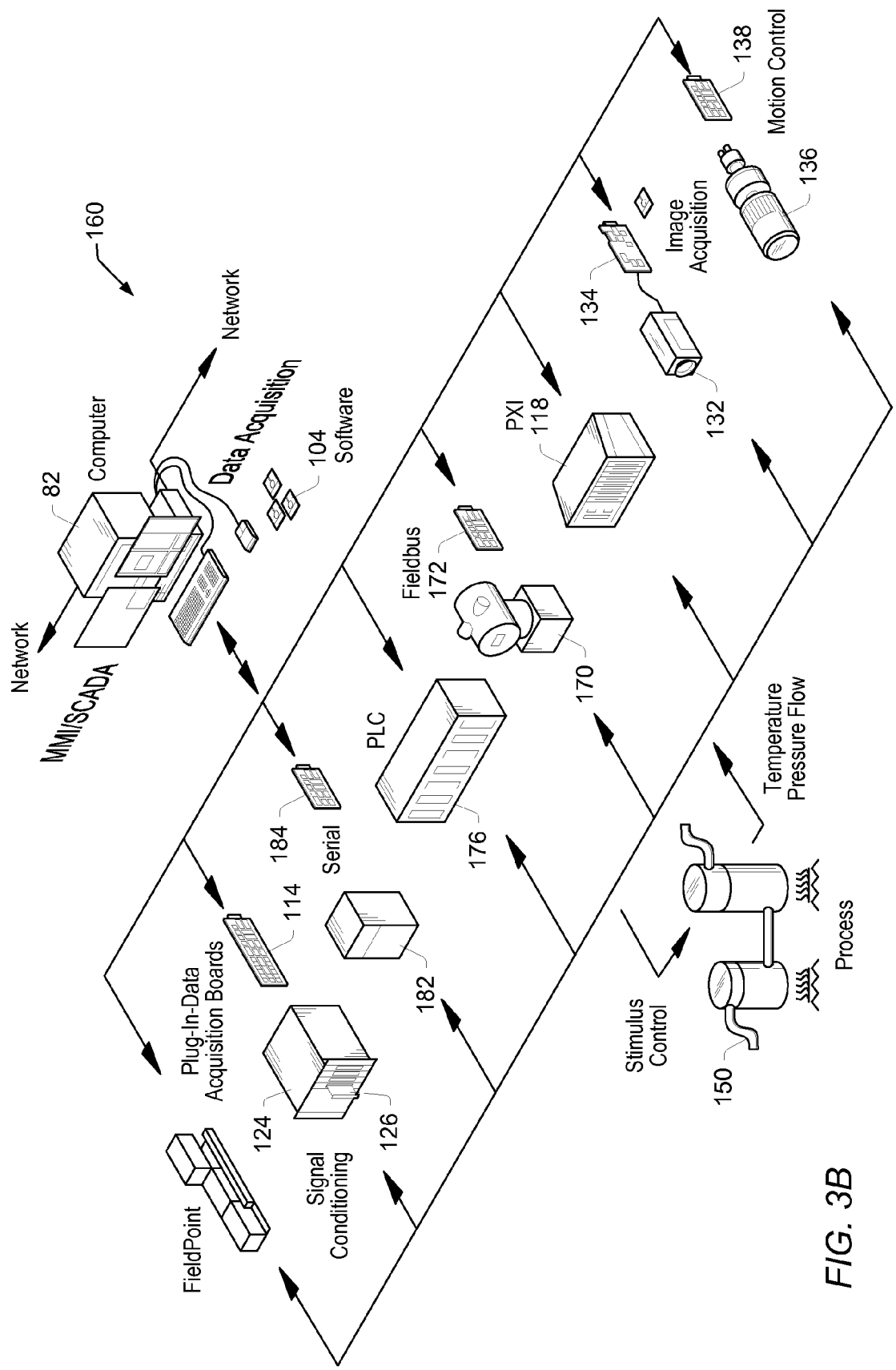
FIG. 3B illustrates an industrial automation system according to one embodiment of the invention.

FIG. 3B illustrates an exemplary industrial automation system 160 which may implement embodiments of the invention. The industrial automation system 160 is similar to the instrumentation or test and measurement system 100 shown in FIG. 3A. Elements which are similar or identical to elements in FIG. 3A have the same reference numerals for convenience. The system 160 may comprise a computer 82 which connects to one or more devices or instruments. The computer 82 may comprise a CPU, a display screen, memory, and one or more input devices such as a mouse or keyboard as shown. The computer 82 may operate with the one or more devices to a process or device 150 to perform an automation function, such as MMI (Man Machine Interface), SCADA (Supervisory Control and Data Acquisition), portable or distributed data acquisition, process control, advanced analysis, or other control, among others.

The one or more devices may include a data acquisition board 114 and associated signal conditioning circuitry 124, a PXI instrument 118, a video device 132 and associated image acquisition card 134, a motion control device 136 and associated motion control interface card 138, a fieldbus device 170 and associated fieldbus interface card 172, a PLC (Programmable Logic Controller) 176, a serial instrument 182 and associated serial interface card 184, or a distributed data acquisition system, such as the Fieldpoint system available from National Instruments, among other types of devices.

FIG. 4A is a high-level block diagram of an exemplary system which may execute or utilize diagrams. FIG. 4A illustrates a general high-level block diagram of a generic control and/or simulation system that comprises a controller 92 and a plant 94. The controller 92 represents a control system/algorithm the user may be trying to develop. The plant 94 represents the system the user may be trying to control. For example, if the user is designing an ECU for a car, the controller 92 is the ECU and the plant 94 is the car's engine (and possibly other components such as transmission, brakes, and so on.) As shown, a user may create a diagram that specifies or implements the functionality of one or both of the controller 92 and the plant 94. For example, a control engineer may use a modeling and simulation tool to create a model (e.g., a graphical program) of the plant 94 and/or to create the algorithm (e.g., a graphical program) for the controller 92.

FIG. 4B illustrates an exemplary system that may perform control and/or simulation functions. As shown, the controller 92 may be implemented by a computer system 82 or other device (e.g., including a processor and memory medium and/or including a programmable hardware element) that executes or implements a graphical program. In a similar manner, the plant 94 may be implemented by a computer system or other device 144 (e.g., including a processor and memory medium and/or including a programmable hardware element) that executes or implements an executable diagram, or may be implemented in or as a real physical system, e.g., a car engine.

In one embodiment of the invention, one or more executable diagrams may be created which are used in performing rapid control prototyping. Rapid Control Prototyping (RCP) generally refers to the process by which a user develops a control algorithm and quickly executes that algorithm on a target controller connected to a real system. The user may develop the control algorithm using a diagram, and the diagram may execute on the controller 92, e.g., on a computer system or other device. The computer system 82 may be a platform that supports real time execution, e.g., a device including a processor that executes a real time operating system (RTOS), or a device including a programmable hardware element.

In one embodiment of the invention, one or more diagrams may be created which are used in performing Hardware in the Loop (HIL) simulation. Hardware in the Loop (HIL) refers to the execution of the plant model 94 in real time to test operation of a real controller 92. For example, once the controller 92 has been designed, it may be expensive and complicated to actually test the controller 92 thoroughly in a real plant, e.g., a real car. Thus, the plant model (implemented by a graphical program) is executed in real time to make the real controller 92 "believe" or operate as if it is connected to a real plant, e.g., a real engine.

In the embodiments of FIGS. 2A, 2B, and 3B above, one or more of the various devices may couple to each other over a network, such as the Internet. In one embodiment, the user operates to select a target device from a plurality of possible target devices for programming or configuration using a diagram. Thus the user may create a diagram on a computer and use (execute) the diagram on that computer or deploy the diagram to a target device (for remote execution on the target device) that is remotely located from the computer and coupled to the computer through a network.

Graphical software programs and/or portions of system diagrams which perform data acquisition, analysis and/or presentation, e.g., for measurement, instrumentation control, industrial automation, modeling, or simulation, such as in the applications shown in FIGS. 2A and 2B, may be referred to as virtual instruments.

Figure 5:
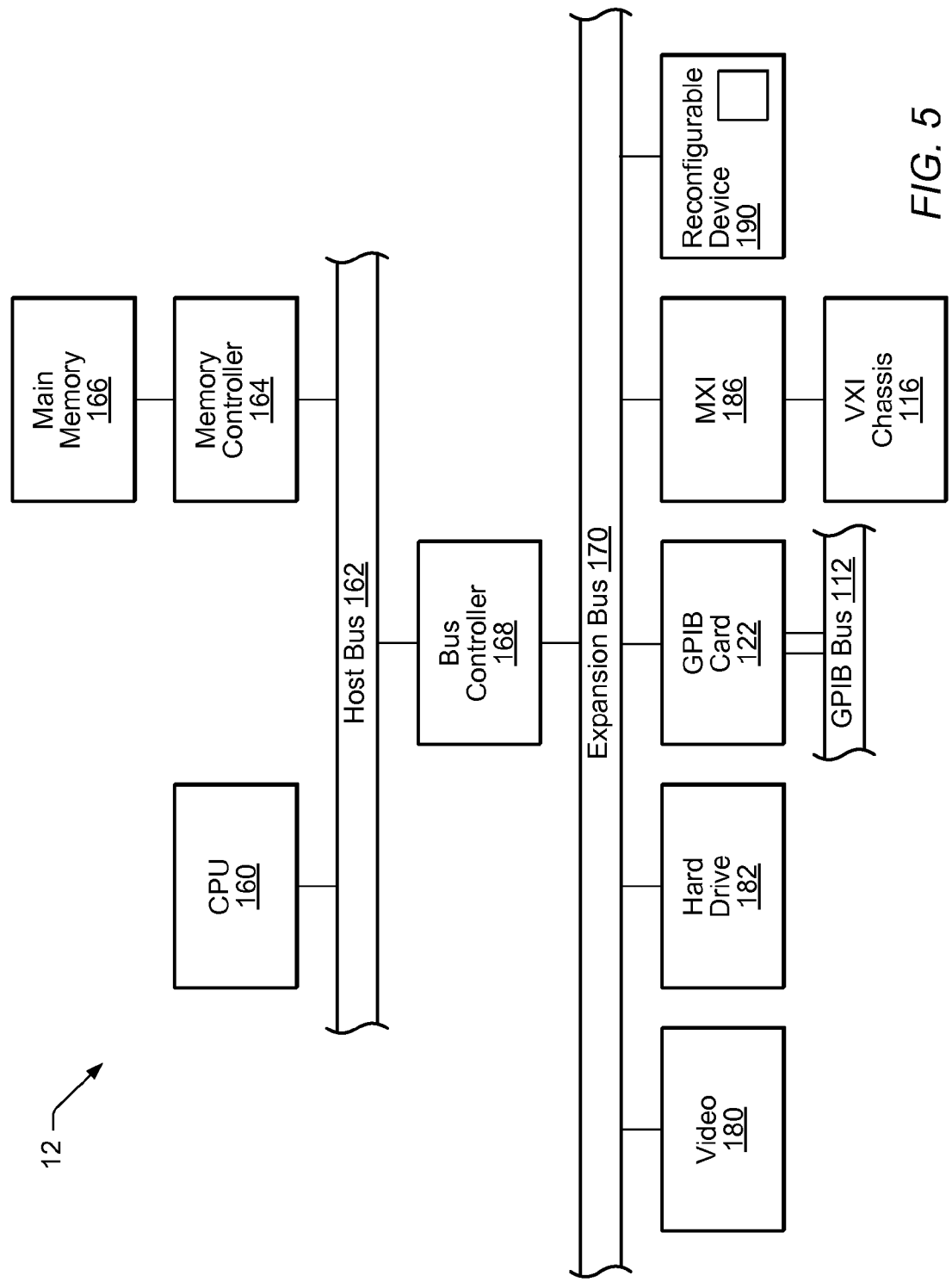
FIG. 5 is an exemplary block diagram of the computer systems of FIGS. 2A, 2B, 3A and 3B and 4B.

FIG. 5—Computer System Block Diagram

FIG. 5 is a block diagram representing one embodiment of the computer system 82 and/or 90 illustrated in FIGS. 1A and 1B, or computer system 82 shown in FIG. 2A or 2B. It is noted that any type of computer system configuration or architecture can be used as desired, and FIG. 5 illustrates a representative PC embodiment. It is also noted that the computer system may be a general-purpose computer system, a computer implemented on a card installed in a chassis, or other types of embodiments. Elements of a computer not necessary to understand the present description have been omitted for simplicity.

The computer may include at least one central processing unit or CPU (processor) 160 which is coupled to a processor or host bus 162. The CPU 160 may be any of various types, including an x86 processor, e.g., a Pentium class, a PowerPC processor, a CPU from the SPARC family of RISC processors, as well as others. A memory medium, typically comprising RAM and referred to as main memory, 166 is coupled to the host bus 162 by means of memory controller 164. The main memory 166 may store diagrams operable to implement various embodiments of the communications techniques disclosed herein. The main memory may also store operating system software, as well as other software for operation of the computer system.

The host bus 162 may be coupled to an expansion or input/output bus 170 by means of a bus controller 168 or bus bridge logic. The expansion bus 170 may be the PCI (Peripheral Component Interconnect) expansion bus, although other bus types can be used. The expansion bus 170 includes slots for various devices such as described above. The computer 82 further comprises a video display subsystem 180 and hard drive 182 coupled to the expansion bus 170. In some embodiments, the computer 82 may also include or be coupled to other buses and devices, such as, for example, GPIB card 122 with GPIB bus 112, an MXI device 186 and VXI chassis 116, etc., as desired.

As shown, a device 190 may also be connected to the computer. The device 190 preferably includes a programmable hardware element. The device 190 may also or instead comprise a processor and memory that may execute a real time operating system. The computer system may be operable to deploy a diagram to the device 190 for execution of the graphical program on the device 190. The deployed graphical program may take the form of graphical program instructions or data structures that directly represent the diagram.

Alternatively, the deployed diagram may take the form of text code (e.g., C code) generated from the diagram. As another example, the deployed diagram may take the form of compiled code generated from either the diagram or from text code that in turn was generated from the diagram.

Figure 6A:
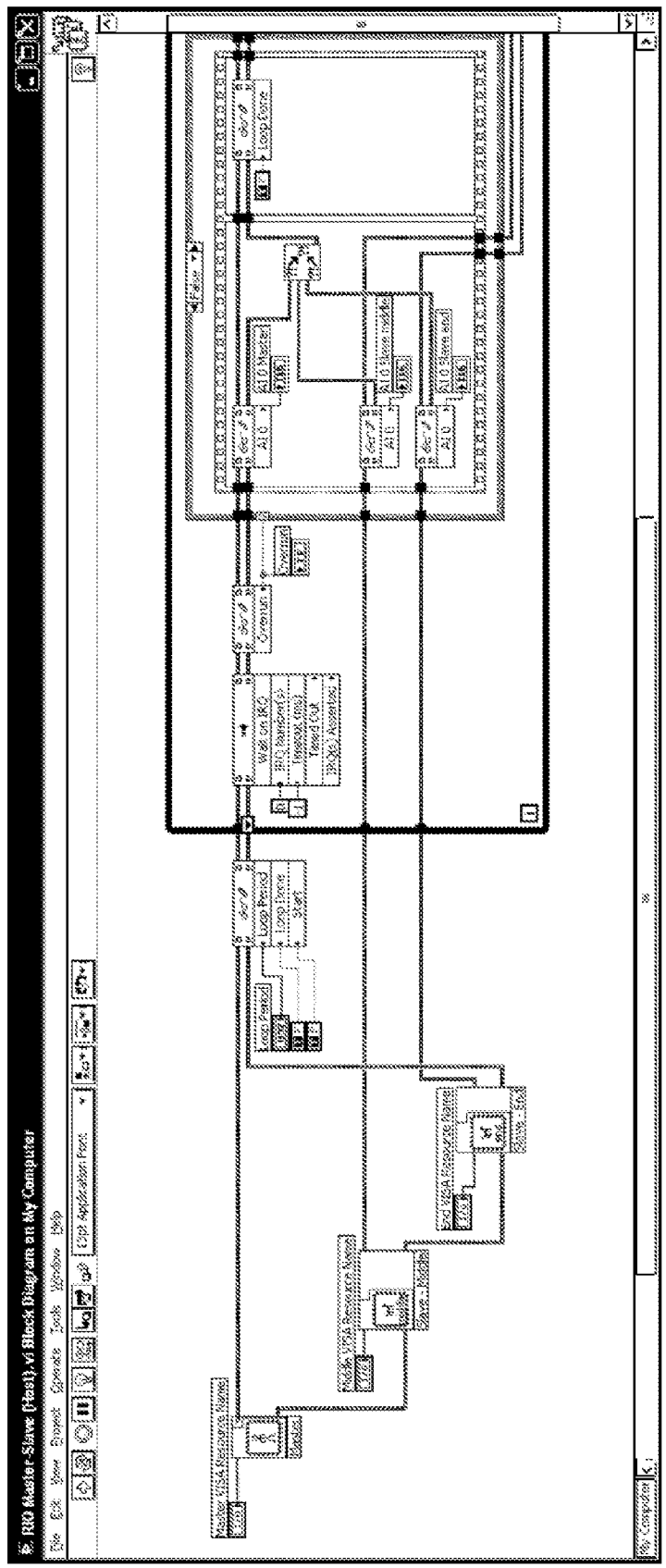
FIGS. 6A and 6B are screen shots of an exemplary graphical program according to one embodiment.
Figure 6B:
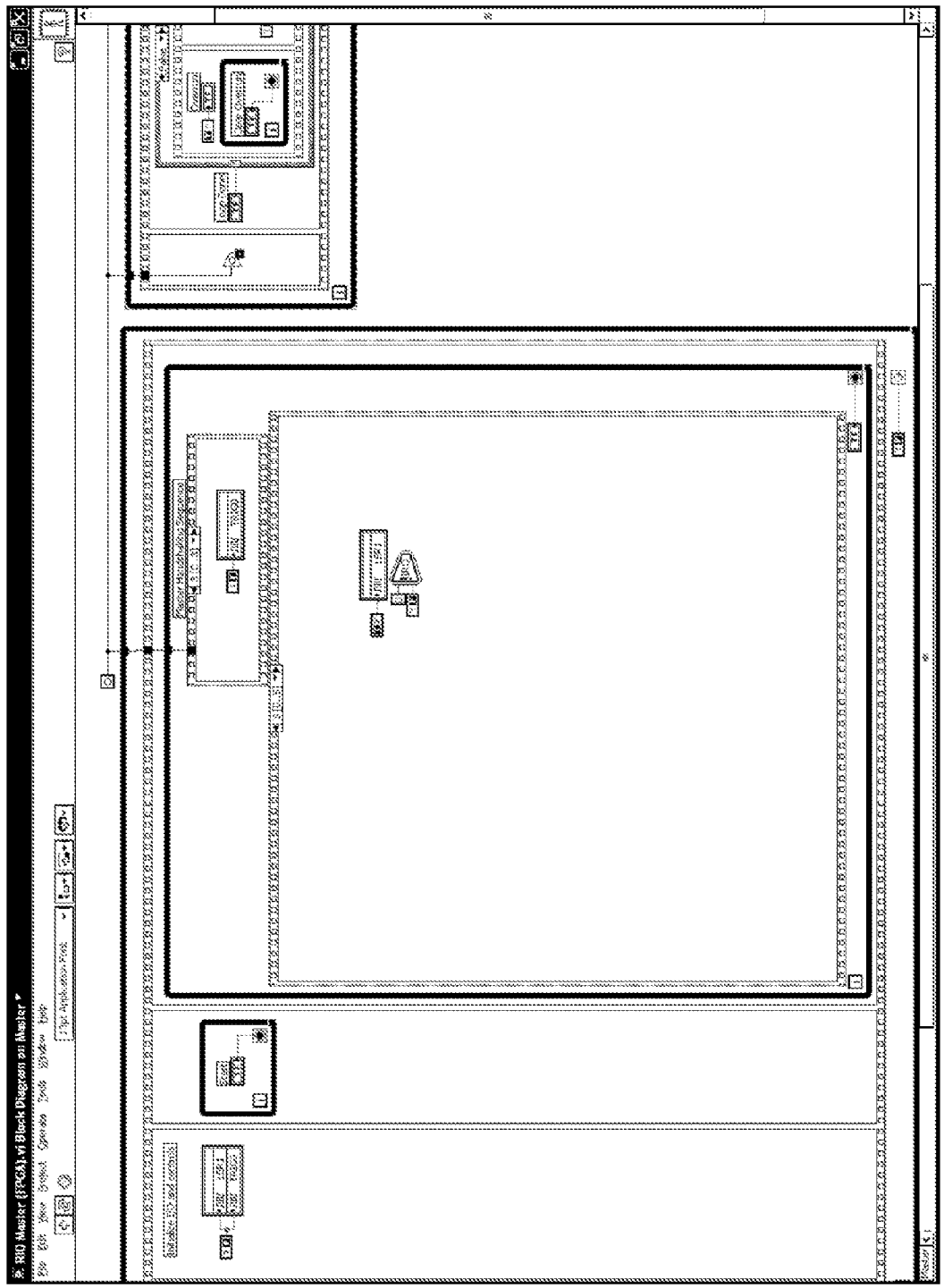

FIGS. 6A and 6B—Exemplary Graphical Programs

As described above, a graphical program may include a block diagram portion and a graphical user interface portion. In some embodiments, the graphical user interface portion may be comprised within the block diagram portion. The block diagram portion may include a plurality of interconnected nodes or icons which visually indicate functionality of the graphical program. Each of the nodes may have one or more inputs and/or outputs for accepting and/or providing data to other nodes in the graphical program. Each of the nodes in the graphical program may represent software functions or executable code. In other words, the nodes in the graphical program may represent or comprise logical elements (e.g., virtual instruments (VIs), primitives, etc.)

As also indicated above, the nodes in the graphical program may be interconnected by lines or wires which indicate that indicate that data are provided from a first node to a second node in the graphical program. In some embodiments, the wires may be connected to the terminals of nodes in the graphical program. The terminals may provide connection points for connecting the wires to a node, e.g., to individual inputs or outputs of the node. Additionally, as described herein, these wires may be configured (e.g., automatically or manually) to provide data synchronously or asynchronously using various data exchange semantics and/or data transfer mechanisms (among others). In some embodiments, wires which indicate transfer of data may be referred to as data transfer wires.

Note that references to configuration of wires (or similar remarks) actually may refer to the user providing input to the graphical representation of the wire on the display to configure the manner in which data is transferred during execution as represented by the wire. For example, configuration of a wire may actually refer to configuring software (code and/or data) represented by the wire (and/or associated icons). The configured software may then be executable to perform the specified functionality during diagram execution. In other words, during execution data transfer is performed according to the configuration of the wire. Additionally, references to the wire providing or conveying data between icons in the graphical program may actually mean that data is passed between two software entities executing on the same or different devices according to the placement of and/or configuration of the wire. Thus, the wire may indicate (e.g., visually) that data is passed among nodes in a graphical program during execution. Similar remarks apply to wires and icons in diagrams (e.g., system diagrams) described below. Additionally, further descriptions regarding configuration of wires are provided below and in various ones of the provisionals or patent applications incorporated by reference above.

Note that the wires may also be timing wires which may provide timing information (e.g., time stamps) between nodes in the graphical program. Note that in some embodiments, the timing wires may be configurable, e.g., for asynchronous or buffered communication. Such wires may be referred to as buffered timing wires or asynchronous timing wires. For further information regarding timing wires, please see U.S. application Ser. No. 10/893,745, titled Graphically Representing Timing in a Graphical Program, which was incorporated by reference above.

In some embodiments, the graphical program may include one or more structure nodes which indicate control flow among one or more nodes in the graphical program. For example, the graphical program may include a conditional structure node (e.g., to implement conditional branching, if statements, switch statements, signal routing, etc.), a looping structure node for implementing looping among one or more nodes (e.g., while loops, do while loops, for loops, etc.), and/or other control flow nodes.

Additionally, the graphical program may visually indicate where portions of the graphical program are executed. In one embodiment, the visual indication may include a rectangular box that contains a portion of graphical code. In some embodiments, this visual indication may be referred to as a target execution node or icon. The target execution node may have an interior portion where graphical program code that is targeted for execution on a device is contained. For example, a device icon that includes an interior portion that is designed to receive graphical program code may be referred to as a target execution node. Additionally, or alternatively, this node may be referred to as a execution target structure node, as described in U.S. Provisional Ser. No. 60/869,221 and incorporated by reference above. As described in this provisional application, the target execution node may include (e.g., may reference) contextual information that allows the graphical program code to be executed on a target device.

The graphical program may be created or assembled by the user arranging on a display (e.g., of the computer system 82) a plurality of nodes or icons and then interconnecting the nodes to create the graphical program. In some embodiments, the user may select icons and/or wires from various palettes shown in a development environment on the display. In response to the user assembling the graphical program, data structures may be created and stored which represent the graphical program. As noted above, the graphical program may comprise a block diagram and may also include a user interface portion or front panel portion. Where the graphical program includes a user interface portion, the user may optionally assemble the user interface on the display. As one example, the user may use the LabVIEW development environment to create the graphical program.

In an alternate embodiment, the graphical program may be created by the user creating or specifying a prototype, followed by automatic creation of the graphical program from the prototype. This functionality is described in U.S. patent application Ser. No. 09/587,682 titled "System and Method for Automatically Generating a Graphical Program to Perform an Image Processing Algorithm", which was incorporated by reference in its entirety above. Further descriptions regarding automatic creation of graphical programs can be found in U.S. Patent Application Publication No. 2001/0020291 which was also incorporated by reference above. Thus, the graphical program may be created in other manners, either manually (by the user) or automatically, as desired. The graphical program may implement a measurement function that is desired to be performed by one or more devices or instruments (e.g., indicated by target execution icons). In other embodiments, the graphical program may implement other types of functions, e.g., control, automation, simulation, and so forth, as desired.

FIGS. 6A and 6B illustrate exemplary portions of a graphical program according to one embodiment. As shown, the graphical program includes a plurality of interconnected nodes which visually indicates functionality of the graphical program.

Thus, the plurality of interconnected nodes may visually indicate functionality of the graphical program. In other words, during execution of the graphical program, the functionality represented by the plurality of interconnected nodes may be performed.

FIGS. 7A-7D—Exemplary System Diagrams

As described above, a system diagram may refer to a diagram comprising one or more device icons and graphical program code, wherein the device icons are use to specify and/or visually indicate where different portions of graphical program code are deployed/executed. A system diagram may include icons or nodes that are connected by lines or wires, e.g., device icons connected to other device icons, a first graphical code portion connected to a second graphical code portion.

In a system diagram, as described above, a first node or icon may provide data on an output and a wire may connect the output of the node to an input of a second node. Similar to descriptions above, an icon or node providing data on an output may refer to a device executing code represented by the icon or node resulting in transferal of data to between or among the software representing the nodes. Note that the program code or functions represented by the icons may be executing on one device or among a plurality of devices. For example, a first device may be executing code of the first node and a second device may be executing code of the second node, and data may be transferred between the devices as indicated by the nodes and/or wires connecting the nodes.

Thus, the icons (nodes) in the system diagram may represent logical elements such as, for example, software functions or virtual instruments. Similar to the graphical programs described above, graphical indications may be displayed on the diagram which visually indicate where code represented by the various icons execute. For example, target execution icons may visually outline one or more of the icons and indicate that software represented by those icons execute on a specified target or device.

Additionally, in system diagrams, the icon or node providing data may also refer to devices (such as processing elements and configurable elements) transferring data according to configurations of the wire and/or icons. Thus, the icons may represent devices and the wire may indicate that the devices are configured to operate to provide data as indicated by the wires and/or icons in the system diagram. Thus, the wire may visually indicate that data from the first node is provided to the second node (e.g., the device(s) executing the first and second nodes). Similar to above, the wire may be configured using various methods described herein.

Thus, as noted above, the system diagram may also include icons which represent various devices, e.g., configurable or processing elements. In some embodiments, the devices represented in the system (e.g., processing elements, configurable elements, and/or other devices) may be physically present in the system or may be virtual (e.g., the devices may be simulated during execution of the system diagram) as desired. Additionally, these devices may operate according to the functionality visually represented by the icons in the system diagram which represent the devices. Note that the virtual devices of the system diagram may have an underlying model which is usable (e.g., executable) to simulate behavior of a real device corresponding to the virtual device. For example, the underlying model may be a graphical program or other executable code. Alternatively, or additionally, the virtual devices may represent devices that are desired and/or required for the system (e.g., according to user input).

Additionally, as described above regarding graphical programs, one or more GUIs may be associated with the system diagram (e.g., logical or physical components of the system diagram) which may be used during execution of the system diagram. Thus, the GUI(s) may act as a front panel to the system diagram during execution (e.g., for receiving user input and displaying information regarding various variables, functions, devices, and/or sensors (among others) that execute or operate during execution of the system diagram).

Thus, the system diagram may allow for a logical view of a system as well as indications regarding execution targets of code represented in the system diagram. Further, in some embodiments, the system diagram may also indicate physical layouts of the system (e.g., physical connectivity as well as indications regarding execution of the logical elements of the diagram). In primary embodiments, the system diagram at least includes interconnected icons representing software (e.g., graphical program code) and one or more graphical indications (e.g., target execution icons) which indicate where these logical elements execute.

Similar to the descriptions above regarding assembly of a graphical program, system diagrams may be assembled manually (e.g., where the user selects icons and connects the icons using wires) or automatically (e.g., in response to user input specifying a desired functionality), as desired. Thus, a system diagram may be assembled manually or automatically and may include logical elements, processing elements, and/or configurable elements, as desired.

Figure 7A:
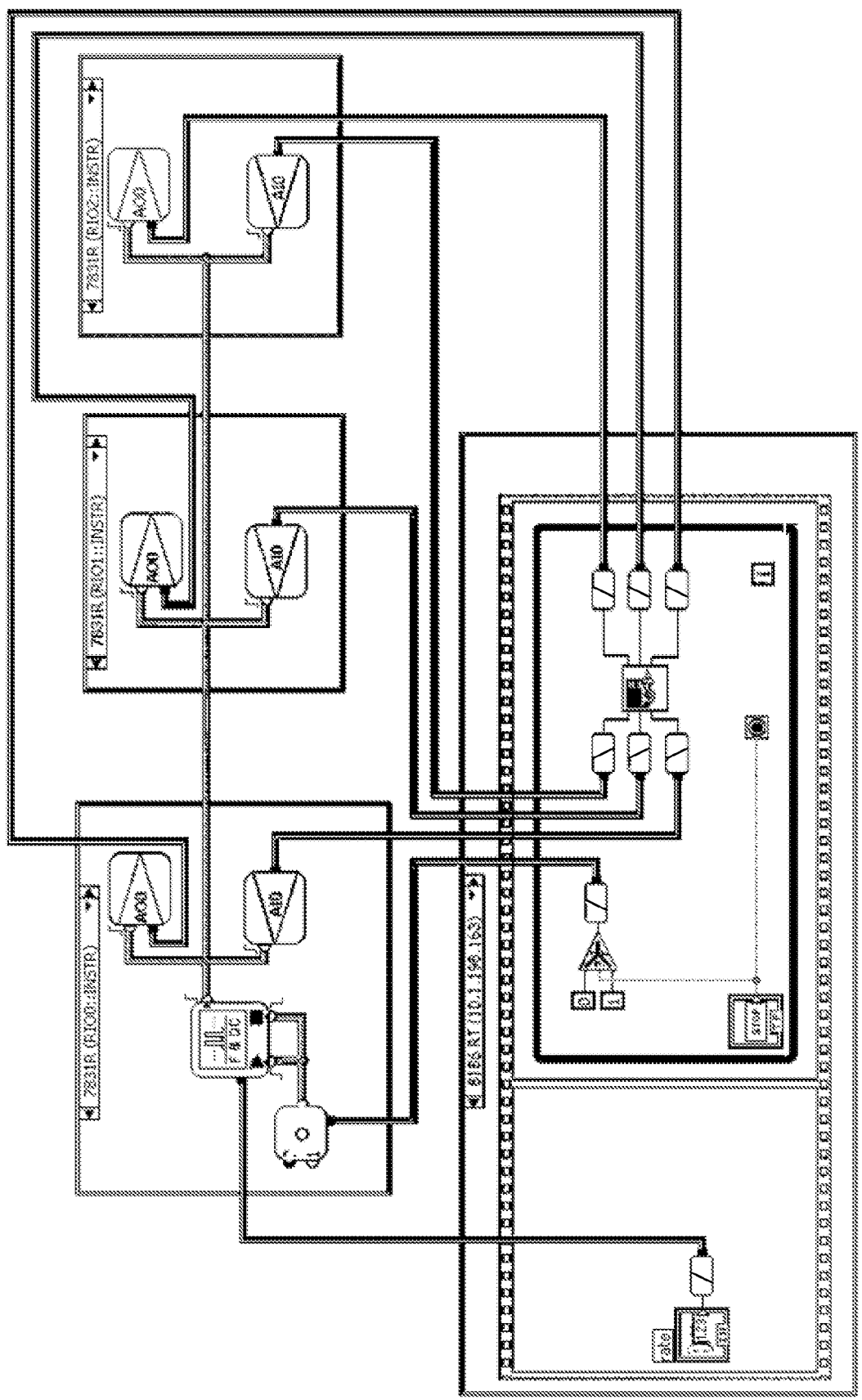
FIG. 7A is a screen shot of an exemplary system diagram which corresponds to FIGS. 6A and 6B.

As shown, FIGS. 7A-7D illustrate exemplary system diagrams according to one embodiment. More specifically, FIG. 7A illustrates an exemplary system diagram which corresponds to the portions of the graphical program shown in FIGS. 6A and 6B. As shown, FIG. 7A includes a plurality of interconnected icons which visually indicate functionality of the system diagram. Additionally, the system diagram of FIG. 7A includes target execution icons which indicate where portions of the graphical program are executed.

Figure 7B:
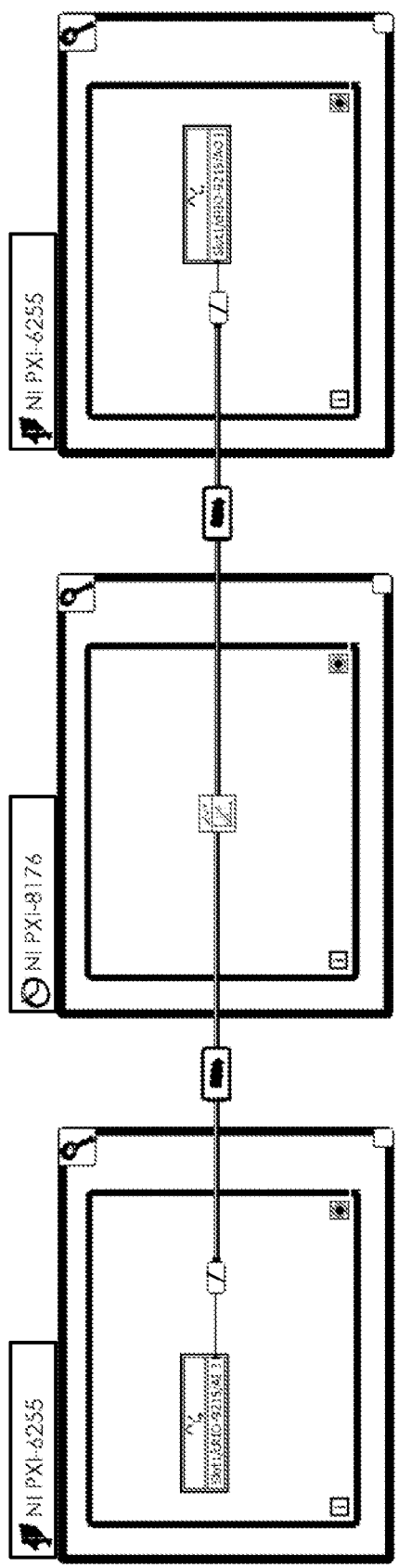
FIGS. 7B-7D are screen shots of an exemplary system diagram according to one embodiment.
Figure 7C:
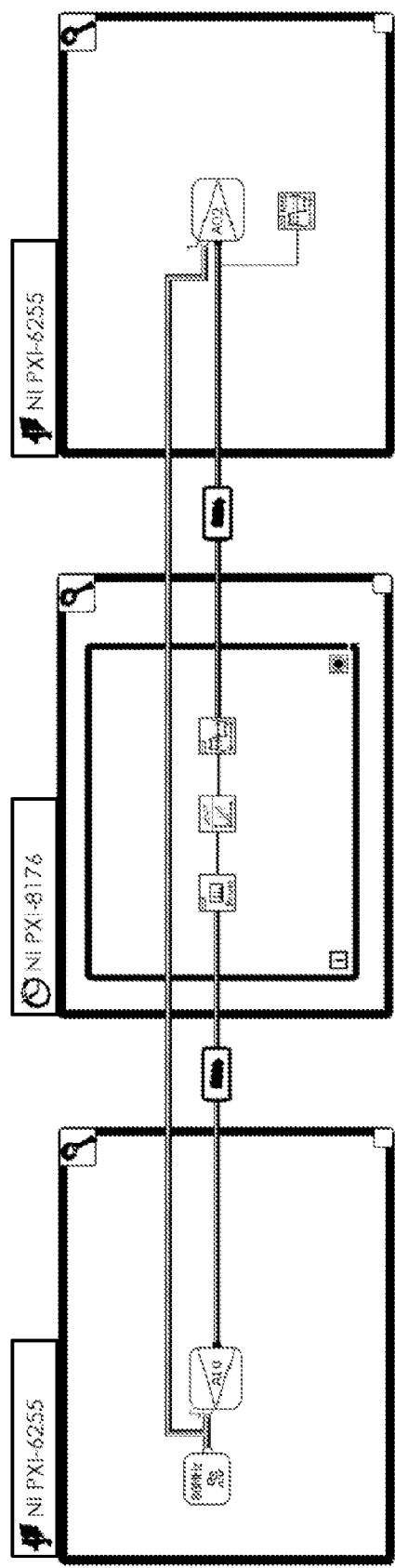
Figure 7D:
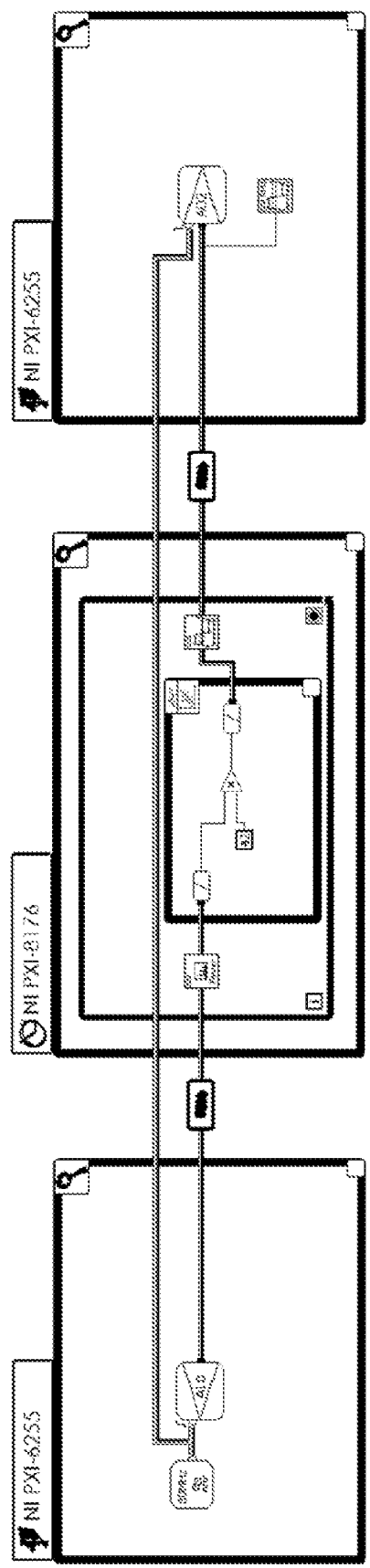

FIG. 7B illustrates an exemplary system diagram where each target execution icon includes a single node inside a loop structure/iteration node, and where the icons are interconnected by lines. The icon in each target execution icon may represent a plurality of icons which may be interconnected (e.g., the icon of the execution icon may be a VI or sub-VI). FIG. 7C illustrates an exemplary system diagram where the icons of the target execution icons are expanded, and FIG. 7D illustrates an exemplary system diagram where a further sub-VI is expanded. More specifically, FIGS. 7B-7D illustrate a system diagram where a first device (NI PXI-6255) stores a first portion of a graphical program which is executable to communicate with a second device (NI PXI-8176). In this case, the second device then provides data (during execution) back to the first device. Thus, FIGS. 7B-7D show both physical and logical relationships among graphical program portions executing on two devices. Thus, FIGS. 7A-7D illustrate exemplary system diagrams.

Exemplary Physical Diagram

As described above, a physical diagram may refer to a diagram which indicates physical connectivity between physical devices in a system. For example, the physical diagram may visually indicate the connectivity of various physical devices in a measurement system, e.g., a computer connected to a measurement device via an Ethernet network. A physical diagram may show how executable functionality (e.g., of a graphical program or system diagram) is implemented in the real world. Thus, in primary embodiments, the physical diagram includes a plurality of interconnected icons, where each icon in the physical diagram corresponds to a physical device. Additionally, following these embodiments, connections between the icons in the physical diagram represents physical connectivity. For example, the wires between the icons in the physical diagram may represent Ethernet cables, USB connections, Firewire connections, and/or other physical media which connects devices in the system. In some embodiments, physical diagrams (and/or system diagrams) may also be useful for visualizing variable, channel, or network relationships among devices in the system. Note that a certain type of wire may also be used to represent a wireless connection.

Note that in some embodiments, configuration diagrams may have a similar appearance and/or use as physical diagrams. However, configuration diagrams may refer to diagrams which are not linked to physical reality as are physical diagrams. For example, one or more of the devices in a configuration diagram may not be physically present in the system (e.g., it may be simulated or implement on other devices in the system). Thus, physical diagrams represent physical components and physical connectivity of a system and configuration diagrams may represent physical components and/or virtual (or desired) components.

An exemplary physical diagram is shown in the bottom portion of FIGS. 8A and 8B (described in more detail below).

Figure 8A:
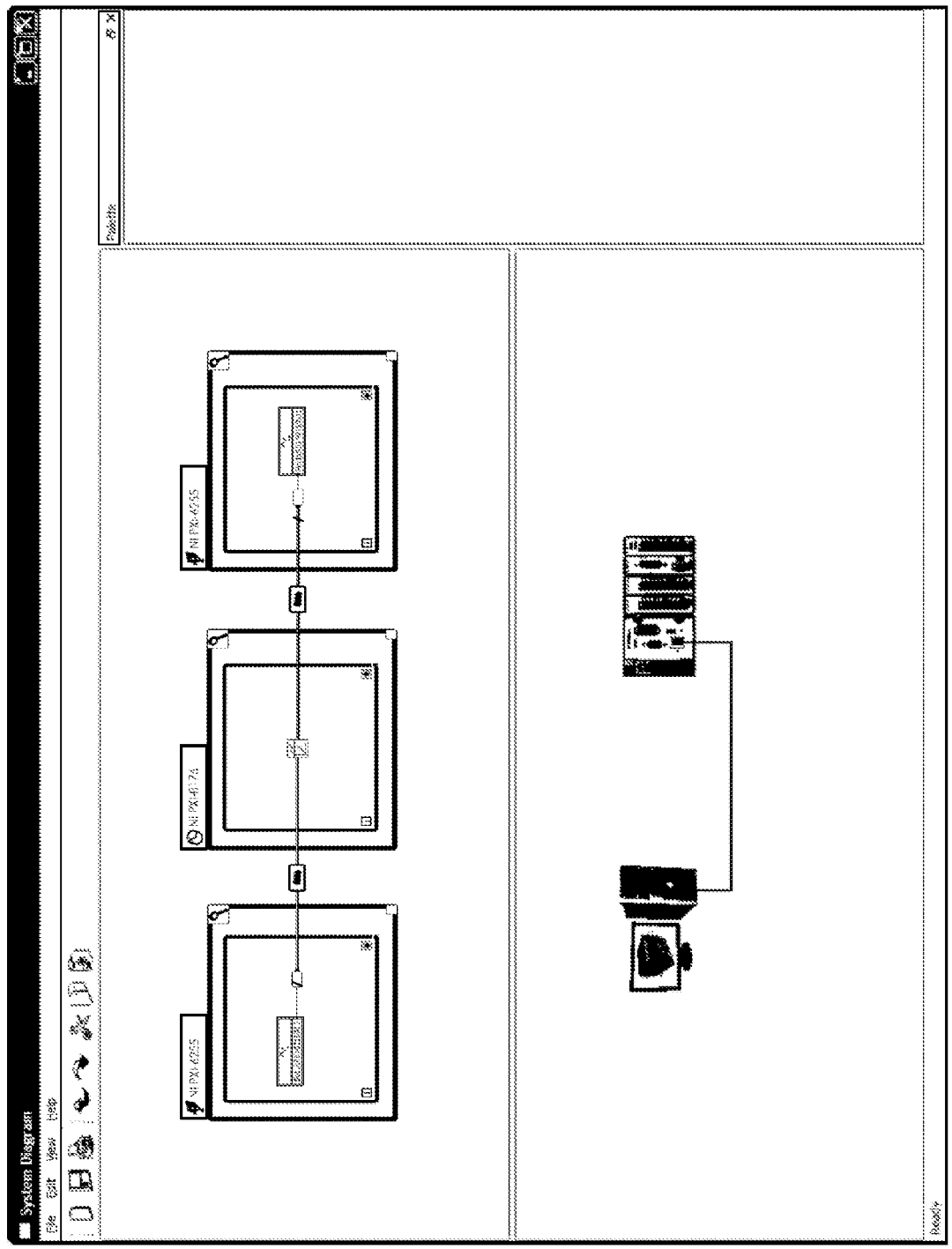
FIGS. 8A and 8B are screen shots of a split view of a system diagram and a physical diagram according to one embodiment.
Figure 8B:
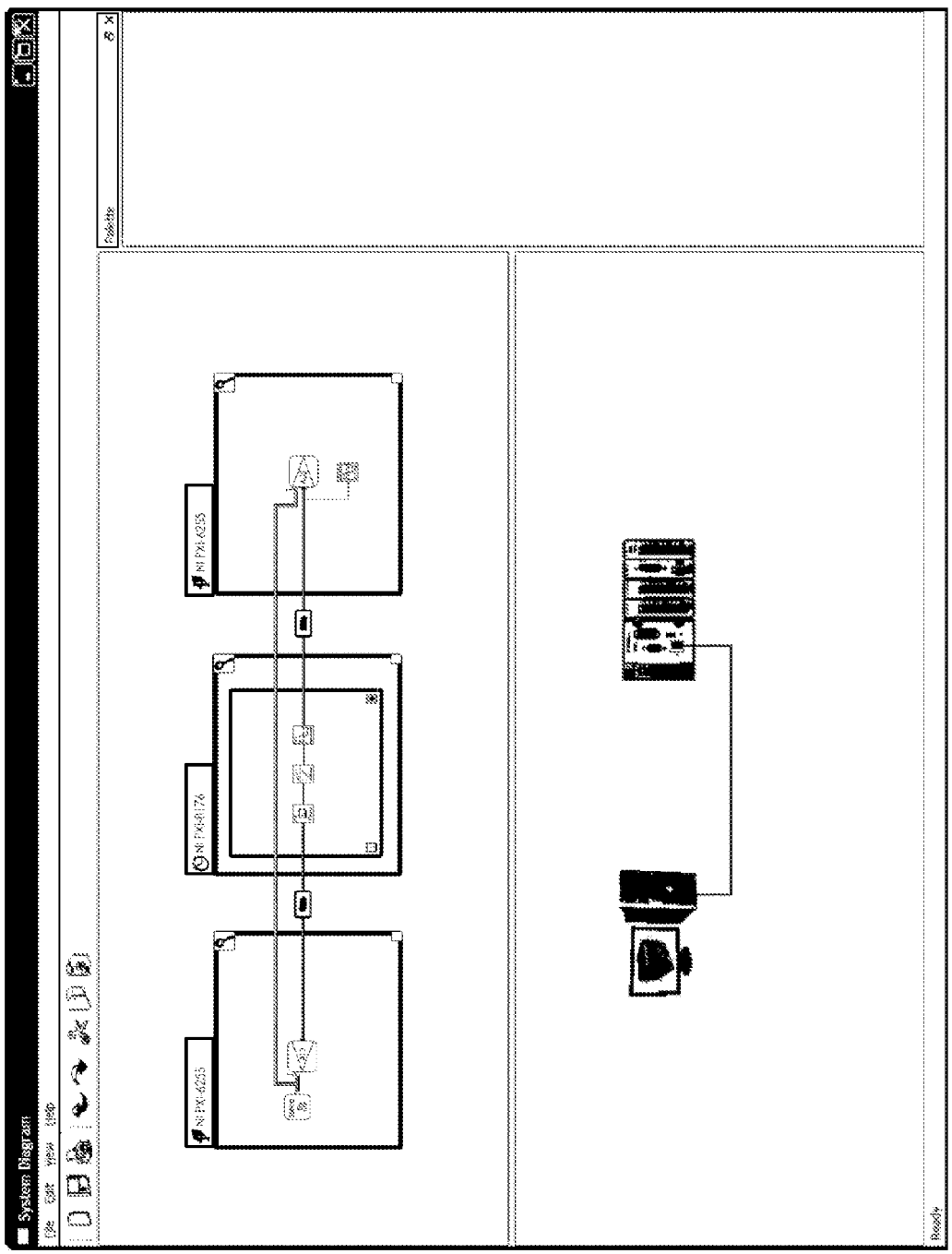

FIGS. 8A and 8B—Synergy of Multiple Diagrams

In some embodiments, it may be desirable to display or use multiple diagrams. For example, graphical programs may allow users to see a logical view of a system. Similarly, system diagrams may provide an easy and intuitive means for visualizing the logical view of a systems as well as locations of execution and relationships between other physical or virtual devices of the system. Thus, a system diagram may allow a user to easily understand functionality and logical flow of execution over an entire system. Physical diagrams and/or configuration diagrams, on the other hand, may allow users to view the physical components and connectivity of the physical components. Thus, each of the various diagrams may provide different views of a system.

In some embodiments, it may be desirable to allow a user to choose one or more of these diagrams or "views" of the system. For example, the user may want to see a purely logical view of a system. In this example, a graphical program may be displayed for the user, e.g., on the computer system 82. The graphical program may be displayed with or without graphical indications (e.g., target execution icons) which visually indicate where portions of the graphical program are executed. Alternatively, the user may desire a system view of the system where both logical elements and execution indications are displayed. Additionally, the system view may include icons representing hardware devices (e.g., processing elements or configurable elements) that may not be present in the graphical programs. Finally, the user may want to view a physical representation of the system; correspondingly, the physical diagram may be displayed on the display of the computer system 82.

In some embodiments, the multiple diagrams or views may each take up the entirety of the display. Thus, the user may, in one embodiment, toggle between the different views. Alternatively, the diagrams or views may be displayed in a "split view" where a plurality of diagrams or views are shown on the display, or the different diagram are shown separately and concurrently on multiple display devices. For example, in one embodiment, a split view may be displayed where a system diagram or graphical program is displayed in a top portion and the physical view (physical diagram) may be displayed on the bottom portion. In another example, in one embodiment, a split view may be displayed where a system diagram or graphical program is displayed on a first display device and the physical view (physical diagram) may be displayed on a second display device. This may be especially useful for conveying overall system information to the user. Thus, in one embodiment, the user may see a logical view of the system which may or may not indicate where logical elements execute as well as a physical view of the system allowing intuitive understanding of the entire system in one view.

In some embodiments, the development environment may allow the user to see correlations between the logical view and the physical view. For example, following the split view embodiment from above, a user may be able to select a physical component in the physical view and corresponding graphical indications in the logical view may be visually modified to indicate where graphical program portions execute. For example, the user may select a computer system in the physical view and one or more target execution icons (or possibly icons comprised in the target execution icons themselves) may "pop" (e.g., appear to jump or bounce on the screen), change colors, become highlighted, marching ants, and/or otherwise be visually indicated. Similarly, the user may select various components in the logical view and corresponding hardware devices in the physical view may be highlighted or visually indicated. Thus, the user may easily discern which logical elements in the system diagram or graphical program correspond to the physical devices shown in the physical diagram.

As shown, FIGS. 8A and 8B illustrate exemplary split views of a system diagram and a physical diagram. Note that these Figures correspond to the system diagrams illustrated in FIGS. 7B-7D. As shown in 8A, the top portion illustrates the system diagram of FIG. 7B and the bottom portion shows the physical connectivity between the two devices of the system (in this case from a port of a chassis to a computer). More specifically, FIG. 8A depicts a data streaming application where data is read from the PXI-6255, streamed over DMA to the PXI-8176, which after modifying the data, streams data back to the PXI-6255 to be output. The FIFO affordance of the wire is used as an access point for configuring buffering policies for the configurable wire. This Figure also illustrates the concept that a single physical device (in this case the PXI-6255) can have multiple logical representations Similarly, FIG. 8B shows the same split view with an expanded system diagram (from FIG. 7C). Thus, FIGS. 8A and 8B show exemplary split views of a system diagram and physical diagram.

Note that the above described views are exemplary only and that other views are contemplated. For example, in some embodiments, there may be a single view, e.g., of a system diagram, where all physical and logical connectivity is indicated. Thus, in these embodiments, the user may easily understand the entirety of the system. FIGS. 9A and 9B illustrate exemplary diagrams of this case. As shown in FIG. 9A, the cRIO-9014 Microprocessor is connected to cRIO-9103 which is connected to 9211. In this case, instead of separating the logical components of the cRIO-9014 and cRIO-9103 separate target execution icons, the physical and logical relationship is shown in a single view. Similarly, FIG. 9B shows this single view, but also shows the logic of the cRIO-9014. Note that in various embodiments, the user may switch between any of the views/diagrams described above, as desired.

Alternatively, or additionally, more than two diagrams may be shown simultaneously. For example, two or more of a physical diagram, a configuration diagram, a system diagram, and/or a graphical program (among other diagrams) may be displayed at the same time. In some embodiments, various ones of the diagrams may be overlaid in an intelligent manner, to convey an intuitive understanding of the system to the user. For example, when two or more diagrams are overlaid, corresponding nodes or icons in the different diagrams may be shown in the same position on the display to indicate correspondence. In one embodiment, a diagram may be automatically modified to allow this correspondence to be readily displayed. Thus, the above described views are exemplary other, and other views are envisioned.

In one embodiment, one or more of the above described diagrams may be used for mapping system configurations to existing system configurations. For example, in one embodiment, the user may wish to map a diagram (e.g., containing specified physical and logical elements) to an existing (physical) system. For example, the existing diagram may have physical components (e.g., devices) which differ from the user's existing (physical) system. The development environment may be able to map the diagram (e.g., automatically) to the existing system and/or simulate the missing devices that are indicated in the diagram. Thus, diagrams may be mapped onto real systems by transferring functionality to existing systems or via simulation of the missing components (among others).

Thus, FIGS. 6-9 illustrate exemplary diagrams/views of systems. The following sections describe configuration and display of data transfer functionality in the various diagrams described above (among others).

Figure 10:
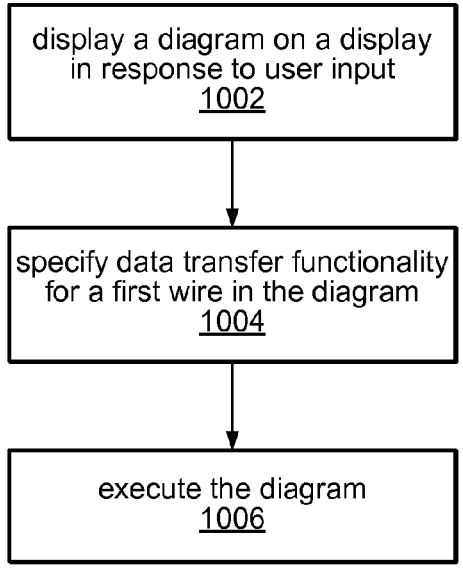
FIG. 10 is a flowchart diagram illustrating one embodiment of a method for configuring wires in a diagram.

FIG. 10—Method for Configuring Wires in a Diagram

FIG. 10 illustrates a computer-implemented method for configuring wires in a diagram according to one embodiment. The method shown in FIG. 10 may be used in conjunction with any of the computer systems or devices shown in the above Figures, among other devices. In various embodiments, some of the method elements shown may be performed concurrently, performed in a different order than shown, or omitted. Additional method elements may also be performed as desired. As shown, this method may operate as follows.

In 1002, a diagram may be displayed on a display (e.g., of the computer system 82) in response to user input. The diagram may include a plurality of icons or nodes that are connected by wires. These interconnected nodes or icons may visually represent functionality of the diagram, e.g., functionality that may be performed during execution of the diagram. Thus, the diagram may be an executable diagram that is executable to perform the functionality indicated by the diagram. In various embodiments, the diagram may be a system diagram, graphical program, and/or other type of executable diagram. As described above regarding system diagrams and graphical programs, the diagram may be created or assembled manually or automatically as desired. As also described above, elements in the diagram may include logical elements, processing elements, and/or configurable elements, among others. In primary embodiments, the diagram at least includes a plurality of icons representing software functions or code that are connected by wires, e.g., data transfer wires and/or timing wires. In other words, the diagram at least includes some graphical program code. Additionally, the diagram preferably includes target execution icons which indicate that one or more graphical program nodes are executed on respective devices of the system. Note that the diagram may include icons representing various devices (physical or virtual). In some embodiments, the devices may provide or accept data from each other and/or software functions that are represented by icons in the diagram as configured by the user.

Displaying the diagram in 1002 may include displaying a first wire that connects a first icon and a second icon in the diagram. Displaying the first wire may include receiving user input connecting the two icons, e.g., using a wiring tool or a selected wire from a palette (among other methods). In some embodiments, as indicated above, the icons may include or have associated terminals for connecting wires. For example, the first (and/or second) icon may have one or more inputs and one or more outputs with terminals for each respective input or output. The inputs and outputs may represent inputs or outputs of the software or code that is represented by the icon. Thus, receiving user input connecting the two icons may include connecting a first wire from a first terminal (e.g., on the first icon) to a second terminal (e.g., on the second icon). Note that in some embodiments, the first icon (e.g., an output of the first icon) may be connected to multiple other icons (e.g., to the inputs of multiple other icons). Thus, the wire may branch and connect the first icon to a plurality of icons. Note that in some embodiments, the wire may be connected to a plurality of outputs of icons, a plurality of inputs of other icons, or any combination thereof. Thus, the wire may provide connections in a one-to-one, many-to-one, or one-to-many relationship among icons in the diagram, as desired. In various embodiments, the entirety or individual branches of the wire may be configured using the methods described herein (among others).

In some embodiments, the first icon (node) may represent code or software that is targeted for execution on a first device and the second icon (node) may represent code that is targeted for execution on a second device. However, note that wires may be configured even when the two icons represent different portions of code that are executed by the same device. Alternatively, the first icon may represent devices such as processing elements or configurable elements (among others). In these embodiments, the devices may operate or execute to provide data according to configurations of the icons or wires connecting the icons. In one embodiment, the first icon may be a primitive, a VI or sub-VI, an I/O icon, and/or a Harness icon. Note that harness icons may refer to icons which surround or otherwise provide data transfer conversion for an icon in the diagram (or possibly a plurality of icons). Harness icons may provide similar functionality as the data transfer icons described below, but may provide or specify data transfer functionality for one or more (or all) of the inputs and outputs of the icon(s) which the harness icon surrounds. Thus, the first icon may be any of numerous types appropriate for the diagram.

In primary embodiments, the first wire is a data transfer wire which indicates that data are transferred from the first icon to the second icon (e.g., from a first software process to a second software process, or from a first device executing the first icon to a second device executing the second icon). Note that in various embodiments, the first wire may also indicate transferal of other information such as data transport status information and/or constant information (indicating whether or not the data being passed is a constant). Furthermore, the first wire may also indicate conveyance of timing information such as time stamps, e.g., with corresponding data packets. Thus, the first wire may indicate that data and possibly other information is passed between the icons (e.g., the devices executing the icons).

In 1004, the first wire may be configured, e.g., in response to user input. Configuring the first wire may specify data transfer functionality of the first wire. In some embodiments, the data transfer functionality may include asynchronous data transfer functionality. As used herein, data transfer functionality refers to the method by which data are transferred in the system (e.g., within a device, or among devices), as represented by wires and/or icons in the diagram. For example, where the icons represent devices in the system, the term "data transfer functionality" may refer to the data transfer methods used by the devices to transfer data between themselves. Where the icons correspond to software programs (or software functions), the term "data transfer functionality" may refer to the data transfer methods used by the respective software programs transferring data between each other (e.g., the data transfer methods used by the respective devices executing the software programs).

Furthermore, descriptions regarding the wire transferring data between icons, icons providing or receiving data, and/or execution of icons (among other similar remarks) may refer to the operation of devices represented by the devices or execution of software programs which may be executed by one or more devices. For example, as noted above, a first icon transferring data to a second icon may actually refer to execution of respective software code represented by the first and second icon which, during execution, results in data transferal according to configurations of the first icon, the second icon, and/or the wire between the icons (among other associated elements or icons).

In some embodiments, the code represented by the first icon and the second icon may be executed on a single device or multiple devices. Where the code is executed on a single device, the first icon transferring data to the second icon may refer to first software code (represented by the first icon) transferring data to second software code (represented by the second icon) according to the data transfer functionality specified for the corresponding wires and/or icons. Where the code is executed over multiple devices, the first icon transferring data to the second icon may refer to a first device (executing code represented by the first icon) transferring data to a second device (executing code represented by the second icon) according to the data transfer functionality specified for the corresponding wires and/or icons. Alternatively, the icons may represent devices in the system, and correspondingly, data being provided from a first icon to a second icon may refer to data transferal from the device represented by the first icon to another device represented by the second icon. Thus, icons may not actually perform transferal, provision, or consumption of data, but may be configured or indicate that software or devices are operable/executable to perform these acts.

For example, data transfer functionality may include data exchange semantics which define communication policies for transferring data between icons. Data exchange semantics for wires may include read policies, write policies, directionality of the wire, associated data structures (relating to data transfer), wire branching semantics, queues, and/or buffers, among others. In specific embodiments, specifying data exchange semantics may include specifying a FIFO, mailbox, buffer (e.g., a circular buffer), table, and/or other data exchange semantics.

A mailbox may include a register or shared memory. In some embodiments, the mailbox may store data (e.g., for access by the first icon or another icon), an indication whether that data value has changed, and/or whether or not the stream on the wire is open or closed. Additionally, a table may represent a non-degenerate form of a mailbox. The table may store data, a count parameter, indices (e.g., an index), an indication as to whether the data has changed, an error value, and/or a stream state (e.g., whether or not the stream on the wire is open or closed). A FIFO may similarly store data, count control, timeout control, action control, action result, a stream state, and/or a percent storage value. The action control may include peek (e.g., for returning a count of data items without removing the data), read (e.g., for returning count data times and removing the data), write (e.g., for writing count data items), flush (e.g., for emptying the stream), idle (to disable the node or wire), and/or test (e.g., for testing whether a read and/or write is currently possible). A circular buffer may similarly store data, count, move read pointer, move write pointer, current read pointer, current write pointer, error, stream state (e.g., open or closed), and/or other information. Additionally, in some embodiments, data exchange semantics may include a group, such that FIFOs and/or circular buffers may be grouped in a similar fashion as tables group mailboxes. Thus, in one embodiment, a table may not be included in the data exchange semantics, and instead groups of FIFOs, circular buffers, and/or mailboxes (among others) may be formed or specified.

As described above, data exchange semantics may include read and write policies or behavior. These policies may be applicable for a wire, icon, and/or device in the diagram and/or a portion or whole of the diagram itself. For example, policies may include 'always read new data', 'read and erase data', 'read and do not erase data', 'overwrite data', and/or 'never overwrite unread data', among other policies. Thus, reads and writes may be destructive (where data are removed or overwritten) or nondestructive, as desired. Note that these polices and/or destructive/nondestructive parameters may be fully configurable by the user or may be associated with the specific available semantics.

In some embodiments, specification of buffers for the wire may include configuring the size of the buffer, the type of the buffer, initial values of the buffer, and/or location of the buffer (e.g., on a single device or over multiple devices). Thus, specification of the data transfer functionality may include specification of the data exchange semantics described above (and/or parameters associated therewith, such as count information or timeout parameters).

Data transfer functionality may also include a data transport protocol for the wire. Thus, specification of the data transfer functionality for the wire may include specification of a data transport protocol for the wire. Data transport protocols may refer to the specific method used for implementing data exchange semantics. Data transport protocols may include TCP/IP (transmission control protocol/internet protocol), USB (universal serial bus), DMA (direct memory access), and/or register access. Note that these protocols are exemplary only and that numerous other protocols are envisioned.

In some embodiments, specifying a data transport protocol for the wire may include adapting the data transport protocol to the data exchange semantics. Adapting the data transport protocol may combine program logic with the data transport protocol to implement the data exchange semantic. For example, it may be possible to configure a DMA channel to behave as a mailbox or circular buffer, but this may require additional program logic at both ends of the data exchange to create the desired behavior using the somewhat rigid protocol in between.

Finally, data transfer functionality may also include a data transport medium for the first wire. Data transport mediums may refer to the physical medium over which the data transport protocol is implemented (and correspondingly specified data exchange semantics). Thus, configuring the first wire in the diagram may involve specification of data exchange semantics, a data transport protocol, and/or a data transport medium.

As a specific example, a diagram may have a first icon and a second icon each representing different functions. The first icon may represent software (e.g., a function or VI) that is targeted for execution on a computer (e.g., as indicated by a first target execution icon). The second icon may represent software that is targeted for execution on an FPGA (e.g., as indicated by a second target execution icon). Thus, wiring the first and second icon indicates that data are passed between the computer and the FPGA (and in particular, the specific functions or program code represented by the first icon and the second icon). The two devices may be physically connected via a PCI bus. To configure the first wire, data exchange semantics may be specified for the first wire. The data exchange semantics may specify that the two devices communicate data between the software represented by the first icon and the second icon using a FIFO. However, in order to achieve the specified data exchange semantics, a data transport mechanism may be specified. The data transport mechanism may include the data transport protocol as well as the physical data transport medium. Thus, configuring the first wire may include specifying that the two devices communicate over a specific physical medium, in this case, a PCI bus. The data transport protocol may therefore be specified using the constraints of the data transport medium and/or the specified data exchange semantics. In this case, the data transport protocol may be specified (e.g., automatically) as DMA (direct memory access). Thus, in order to configure wires, data exchange semantics, data transport protocols, and/or data transport mediums may be specified.

In some embodiments, the data transfer functionality may be specified by the user. For example, one or more of the data exchange semantics, data transport protocol, and/or data transport medium may be specified by a user. In one embodiment, the user may be able to select the first wire, the first icon, the second icon, terminals of the icons, and/or other associated icons, such as a harness icon, and invoke a configuration menu (e.g., a configuration GUI). Furthermore, a series of GUIs or a wizard may be used for configuring the first wire. In some embodiments, selecting the first wire, icons, or terminals may include selecting affordances of the first wire, icons, and/or terminals. For example, in some embodiments, the first wire's affordance may be an icon displayed proximate to the wire and between the endpoints of the wire. Alternatively, the first wire's affordance may be the entirety of the first wire. Similar remarks apply to affordances of the icons and the terminals of the icons. As used herein, the term "proximate" is intended to indicate an association between the two objects, which, in this case, is the icon and the first wire. In some embodiments, proximate may mean within one or more centimeters or an inch. Alternatively, proximate may mean within a given number of pixels on the display, e.g., 50 or 100 pixels.

The user may then specify one or more of the data exchange semantics, transport protocols, and/or transport mediums via the GUI. Alternatively, or additionally, the data exchange semantics, data transport protocol, and/or data transport medium may be specified by generation of a graphical program. Thus, in some embodiments, a graphical program may be created for the wire in order to specify all or a portion of the data transfer functionality. Similar to descriptions above, the graphical program may be created manually or automatically as desired.

Alternatively, or additionally, the user may specify default values (e.g., globally or with respect to individual icons, target devices, and/or wires in the diagram). Thus, in some embodiments, the first wire may be specified according to default exchange semantics, transport protocols, and/or transport mediums (among others) until further configured is performed (if desired).

Note, however, that one or more of the data exchange semantics, data transport protocol, and/or data transport medium may be specified automatically, e.g., by the development environment or other processes. Automatically configuring the wire may include automatically determining the data exchange semantics, data transport protocol, and/or data transport medium without receiving user input specifying the specific respective exchange semantics, transport protocol, and/or transport medium. Automatic configuration of the first wire may be performed based on communication or configuration policies of the connected icons (e.g., of the first and/or the second icons which the fire wire connects), communication policies of the diagram (e.g., global communication policies), default values, and/or other factors.

However, it should be noted that, in some embodiments, automatic specification of some or all of the data transfer functionality of the wire may not use default values; in other words, in some embodiments, automatic determination and/or specification of data transfer functionality of the wire may be performed intelligently on a case by case basis. In some embodiments, the entirety of the data transfer functionality may be specified and/or determined automatically or a portion may be determined automatically. However, as indicated above, some or all of the data transfer functionality may be specified manually by the user. Thus, any combination of manual and automatic configuration may be used for the data transfer functionality or portions thereof.

For example, in one embodiment, the user may manually specify data exchange semantics for the wire, e.g., using a GUI, and the data transport protocol and/or the data transport medium may be determined automatically. In one embodiment, the data transport medium may be selected automatically based on the possible connectivities between the two devices executing the respective code represented by the first and second icons. In some systems, this may be easily determined, e.g., where the two devices are only connected via one medium or pathway. However, in more complex systems, devices may be coupled via a plurality of paths. Correspondingly, in such embodiments, automatically determining the data transport medium may be performed based on the specified data exchange semantics (e.g., determining which data transport medium would most effectively allow the specified data exchange semantics), path length, path cost, power requirements of the path, default pathways (e.g., specified by the user), and/or other considerations. Additionally, selection of the data transport medium may depend on the determination or specification of the data transport protocol and/or data exchange semantics.

Similarly, the data transport protocol may be automatically determined based on specified data exchange semantics and/or data transport medium. Because data transport protocols have some dependency on the physical medium through which the protocol is transmitted, automatically determining the protocol may be based on available connections between the two devices (e.g., the data transport medium). Additionally, some data exchange semantics may be only implemented using a subset of the available data transport protocols. Thus, automatically determining the data transport protocol may be determined by eliminating options which do not conform to already specified exchange semantics and/or transport mediums (or disallowed protocols specified for the wire/diagram), among others.

Finally, data exchange semantics may be similarly determined. More specifically, the data exchange may be automatically determined according to already specified data transport mediums and/or protocols, diagram communication policies, icon communication policies, device communication policies, and/or other considerations. In one embodiment, the data exchange semantics may be automatically determined based on the icons connected by the first wire. For example, the first icon may provide data at a certain periodic rate while the second icon consumes data at a second rate. Correspondingly, a data exchange semantic may be automatically determined so that data are provided from the first icon to the second icon where data are not lost and are always available for consumption. Note that other embodiments are envisioned.

Additionally, automatically determining one or more of the data exchange semantics, data transport protocol, and/or data transport medium may involve (automatic) analysis of the graphical program code (e.g., in the graphical program and/or system diagram). For example, an analysis of the graphical program code (which includes the first icon) may reveal how data should be provided (and/or for what purpose). Similarly, an analysis of the graphical program code which includes the second icon (e.g., whose code may be executing on a separate device) may reveal how data will be consumed. Correspondingly, this analysis may be used to determine optimal data exchange semantics, data transport protocol, and/or data transport medium, e.g., automatically.

Note that, as indicated above, any of the data exchange semantics, data transport protocol, or data transport medium may be determined automatically or manually. In other words, none, a portion, or the entirety of the data transfer functionality may be determined automatically. Thus, the data transfer functionality may be determined automatically and/or manually, as desired.

In 1006, the diagram may be executed. During execution of the diagram, data may be provided from the first icon to the second icon according to the data transfer functionality. Thus, in embodiments where code represented by the two icons is executing on different devices (e.g., as indicated by target execution icons), the data may be provided according to the data exchange semantic using the data transport protocol via the data transport medium. Thus, FIG. 10 illustrates an exemplary method for configuring a wire in an executable diagram.

Figure 11:
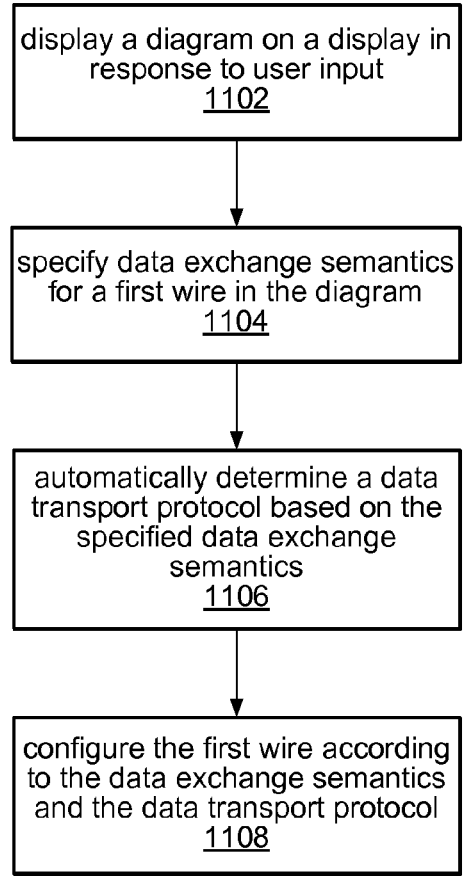
FIG. 11 is a flowchart diagram illustrating one embodiment of a method for automatically determining a data transport protocol for a wire with a data exchange semantic.

FIG. 11—Method for Automatically Determining a Data Transport Protocol

FIG. 11 illustrates a computer-implemented method for configuring wires in a diagram according to one embodiment. The method shown in FIG. 11 may be used in conjunction with any of the computer systems or devices shown in the above Figures, among other devices. In various embodiments, some of the method elements shown may be performed concurrently, performed in a different order than shown, or omitted. Additional method elements may also be performed as desired. As shown, this method may operate as follows.

In 1102, a diagram may be displayed according to the embodiments described above in 1002, among others.

In 1104, data exchange semantics may be specified for the first wire. As described above, the data exchange semantics may indicate or specify how data are transferred between the first icon and the second icon. Data exchange semantics may include read policies, write policies, directionality of the wire (e.g., one way or two way directionality), associated or included data structures relating to data transfer functionality, wire branching semantics, queues, buffers, etc.

Similar to descriptions above in FIG. 10, the data exchange semantics may be specified by a user. As indicated above, the user may select the first wire and select or specify the data exchange semantics using a variety of methods (e.g., by clicking or selecting affordances associated with the wire, the first icon, the second icon, and/or terminals associated therewith). In some embodiments, the user may select the data exchange semantics by using a GUI or a series of GUIs (e.g., a wizard). Additionally, as also described above, the data exchange semantics may be specified automatically based on endpoints of the wires, global policies, device policies, icon policies, and/or other factors. Alternatively, or additionally, specifying the data exchange semantics may include specifying or assembling a graphical program for the first wire. As indicated above, the graphical program may be assembled or specified automatically or manually as desired. Thus, data exchange semantics may be specified for the first wire.

In 1106, a data transport protocol may be automatically determined based on the specified data exchange semantic. As described above, the data transport protocol may refer to a method for implementing the data exchange semantic for the first wire, e.g., using DMA, USB, register access, and/or TCP/IP (among others). Automatically determining the data transport protocol may be based on the available data transport mediums, the specified data exchange semantics, default values (e.g., of the diagram, icons, and/or devices executing software represented by the icons, among others), operational parameters and/or characteristics of the device(s) corresponding to the first and second icons, communication policies (global or local), and/or other information. However, as noted above, in some embodiments, automatically determining the data transport protocol may not use default values and instead may intelligently determine the data transport protocol, e.g., based on specific configurations/specifications of the icons and/or devices. Additionally, as indicated above, automatically determining the data transport protocol means that the user does not manually specify the data transport protocol for the first wire. Thus, in some embodiments, the data transport protocol may be automatically determined based on at least the manually specified data exchange semantics. Similarly, the data transport medium may be specified manually or automatically based on a number of different factors (as described above). Note that in trivial cases where there is only one data transport medium between the two devices no determination of the data transport medium may be necessary.

In 1108, the first wire may be configured according to the data exchange semantics, the data transport protocol, and/or the data transport medium. As indicated above, configuring the wire may include adapting the data transport protocol to the data exchange semantic. Adapting the data transport protocol may involve combining program logic with the data transport protocol to implement the data exchange semantic.

Thus, after configuration, the diagram may be executable to perform the data transfer functionality between the first and second icons as indicated and/or specified by the wire. Thus, the user may specify data exchange semantics for the first wire and a data transport protocol and/or data transport medium may be automatically determined based on the specified data exchange semantics (and/or other information). Correspondingly, the diagram may execute according to the specified data transfer functionality.

Figure 12:
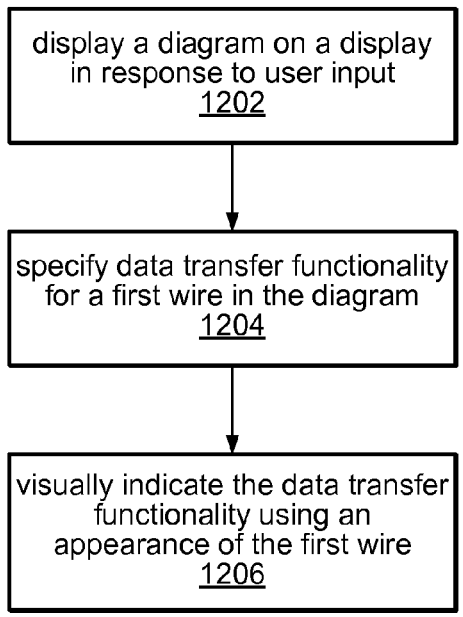
FIG. 12 is a flowchart diagram illustrating one embodiment of a method for displaying wires which visually represent their data exchange semantics.

FIG. 12—Diagram Wires which Visually Indicate Data Transfer Functionality

FIG. 12 illustrates a computer-implemented method for configuring wires which visually indicate data transfer functionality according to one embodiment. The method shown in FIG. 12 may be used in conjunction with any of the computer systems or devices shown in the above Figures, among other devices. In various embodiments, some of the method elements shown may be performed concurrently, performed in a different order than shown, or omitted. Additional method elements may also be performed as desired. As shown, this method may operate as follows.

In 1202, a diagram may be displayed according to the embodiments described above in 1002, among others.

In 1204, data transfer functionality may be specified for the first wire. As described above, the data transfer functionality may include data exchange semantics, a data transport protocol, and/or a data transport medium. Additionally, as also indicated above, the data transfer functionality may be determined and specified automatically or manually (in part or in whole) as desired. Thus, the wire may be configured to perform the data transfer functionality during execution.

In 1206, the first wire may visually indicate that data from the first icon is provided to the second icon according the specified data transfer functionality. The first wire visually indicating the data transfer functionality (e.g., the data exchange semantics, the data transport protocol, and/or the data transport medium) may be performed in response to configuration of the wire. However, in some embodiments, the first wire indicating the data transfer functionality may be limited to visually indicating the data exchange semantics and/or the data transport protocol. In other words, in some embodiments, the first wire may only indicate the configurable aspects of the data transfer functionality and may not simply indicate the type of physical connection between the two icons (e.g., the connection between the devices executing code represented by the icons).

In some embodiments, the method may include storing a plurality of possible visual appearances, e.g., for the first wire or any wire in the diagram. Correspondingly, the first wire visually indicating the data transfer functionality may include displaying one of the plurality of possible visual appearances based on the specified data transfer functionality (e.g., the data exchange semantics). In various embodiments, the plurality of possible visual appearances (and/or the visual appearance of the first wire) may vary according to different patterns, different colors, and/or different thicknesses (among others). For example, in some embodiments, a wire with buffered data exchange semantics may have a specific color, pattern, and/or thickness which may be associated with the specified (or generic) buffered data exchange semantics. Similarly, other specified aspects of the data transfer functionality may have corresponding associated appearances or aspects. In some embodiments, patterns may be associated with data exchange semantics and color may be associated with data transport protocols. Note that these associations are exemplary only and that any characteristic of the appearance may be associated with any characteristic of the data transfer functionality. Alternatively, the whole appearance may vary according to the entirety of the specified data transfer functionality.

In some embodiments, the appearance of the first wire may vary in other ways (e.g., in addition to the pattern, size, and thickness of the wire). For example, in various embodiments, the wire may take on a three dimensional (3-d or 3D) appearance, a tube appearance, a separated appearance (e.g., where the wire may not be displayed continuously on the display), a curved appearance, rectangular appearance, and/or other appearances. Thus, the wire may have any of a variety of appearances based on the specified data transfer functionality.

As indicated above, in some embodiments, an icon may be associated with the wire (e.g., displayed proximate or on the wire) which visually indicates the specified data transfer functionality. The icon may be in addition to or as an alternative to the visual appearance of the wire itself. In various embodiments, the icon may be a data transfer icon or a data transfer indicator (both described in more detail below).

In some embodiments, the icon may represent a mailbox, indicating mailbox data exchange semantics. The icon may take on the appearance of a mailbox, or in simpler embodiments, may be an icon which includes an arrow and a rectangle. Alternatively, the icon may represent a circular buffer (as specified in the data exchange semantics for the wire). In this case, the icon may include at least one circle and an arrow. In one embodiment, the icon may represent a FIFO (first in first out), and the icon may include a plurality of rectangles (e.g., forming a larger rectangle) and an arrow. Note that the above described icon is exemplary only and other icons are envisioned which are associated with various ones of the data exchange semantics, data transport protocol, and/or data transport medium, as desired.

Note that the wire visually indicating the data transfer functionality (or more specifically the data exchange semantics) may include replacing a generic or default appearance with a new appearance. Thus, in some embodiments, the wire may have a first appearance, e.g., when first displayed in the diagram, and may take on a new appearance after configuration. Alternatively, or additionally, the wire may have a first appearance during wiring (e.g., while the wire is being connected between the two icons) and may take on a configured appearance after completion of the connect (e.g., where at least a part of the data transfer functionality is automatically determined upon connection).

In some embodiments, instead of selecting a generic wire and configuring the wire, the user may select a wire of a plurality of different possible wires. Each of these wires may represent different data transfer functionalities (e.g., data exchange semantics) and may correspondingly visually represent the respective data transfer functionality. Thus, instead of the user connecting the two icons and configuring the wire (resulting in the wire visually indicating the specified data transfer functionality), the user may select a wire from a plurality of wires that is already configured according to the desired data transfer functionality. Correspondingly, that wire may visually represent the desired data transfer functionality.

Thus, in some embodiments, after configuration, the wire may visually indicate the data transfer functionality. Correspondingly, during execution, data may transferred according to the data transfer functionality.

Figure 13:
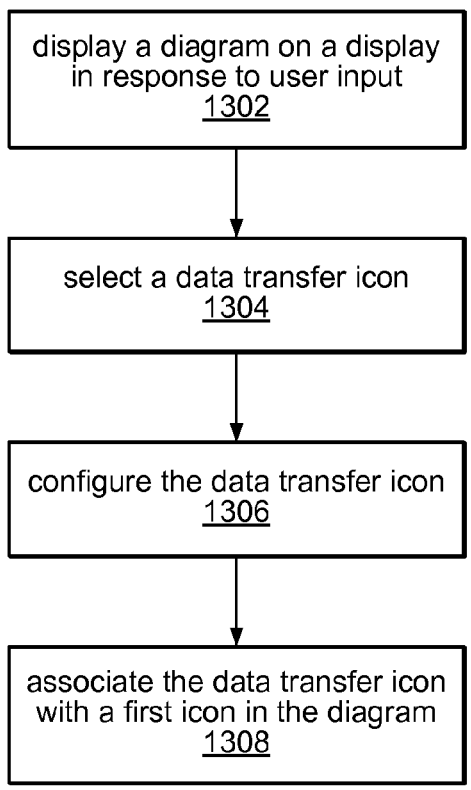
FIG. 13 is a flowchart diagram illustrating one embodiment of a method for configuring data transport icons associated with a node in a diagram.

FIG. 13—Configuring Data Transfer Functionality Using a Data Transfer Icon

FIG. 13 illustrates a computer-implemented method for configuring data transfer functionality using a data transfer icon according to one embodiment. The method shown in FIG. 13 may be used in conjunction with any of the computer systems or devices shown in the above Figures, among other devices. In various embodiments, some of the method elements shown may be performed concurrently, performed in a different order than shown, or omitted. Additional method elements may also be performed as desired. As shown, this method may operate as follows.

In 1302, a diagram may be displayed, e.g., according to the embodiments described above in 1002, among others.

Displaying the diagram may include displaying a first icon in the diagram. As described above, the first icon may have input(s) and/or output(s) associated with the icon. For example, the first icon may have terminals associated with each respective input or output for connecting wires to the icon. Thus, data may be provided or received on the inputs/outputs of the icon. As also indicated above, the first icon may represent a processing element, software code, and/or a device. In primary embodiments, the first icon represents software code that is executable by a first device (e.g., a measurement device). In one embodiment, the first icon may be a primitive, a VI or sub-VI, an I/O icon, and/or a Harness icon. Thus, the first icon may be any of numerous types appropriate for the diagram.

In 1304, a data transfer icon may be selected, e.g., by a user. For example, in one embodiment, the user may select the data transfer icon from a plurality of icons, e.g., displayed in a palette of the development environment. More specifically, the palette may include a plurality of icons related to assembling the graphical program and/or the system diagram.

In 1306, the data transfer icon may be configured. For example, configuring the data transfer icon may include specifying data transfer functionality for the data transfer icon. In preferred embodiments, specifying the data transfer functionality includes specifying data exchange semantics for the data transfer icon. However, as described above, configuring the data transfer icon may include specification of data exchange semantics, a data transport protocol, and/or a data transport medium. Additionally, as also indicated above, the data transfer functionality may be determined and specified automatically or manually (in part or in whole) as desired. For example, configuring the data transfer icon may include displaying a GUI, e.g., in response to user input. Alternatively, or additionally, configuring the data transfer icon may include specifying or assembling a graphical program for the data transfer icon, automatically or manually, as desired. Thus, the data transfer icon may be configured to perform the data transfer functionality during execution.

In preferred embodiments, similar to remarks above, the data transfer icon may visually indicate the specified data transfer functionality. For example, the data transfer icon may include or resemble a mailbox, a FIFO, a table, a register, and/or a buffer, among others. In some embodiments, the data transfer icon may represent a mailbox, indicating mailbox data exchange semantics. The data transfer icon may take on the appearance of a mailbox, or in simpler embodiments, may be an icon which includes an arrow and a rectangle. Alternatively, the data transfer icon may represent a circular buffer (as specified in the data exchange semantics for the wire). In this case, the data transfer icon may include at least one circle and an arrow. In one embodiment, the data transfer icon may represent a FIFO (first in first out), and the data transfer icon may include a plurality of rectangles (e.g., forming a larger rectangle) and an arrow. Note that the above described appearances are exemplary only and other appearances are envisioned which are associated with various ones of the data exchange semantics, data transport protocol, and/or data transport medium, as desired.

In 1308, the data transfer icon may be associated with the first icon. The data transfer icon in one embodiment is not intended as a stand-alone "function node", but rather is intended to be associated with another node or wire in order to configure that other node or wire with a data transfer configuration. Associating the data transfer icon with the first icon may associate the data transfer functionality specified for the data transfer icon with the first icon. In some embodiments, associating the data transfer icon with the first icon may include connecting the first icon and the data transfer icon, e.g., using a wire. Alternatively, the data transfer icon may be included in the first icon. For example, associating may include inserting the data transfer icon into the first icon (e.g., dragging and dropping the data transfer icon onto the first icon). Alternatively, associating the data transfer icon with the first icon may result in generation of a harness icon which encompasses the first icon. In such embodiments, the data transfer icon may no longer be displayed in the diagram and the harness icon may thereby replace the data transfer icon after the association. Thus, associating the first icon with the data transfer icon may configure the first icon with the data transfer functionality of data transfer icon.

Alternatively, or additionally, the data transfer icon may perform the data transfer functionality for the first icon and/or the wire connected to the first icon. For example, the first icon may transfer data according to synchronous data flow semantics, and the data transfer icon may provide the specified data transfer functionality, e.g., for buffered communication. Thus, the data transfer icon may convert the synchronous data flow semantics to the specified data exchange semantics of the data transfer functionality. Thus, the data transfer icon may indicate transferal of data according to the specified data transfer functionality, e.g., during execution of the diagram. Similarly, in some embodiments, the wire may pass data according to a simple consumption policy, and the data transfer icon(s) may handle specified semantics or policies, e.g., buffered communication semantics. Thus, in some embodiments, the data transfer icon may indicate or implement the specified data transfer functionality for the first icon or wire connected to the first icon.

The method may further include displaying a second icon in the diagram. In various embodiments, similar to descriptions above, the code represented by the first icon may be executed on a first device, and code represented by the second icon may be executed on a second device. However, it should be noted that the code of the two icons may not necessarily execute on separate devices, and may in fact execute on the same device. The two icons may be connected to each other, e.g., using a wire. Thus, the method may include associating the first icon with the second icon, where during execution of the diagram, data are provided from the first icon to the second icon according to the data transfer functionality.

Following descriptions from above, the data transfer icon may be interposed between the first icon and the second icon. Similarly, a second data transfer icon may be associated with the second icon. Thus, in some embodiments, the first data transfer icon may implement specified data transfer functionality for the first icon and the second data transfer icon may implement second specified data transfer functionality for the second icon. Additionally, in one embodiment, associating the data transfer icon with the first icon may automatically include associating the second data transfer icon with the second icon. Thus, in some embodiments, the user may choose and insert the data transfer icon in the diagram and the second data transfer icon may also be displayed in the diagram. In some embodiments, the first and second icons may already be coupled, e.g., via a wire. In some embodiments, data transfer icons may be automatically associated with icons when they are connected.

However, it should be noted that in some embodiments, the second icon may be executable to interpret or receive data according to the specified data transfer functionality (e.g., the data exchange semantics). In such embodiments, a second data transfer icon may not be necessary for the second icon.

In some embodiments, the first icon and/or the data transfer icon may be connected to a plurality of other icons in the diagram. For example, the first icon may be connected to a wire that branches and connects to other icons. In these embodiments, the data transfer icon may specify data transfer functionality for communication with Note that the data transfer icon may be reconfigured to perform different data transfer functionality. Additionally, or alternatively, the wire connected to the first icon may be configured/reconfigured, e.g., using the methods described above, among others. In such embodiments, reconfiguring the wire may be independent or dependent on the data transfer icon(s) that may be connected to the wire. Thus, in some embodiments, configuring or reconfiguring the wire may configure or reconfigure the data transfer icon(s) as desired. Alternatively, the wire configuration may be separate from the data transfer icon configuration. In some embodiments, the wire configuration may be linked with a first data transfer icon and not linked to another. This linking functionality may be specifiable by the user. However, it should be noted that in embodiments where the data transfer functionality (or data exchange semantics) are configured independently, conflicts or incompatibilities in the differently specified data transfer functionalities may arise. These conflicts may be indicated to the user. For example, in some embodiments, the wire connecting the two icons may "break" or otherwise indicate that the wire is no longer functional.

Thus, data transfer functionality may be specified using data transfer icons.

Figure 14:
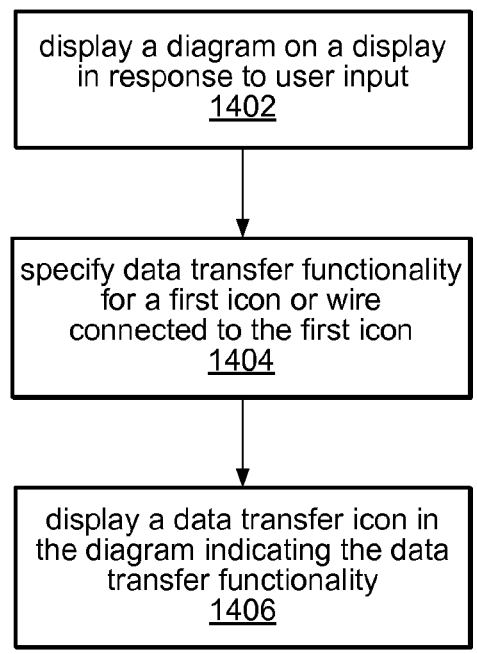
FIG. 14 is a flowchart diagram illustrating one embodiment of a method for displaying data transport indicators which visually indicate data transfer functionality.

FIG. 14—Data Transfer Indicator

FIG. 14 illustrates a computer-implemented method for configuring data transfer functionality and indicating the functionality using a data transfer indicator according to one embodiment. The method shown in FIG. 14 may be used in conjunction with any of the computer systems or devices shown in the above Figures, among other devices. In various embodiments, some of the method elements shown may be performed concurrently, performed in a different order than shown, or omitted. Additional method elements may also be performed as desired. As shown, this method may operate as follows.

In 1402, a diagram may be displayed, e.g., according to the embodiments described above in 1302, among others.

In 1404, data transfer functionality may be specified for the first icon and/or a wire connected to the first icon. The data transfer functionality may be specified via a variety of methods, such as those described above, among others. For example, the data transfer functionality may be specified manually or automatically as desired. The data transfer functionality may be specified for the wire, the first icon, a data transfer icon, a harness icon encompassing the first icon, other icons, and/or affordances associated therewith (among others). In some embodiments, as indicated above, the first icon may be configured by assembling a graphical program which specifies the data transfer functionality. Thus, data transfer functionality (e.g., data exchanges semantics and/or a data transport protocol) may be specified for the first icon.

In 1406, a data transfer indicator may be displayed in the diagram. The data transfer indicator may visually indicate the specified data transfer functionality (e.g., of the first icon). In some embodiments, the data transfer indicator may be displayed proximate to the first icon and/or the wire connected to the first icon. Similar to descriptions above regarding the icon displayed on or next to the wire and/or the data transfer icon, the data transfer indicator may have an appearance which represents the data transfer functionality. For example, the data transfer indicator may represent a mailbox, indicating mailbox data exchange semantics. The data transfer indicator may take on the appearance of a mailbox, or in simpler embodiments, may be an icon which includes an arrow and a rectangle. Alternatively, the data transfer indicator may represent a circular buffer (as specified in the data exchange semantics for the wire). In this case, the data transfer indicator may include at least one circle and an arrow. In one embodiment, the data transfer indicator may represent a FIFO (first in first out), and the data transfer indicator may include a plurality of rectangles (e.g., forming a larger rectangle) and an arrow. Note that the above described appearances are exemplary only and other appearances are envisioned which are associated with various ones of the data exchange semantics, data transport protocol, and/or data transport medium, as desired.

FIGS. 15A-15E—Exemplary GUIs for Configuring a Wire

FIGS. 15A-15E are exemplary screen shots of GUIs for configuring a wire or icon coupled to the wire according to one embodiment. In one embodiment, one or more of these GUIs may be usable according to the methods described above. However, it should be noted that these are exemplary only and that other GUIs, displays, or methods for receiving input for configuring wires or icons in the diagram are envisioned.

Figure 15A:
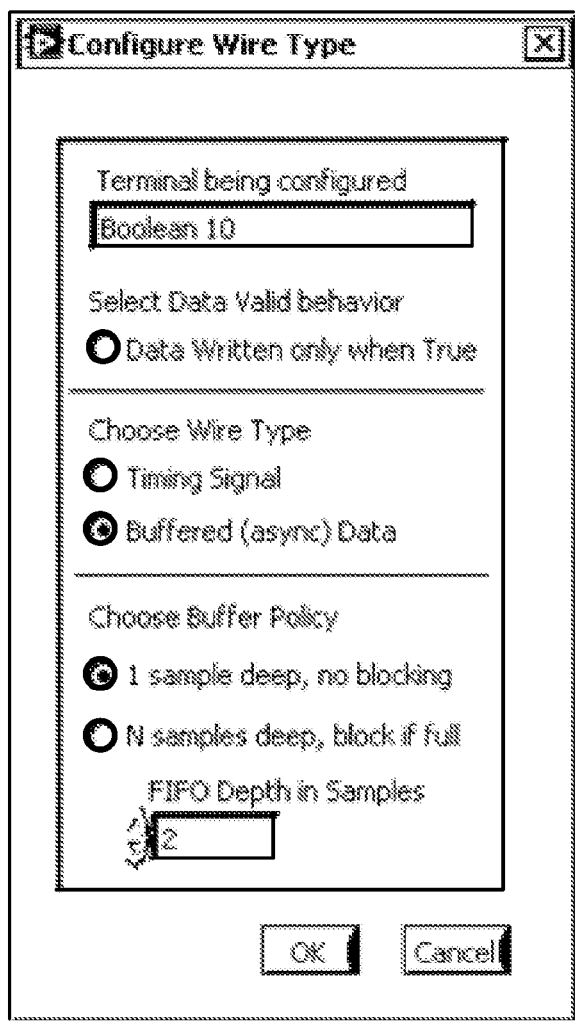
FIGS. 15A-15E are exemplary screen shots of GUIs for configuring a wire or data transfer icon according to one embodiment.

FIG. 15A is a screen shot of an exemplary GUI for configuring a wire (or icon connected to a wire). As shown, the GUI may indicate the terminal or wire being configured (in this case Boolean 10). The GUI may allow the user to select data valid behavior (e.g., Data Written only when True), wire type (e.g., timing or buffered), or buffer policy (e.g., 1 sample deep, no blocking or N samples deep, block if full), among others.

Figure 15B:
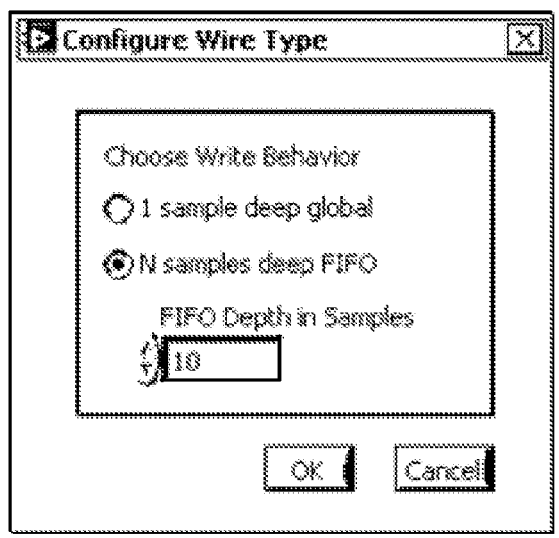

FIG. 15B is a screen shot of an exemplary GUI for configuring a wire type. As shown, the user may select a write behavior (e.g., 1 sample deep global or N samples deep FIFO). In this case, N samples deep FIFO is selected with a FIFO depth (in samples) of 10.

Figure 15C:
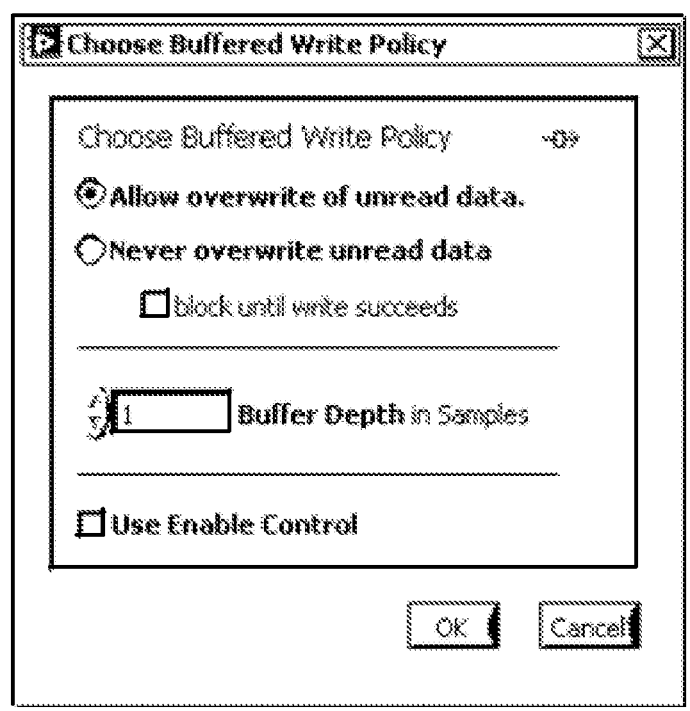

FIG. 15C is a screen shot of an exemplary GUI for choosing a buffered write policy. As shown in this Figure, allow overwrite of unread data is selected for a register type communication policy (as indicated by the graphic in the upper right hand corner). The GUI also includes the ability to choose "Never overwrite unread data" (with the option to block until write succeeds), buffer depth, and use enable control.

Figure 15D:
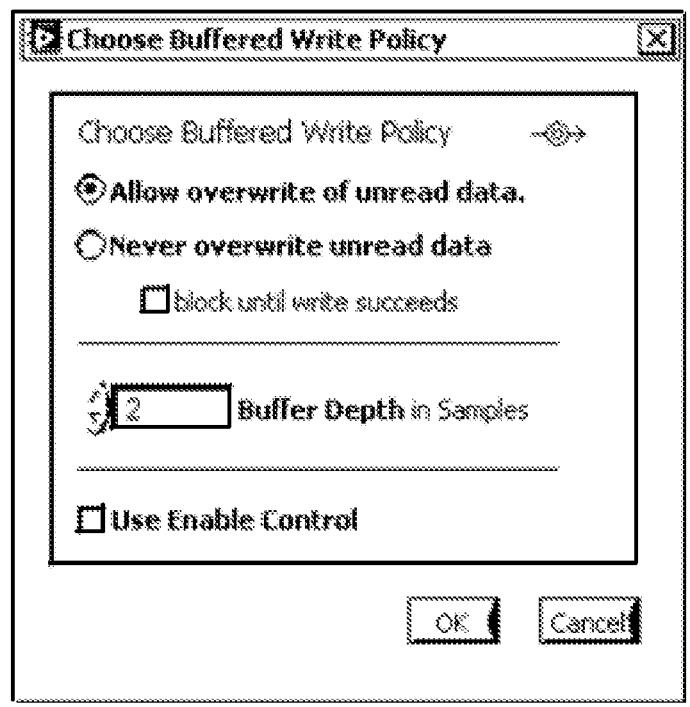

FIG. 15D is a similar screen shot of a GUI for choosing a buffered write policy of a circular buffer. In this case the buffer depth is 2.

Figure 15E:
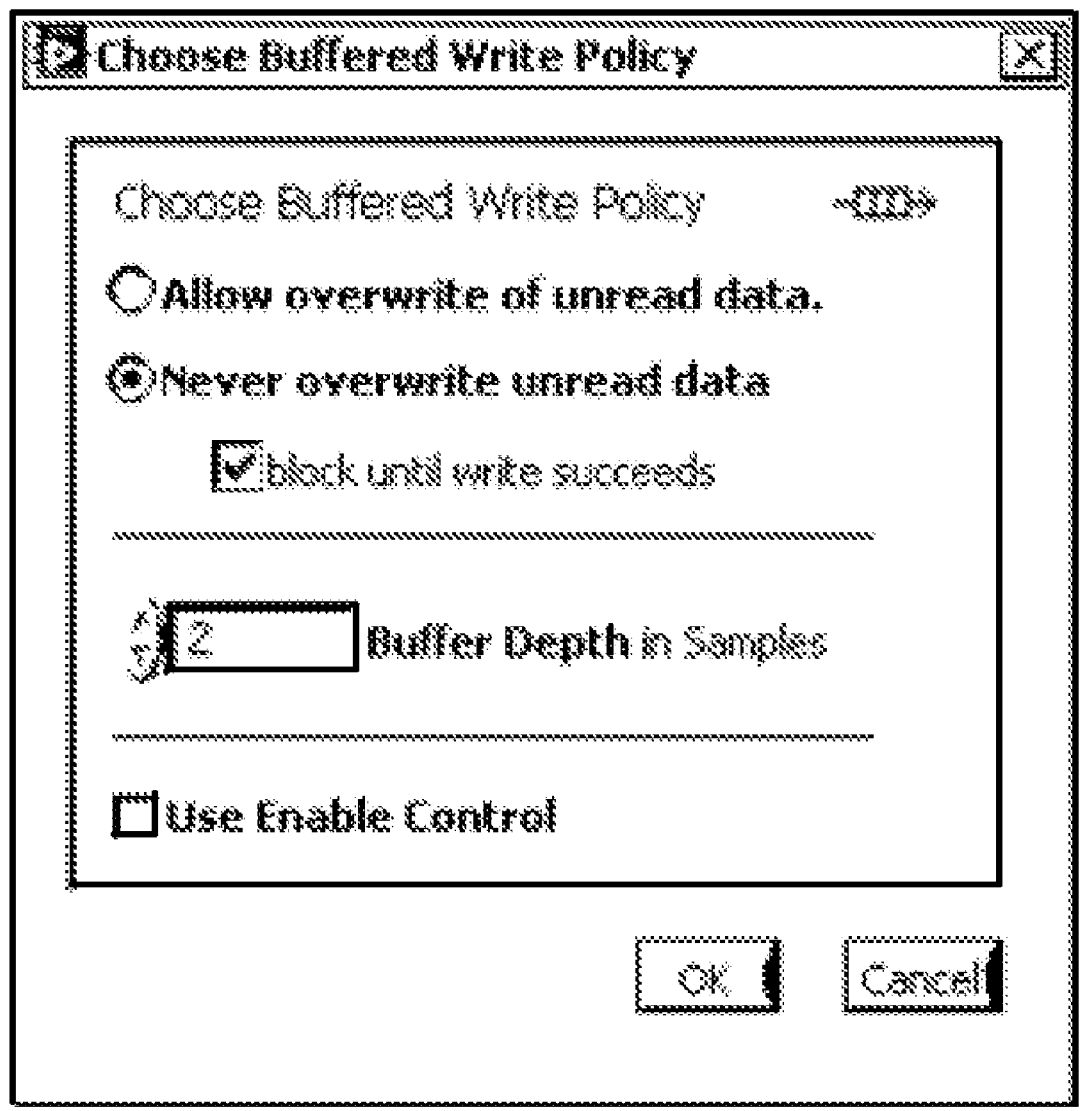

FIG. 15E is a similar screen shot of a GUI for choosing a buffered write policy of a FIFO. In this case, the buffer depth is 2 and unread data is not overwritten. Additional, a block is performed until the write succeeds. Thus, FIGS. 15A-15E are exemplary screen shots of GUIs for configuring a wire or icon of a diagram.

FIGS. 16A-16J—Exemplary Icons

FIGS. 16A-16J illustrate exemplary icons which may be used for indicating or configuring configurable wires. For example, these icons may be used as data transfer icons, data transfer indicators, accessors, affordances (e.g., of a wire or icon), and/or other uses (such as those described above, among others). In various embodiments, one or more of these icons may be usable according to the methods described above. However, it should be noted that these are exemplary only and that other icons are envisioned.

FIGS. 16A and 16B illustrate exemplary icons indicating a circular buffer. FIGS. 16C and 16D illustrate exemplary icons indicating a mailbox. FIGS. 16E and 16F illustrate exemplary icons indicating a FIFO. FIG. 16G illustrates an exemplary icon indicating that a global variable may be used by the wire or terminal (or may "back" the wire). Similarly, FIG. 16H illustrates an exemplary icon (resembling a RAM chip) indicating that memory may be used by the wire or terminal (or may "back" the wire).

FIG. 16I illustrates an exemplary icon indicating a hardware element. FIG. 16J illustrates a harness icon around a VI. As described above, the harness icon may convert between asynchronous data and timing wires and synchronous dataflow for the VI.

FIGS. 17A-17H—Exemplary Wires with Icons

FIGS. 17A-17H illustrate exemplary configured wires with icons which may be used for indicating or configuring the wires. Note that the icons shown here are exemplary only and that other icons (such as those described above, among others) are envisioned. In various embodiments, one or more of the icons shown in these Figures may be displayed or not displayed as desired. Additionally, these exemplary wires may be used in conjunction with any of the systems or methods described above.

Figure 17A:
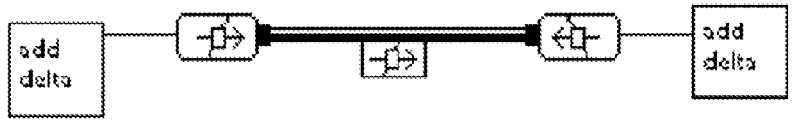
FIGS. 17A-17H are exemplary wires with icons for indicating or configuring configurable wires according to one embodiment.
Figure 17B:
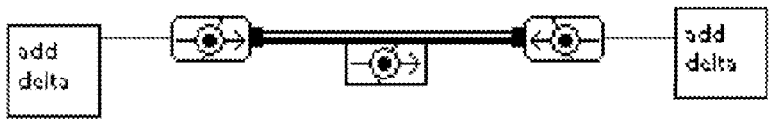
Figure 17C:
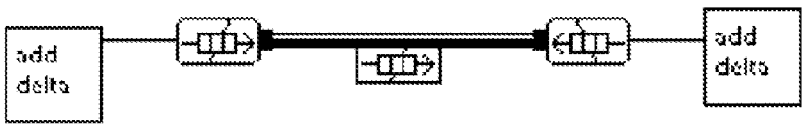

As shown, FIG. 17A illustrates two add delta icons connected by a wire with an affordance which visually indicates that the wire is configured according to a mailbox. Additionally, data transfer icons are connected between the add delta icons and the wire. The data transfer icons also indicate that the wire and/or add delta icons are configured according to mailbox communication policies. Similarly, FIGS. 17B and 17C show the same icons except the affordance and data transfer icons indicate that the wire/terminals are configured according to a circular buffer and FIFO respectively.

Figure 17D:
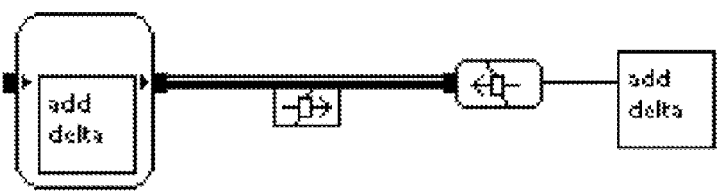

FIG. 17D illustrates the add delta icon with a harness icon which handles the communication policies for the add delta icon. As shown, in this configuration, the affordance and the data transfer icon may visually indicate a mailbox configuration. However, in this case, the harness icon may not visually indicate this configuration for the left most add delta icon.

Figure 17E:
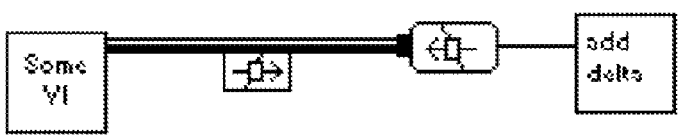

Similar to FIG. 17D, FIG. 17E shows a VI connected to the add delta icon using a mailbox. In this case, the VI may not require a data transfer icon (or it may not be displayed, in some embodiments). In this case, the VI may already communicate according to the configured mailbox communication policies.

Figure 17F:
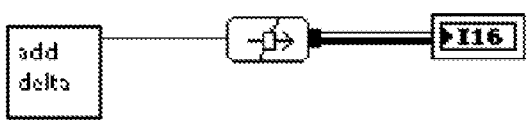

FIG. 17F shows an embodiment where only a data transfer icon indicates the configuration of the wire/add delta icon, which, in this case, is a mailbox.

Figure 17G:
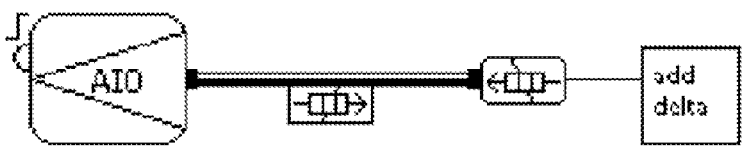

FIG. 17G shows a hardware icon connected to an add delta icon with a FIFO (indicated by the affordance of the wire and the data transfer icon of the add delta icon.

Figure 17H:
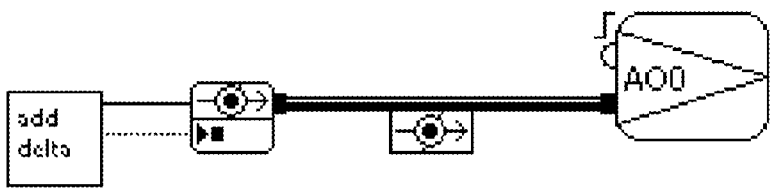

FIG. 17H shows a similar display, except with a circular buffer.

Thus, FIGS. 17A-17H illustrate exemplary configured wires with icons which may be used for indicating or configuring the wires.

Specification of Data Transfer Functionality and Associated Indications

As described herein, various methods may be used to specify data transfer functionality between two icons in a diagram (e.g., between two devices executing code represented by the two icons). Similarly, various methods of indicating the data transfer functionality are described herein. Note that embodiments are envisioned where any combination of these methods of specification and/or indication of data transfer functionality are utilized. In other words, the data transfer functionality may be specified using any of the methods described above (or any combination thereof), and that the specified data transfer functionality may be indicated using any of the various methods (or any combination thereof) also described above. Note further that other embodiments and methods of specifying and/or indicating data transfer functionality are envisioned.

Exemplary Specific Embodiments Regarding Configuration of Asynchronous Wires

The following descriptions and Figures provide specific embodiments of configuration and/or indication of asynchronous wires in a diagram (e.g., a graphical program or system diagram). Note that these embodiments are not intended to limit the scope of the invention. However, note that any of the details described below may also apply to the systems and methods already described above.

Figure 18:
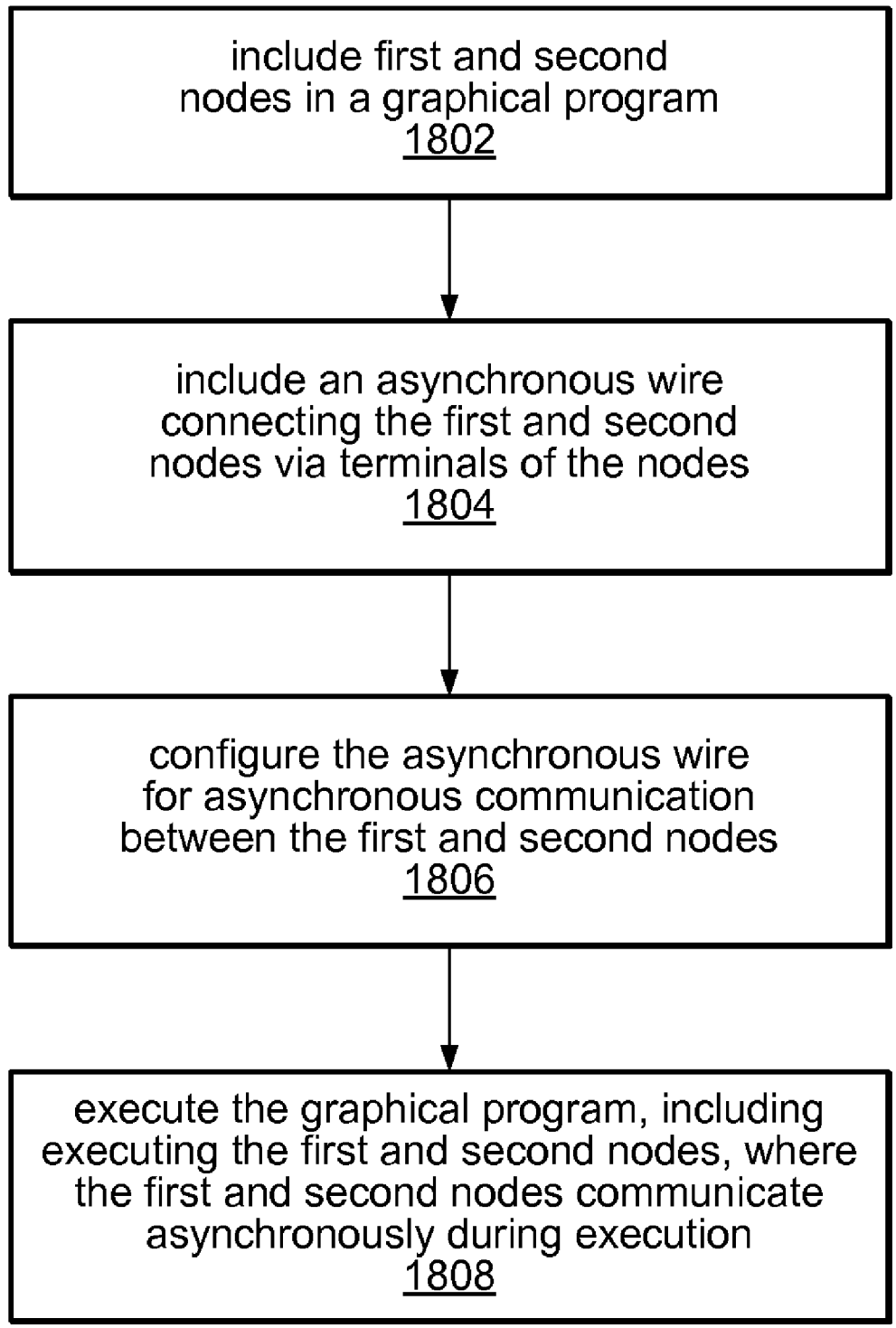
FIG. 18 is a flowchart diagram illustrating one embodiment of a method for asynchronous communication in a graphical program.

FIG. 18 illustrates a computer-implemented method for asynchronous communication in a graphical program according to one embodiment. The method shown in FIG. 18 may be used in conjunction with any of the computer systems or devices shown in the above Figures, among other devices. In various embodiments, some of the method elements shown may be performed concurrently, performed in a different order than shown, or omitted. Additional method elements may also be performed as desired. As shown, this method may operate as follows.

First, in 1802 a first node and a second node may be displayed in a graphical program, where the graphical program includes a plurality of interconnected nodes that visually indicate functionality of the graphical program. Each of the first and second nodes preferably has a respective functionality, and includes a respective terminal. In other words, each node may include a terminal for connecting or wiring the node to another graphical program element, such as another node, for sending and/or receiving data to and/or from the other node.

The graphical program may be created or assembled by the user arranging on a display a plurality of nodes or icons and then interconnecting the nodes to create the graphical program. In response to the user assembling the graphical program, data structures may be created and stored which represent the graphical program. The nodes may be interconnected in one or more of a data flow, control flow, or execution flow format. The graphical program may thus comprise a plurality of interconnected nodes or icons that visually indicates the functionality of the program. As noted above, the graphical program may comprise a block diagram and may also include a user interface portion or front panel portion. Where the graphical program includes a user interface portion, the user may optionally assemble the user interface on the display. As one example, the user may use the LabVIEW graphical programming development environment to create the graphical program.

In an alternate embodiment, the graphical program may be created by the user creating or specifying a prototype, followed by automatic or programmatic creation of the graphical program from the prototype. This functionality is described in U.S. patent application Ser. No. 09/587,682 titled "System and Method for Automatically Generating a Graphical Program to Perform an Image Processing Algorithm", which is hereby incorporated by reference in its entirety as though fully and completely set forth herein. The graphical program may be created in other manners, either by the user or programmatically, as desired. The graphical program may implement a measurement function that is desired to be performed by one or more instruments. In other embodiments, the graphical program may implement other types of functions, e.g., control, automation, simulation, and so forth, as desired.

Figure 19:
FIG. 19 is graphical program illustrating use of asynchronous wires, according to one embodiment.

In 1804, an asynchronous wire may be included in the graphical program, where the asynchronous wire connects the first node and the second node via their respective terminals. In other words, a first end of the asynchronous wire may be connected to the terminal of the first node, and a second end of the asynchronous wire may be connected to the terminal of the second node. For example, in one embodiment, the nodes may be specified or intended respectively as source and sink nodes with respect to communication between the nodes. FIG. 19 is a high-level illustration of such source and sink nodes, labeled accordingly, connected via an asynchronous wire. However, it should be noted that in other embodiments the asynchronous wire may facilitate two-way communication between the nodes, i.e., from the first node to the second and from the second node to the first.

In 1806, the asynchronous wire may be configured for asynchronous communication between the first and second nodes. For example, various attributes of the asynchronous wire may be configured or set to facilitate asynchronous communication between the first node and the second node. In one embodiment, these attributes may include one or more of: a data structure type included in or used by the wire, e.g., a first in first out (FIFO) queue; buffer size for the asynchronous wire; read policy, e.g., block reads if the buffer is empty or uninitialized, remove the element upon a read from the buffer (e.g., destructive/non-destructive reads), read chunk size, etc.; write policy, e.g., block all writes to the buffer if the buffer is full, overwrite if the buffer is full or always, write chunk size, etc.; initial value on the wire; directionality of the asynchronous wire; and semantics of wire splits, i.e., how branching of the wire may affect communications using the wire, among others. Note that the various policies specified for use of the asynchronous wire may accommodate various models of computation (MoC) for the graphical program, including, for example, Kahn Process Networks (PN) and Communicating Sequential Processes (CSP), among others.

In some embodiments, the asynchronous wire may have a default configuration, i.e., one or more of the attributes may be preset with default values. Thus, the configuration of the asynchronous wire (at least with respect to the default valued attributes) may effectively occur when the wire is included in the block diagram of the graphical program. Of course, even were some or all of the attributes to have default values, subsequent configuration of the asynchronous wire, e.g., by the user or by another process, may overwrite these default values with new values. In other words, configuring the asynchronous wire may include overwriting at least one of the default values for the one or more attributes of the asynchronous wire with a respective at least one new value.

In one embodiment, a user may be able to configure a terminal on a node to be "asynchronous", after which wires connected to this terminal may have asynchronous behavior. In other words, connecting a wire to an asynchronous terminal may automatically invoke creation or instantiation of an asynchronous wire, e.g., via conversion of a normal "synchronous" wire to the asynchronous wire, or replacement of the normal wire with the asynchronous wire. Users may then click on the asynchronous wire and configure its run-time behavior, such as the size of the queue and the read/write policies (blocking/non-blocking, destructive/non-destructive reads), as described above. In other words, once a terminal of a node is configured to be asynchronous, any wire connected to that terminal may automatically be configured as an asynchronous wire.

In one embodiment, the asynchronous wire and/or the terminal(s) may be configured via invocation of a graphical user interface (GUI), e.g., one or more dialogs, menus, property pages, attribute nodes, etc., e.g., by the user right-clicking on the asynchronous wire or terminal. The user may then select or input values for various attributes of the asynchronous wire or terminal. Alternatively, or additionally, the asynchronous wire and/or the terminal(s) may be configured via input from another process, such as a graphical program generation program or wizard. For example, in the case of a wizard, the user may provide input to various panels or dialogs specifying the attributes. Thus, in various embodiments, configuration information for the asynchronous wire and/or the node terminals may be provided by a use via a GUI, and/or programmatically by another process, e.g., another program.

In 1808, the graphical program may be executed. In preferred embodiments, executing the graphical program includes executing the first and second nodes, where the first and second nodes communicate asynchronously during the execution of the first and second nodes.

Figure 20:
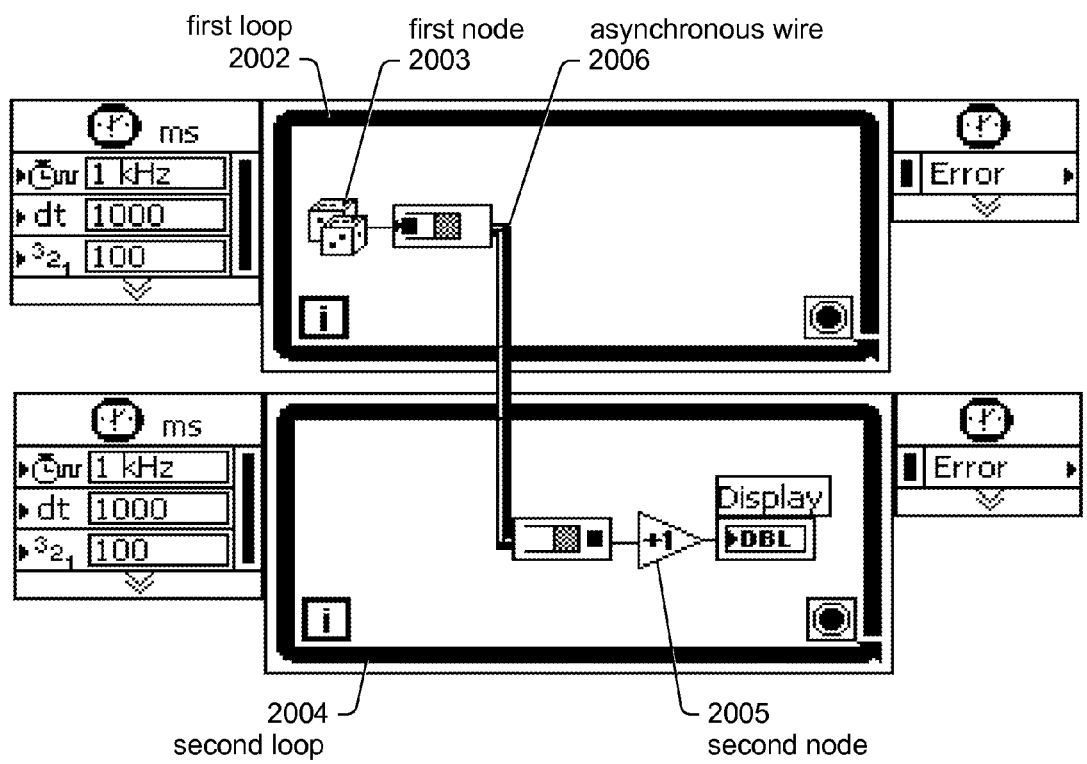
FIG. 20 illustrates one embodiment of an exemplary graphical program that includes two separately executable while loops with respective nodes coupled via an asynchronous wire.

FIG. 20 illustrates one embodiment of an exemplary graphical program that includes two separately executable while loops similar to those of FIG. 1, where a first loop 2002 includes a first node, in this case a random number generation node 2003, and a second loop 2004 includes a second node, in this case an add node 2005, similar to the graphical program of FIG. 1. However, as may be seen, in this embodiment, the first node (random number node) 2003 is connected to the second node (add node) 2005 via an asynchronous wire 2006. Note that in this example, the asynchronous wire is attached only to the terminals of the first and second nodes, and does not attach to the loops themselves. Thus, in this example program, while both loops are executing, causing their respective included nodes to execute per cycle, the nodes may communicate in an asynchronous manner. More specifically, during execution, the random number generator node 2003 may operate to send random number over the asynchronous wire 806 to the add node 2005, which may add "1" to the received value, and output the resultant value for display (as a double value).

Thus, the asynchronous wire may allow users to create a static connection between nodes in a (block diagram of) a graphical program to facilitate asynchronous communication between the nodes. In some embodiments, this connection may be depicted as a special, asynchronous, wire with a specific graphical appearance. For example, in one embodiment, the asynchronous wire may have a 3D tube-like appearance, although any other appearance may be used as desired. Examples of such a graphically rendered asynchronous wire are illustrated in FIGS. 7 and 8. In some embodiments, the directionality of the asynchronous wire may also be indicated, e.g., via an arrow or multiple arrows, displayed on or near the asynchronous wire.

In one embodiment, asynchronous wires may be evaluated during a type propagation phase, e.g., at compile time. This wire evaluation may be performed as a part of the type propagation phase, e.g., in the LabVIEW development system. In this phase the diagram may be traversed and logically executed by type (not by value), so that it is possible to compute the types of all wires and terminals, and thus to type-check the diagram. For example, constant folding may be used to propagate constant values from the source of an asynchronous wire to its sink. In this approach, as a part of type propagation, the values of constants are evaluated as far as possible on the diagram. This allows the elimination of dead code, such as unreachable cases in a case statement. This may allow the end points to share static entities such as block diagram constants and constant references, such as references to a VI instance. At run-time this may result in a connection between source and sink that does not obey standard (e.g., LabVIEW) data-flow rules.

For example, in the simple example program of FIG. 19, the source and sink are connected through an asynchronous wire that may carry a string constant used to access a common, named queue, which is a FIFO data structure. Note that a significant difference between a traditional LabVIEW wire and the asynchronous wire connection between the source and sink is that there is no data flow dependency between them in the latter case, and so the two graphical program nodes can run in parallel, while exchanging data. In other words, the asynchronous wire is a new type of wire with different semantics, where, in particular, there is not the normal data flow dependency between nodes connected with an asynchronous wire, and in fact, nodes connected by such a wire are actually supposed to run in parallel, as opposed to serially when connected with a regular wire. Note that in general, it would be an error to connect two nodes with both a regular wire and an asynchronous wire. Note further that asynchronous wires may be allowed to create cycles in a graphical program, e.g., in a LabVIEW graph, since doing so may not introduce a danger of deadlock or undefined behavior at run-time. Additionally, in some embodiments, multiple sources on asynchronous wires may be facilitated. Similarly, in some embodiments, multiple sinks on asynchronous wires may be allowed.

The asynchronous wire may be denoted by a type attribute (and so behaviorally polymorphic nodes may be possible), namely, a typedef with a special name. In other words, asynchronous wires may have a data type, and so may benefit from the many uses of such typing, as is well known to those of skill in the programming arts, e.g., polymorphism and type checking, among others.

It should be noted that while the example uses of asynchronous wires described herein are within a single program, in other embodiments, asynchronous wires may be used to connect different programs, e.g., to connect nodes that are comprised in different respective graphical programs. Moreover, in some embodiments, the different programs may be even running on different processors or programmable hardware elements, such as field programmable gate arrays (FPGAs).

In preferred embodiments, the asynchronous wires may each be implemented by a respective graphical program. In other words, the functionality of an asynchronous wire may be provided by an associated graphical program. More specifically, each asynchronous wire may use, be associated with, or represent, an instance of a graphical program, which, for brevity, may be referred to simply as a graphical program. Thus, multiple asynchronous wires may each utilize or have a respective instance of the same graphical program. The graphical program for each asynchronous wire may be configured to implement and enforce the various communication policies of the wire, e.g., read and write policies, as discussed above. Thus, each instance of the graphical program may be configured for the particular behavior desired for the respective asynchronous wire. Note that since graphical programs may store and maintain state information, the data transmitted on or by the asynchronous wire may also be included in or implemented by the graphical program. Note also that the graphical program associated with an asynchronous wire may not generally be visible to the user, i.e., may be hidden, although of course, means may be provided for displaying the graphical program of an asynchronous wire for development purposes.

Since the endpoints of an asynchronous wire may share a common, static reference to a VI instance it may be possible to implement a wide variety of run-time connections between the endpoints, thus allowing custom run-time behavior of a node. For example, in various embodiments, some of the possible behaviors of an asynchronous wire may include: implementing queues of various kinds, including FPGA FIFOs and RT (real time) FIFOs; single element communication (e.g., anonymous global variables); synchronization primitives, such as notifiers, semaphores, rendesvous and occurrences; and expressing a connection to and from a part of a diagram that is being executed on a remote target, e.g., "roping in" of a piece of a diagram so that it can execute on the remote target in conjunction with local execution of the remainder of the diagram.

In some embodiments, an asynchronous wire may not be limited to propagating information from terminal sources to terminal sinks. In other words, in some embodiments, the asynchronous wire (and possibly the terminals of the connected nodes) may be configured to transmit data in either direction or in both directions. In other words, in some embodiments and configurations, the asynchronous wire may facilitate two-way communications between the connected nodes. For example, in one embodiment, a dual queue may be used to facilitate such two-way communications, where one queue is used for a first direction, and another queue is used for a second direction, although any other data structures and techniques may be used as desired.

Figure 21:
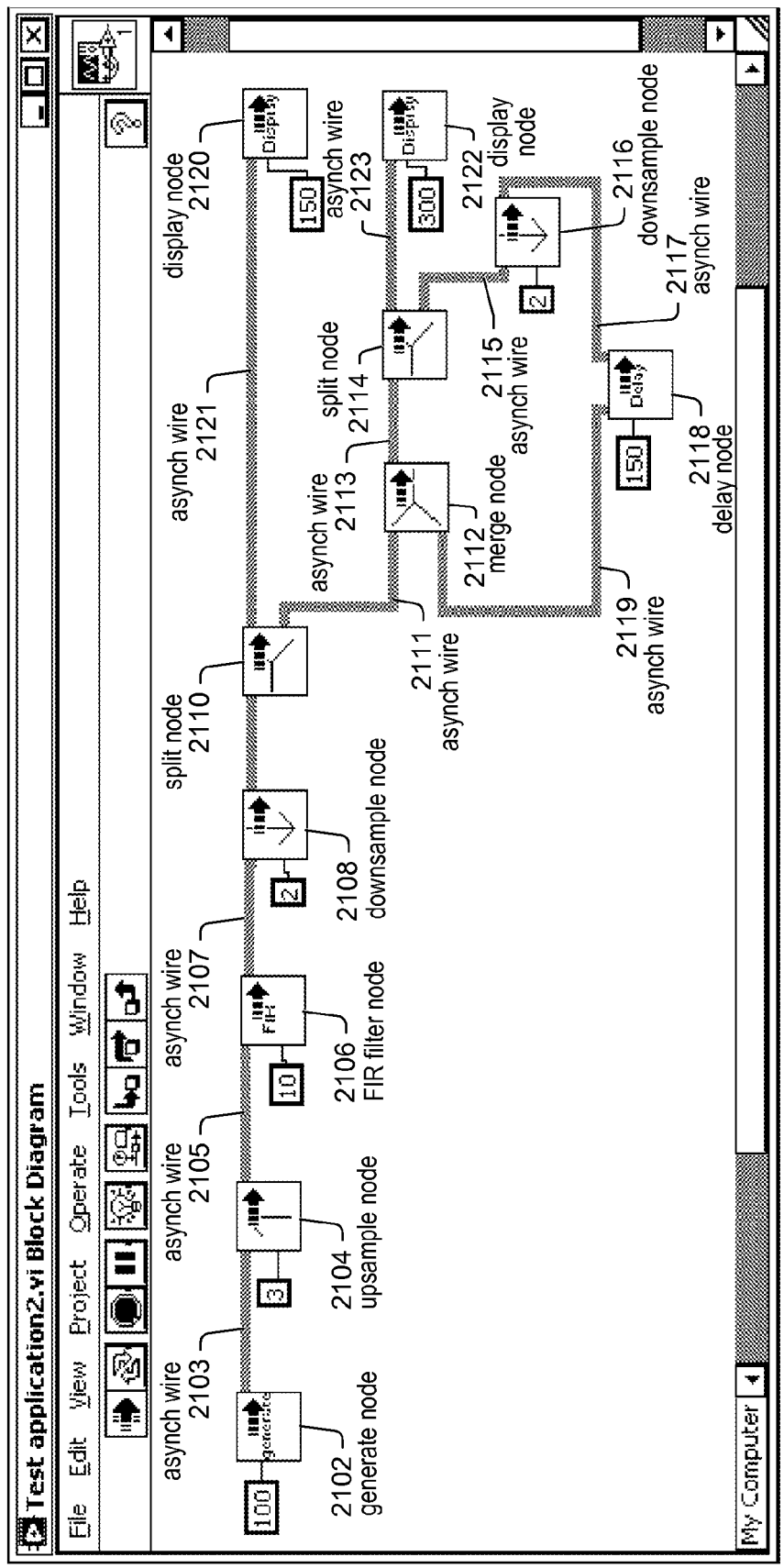
FIG. 21 illustrates one embodiment of an exemplary signal processing graphical program with multiple asynchronous wires.

FIG. 21 is an exemplary graphical program utilizing asynchronous wires that is slightly more complex than those of FIGS. 19 and 20, wherein various aspects of asynchronous wires are demonstrated in a signal processing application. As FIG. 21 shows, beginning from the far left of the figure, a generate node 2102 is configured to generate 100 samples of a function or signal, e.g., a sine wave, and communicate these data over an asynchronous wire 2103 to upsample node 2104, which may operate to upsample the transmitted signal from the generate node 2102 by a factor of 3, as indicated. The upsampled data may then be transmitted over asynchronous wire 905 to finite filter response (FIR) filter node 2106, which is configured with a window of 10 samples. This node may filter the received signal and transmit the resulting data to downsample node 2108, which may operate to downsample the data by a factor of 2, e.g., halving the number of samples in the signal. The resultant signal or data then proceeds to split node 2110 via asynchronous wire 2109, where the signal is propagated along asynchronous wires 2111 and 2121. Note that split node 2110 demonstrates two asynchronous wires 2111 and 2121 sharing a common source, specifically, split node 2110, whose function is to take an input and provide output on two different wires. As shown, the data on asynchronous wire 2121 is provided to display node 2120 for display, which, as indicated, is configured to display 150 samples at a time, e.g., on a graphical user interface (GUI). The sinusoidal waveform display 2210 of FIG. 22 illustrates exemplary output from the display node 920.

As FIG. 21 indicates, asynchronous wire 2111 may transmit the signal to merge node 2112 which may operate to interleave data received from asynchronous wires 2111 and 2119, where, as shown, the signal on asynchronous wire 2119 is from delay node 2118, described below. The results of the merge node 2112 may be transmitted on asynchronous wire 2113 to split node 2114, which, as shown, may provide the received signal to display node 2122 via asynchronous wire 2123, where the signal may be displayed 300 samples at a time. The sinusoidal waveform display 2220 of FIG. 22 illustrates exemplary output from the display node 2122.

The split node 2114 may also provide the received signal to downsample node 2116 via asynchronous wire 2115, where the downsample node 2116 may operate to downsample the received signal by a factor of 2, and transmit the resultant downsampled signal over asynchronous wire 2117 to delay node 2116. Note that the delay node 2118 is initialized with 150 values (samples), and may operate to provide 1 sample at a time to the merge node 2112, introduced above. Thus, the merge node 912 may receive data from asynchronous wires 2119 and 2111, and interleave samples to generate the signal transmitted on asynchronous wire 2113, as described above. Note that merge node 2112 illustrates a sink (merge node 2112) with two sources (split node 2110 via asynchronous wire 2111, and delay node 2118 via asynchronous wire 2119). Note also that nodes 2112, 2114, 2116, and 2118 form a cycle via respective asynchronous wires 2113, 2115, 2117, and 2119, which is not supported in standard data flow diagrams, thus, as noted above, the asynchronous wires may facilitate or accommodate non-data flow behaviors.

Figure 23:
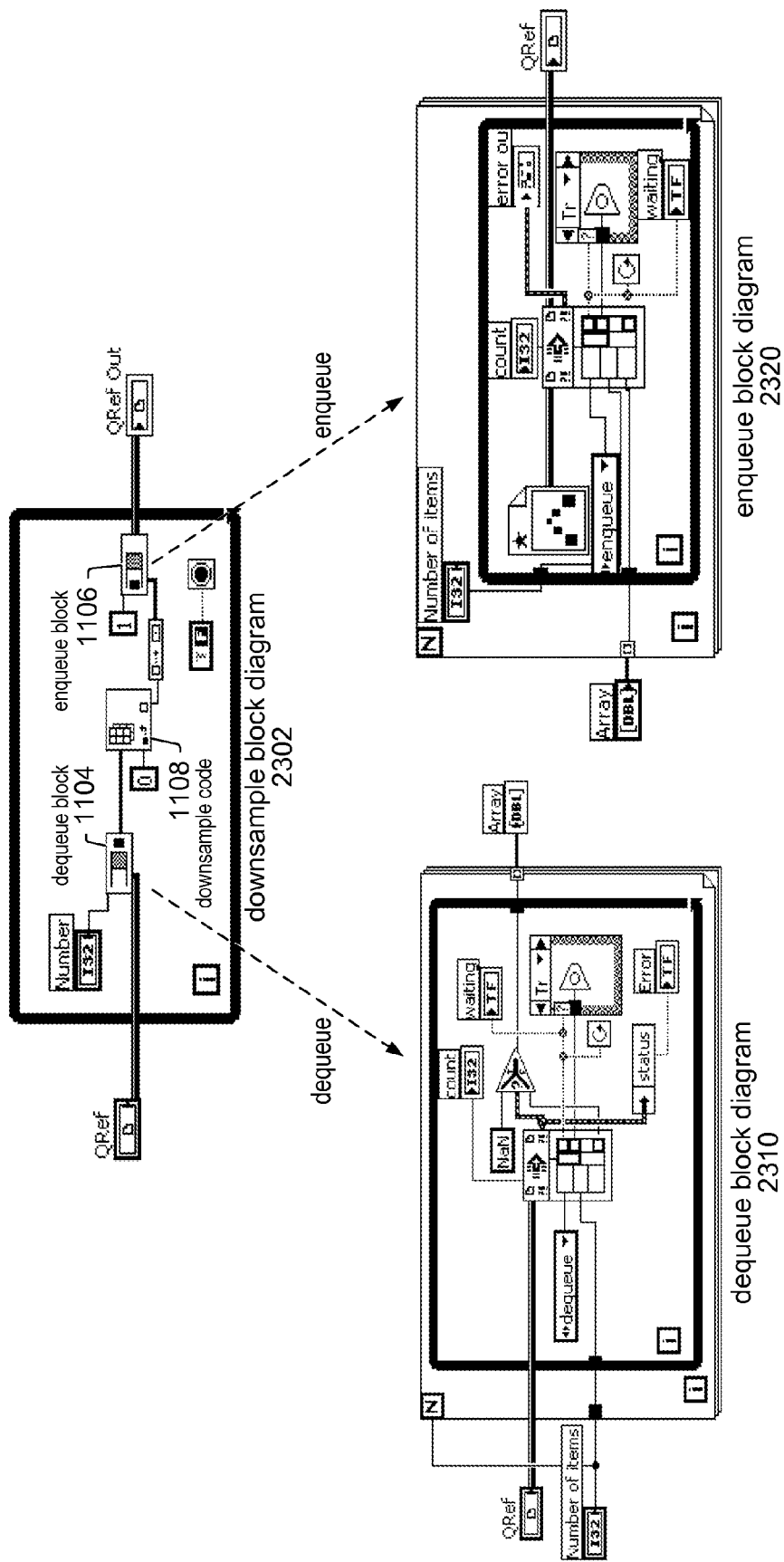
FIG. 23 illustrates an exemplary embodiment of a downsample node from the graphical program of FIG. 21, where asynchronous I/O for the node is implemented via queues.

FIG. 23 illustrates one embodiment of asynchronous communication mechanisms used in the downsample nodes of FIG. 21. More specifically, FIG. 23 illustrates use of a queue, a FIFO structure, for receiving data from an asynchronous wire, and providing data as output to another asynchronous wire.

As shown, a downsample node, whose functionality is illustrated in the top block diagram 2308 of FIG. 23, has access to a queue reference via the incoming asynchronous wire, denoted as QRef. The node preferably accesses and reads data from the queue of the input asynchronous wire using a dequeue process implemented in a dequeue block 2304, a detailed view of which is illustrated in the bottom left block diagram 2310 of FIG. 23. For example, in one embodiment, the (bottom left) block diagram 2310 receives a reference to a dequeue function of the queue and invokes this dequeue function to read values from the queue. The output read values may then be output, as indicated by the output Array shown on the right side of the block diagram 2310, and provided as input for use by downsample code 2308 included in the block diagram. Note that values may be read from the queue singly, or in multiples, as desired. Once the signal has been downsampled by the downsample code 2308, the results may be provided to an enqueue process for output on the exiting asynchronous wire, as described below.

Similarly, to transmit data as output onto the asynchronous wire exiting the downsample node, the node may access and write data to a queue referenced by an output queue reference, denoted in the top block diagram as QRef Out (see far right of the block diagram). The node preferably accesses and writes data to the queue of the output asynchronous wire using an enqueue process implemented in an enqueue block 2306, illustrated in the bottom right block diagram 2320 of FIG. 23. For example, in one embodiment, the (bottom right) block diagram 2320 receives a reference to an enqueue function of the output queue and invokes the enqueue function to write values to the queue. The values to be written to the queue may be provided in the form of an input array, as indicated by the input Array shown on the left side of the block diagram. Note that similar to the dequeue process, values may be written to the queue singly, or in multiples, as desired. Writing the data to the output queue thus places the data on the exiting asynchronous wire for transmission to a node connected to the other end of the asynchronous wire.

While the example asynchronous wires/terminals presented above use queues, it should be noted that any other types of data structure may be used as desired, e.g., other FIFO structures, stacks, graphs, arrays, lists, and so forth.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A method comprising:
displaying a diagram on a display in response to user input, wherein the diagram comprises a plurality of icons that are connected by wires, wherein the plurality of interconnected icons visually represents functionality of the diagram, and wherein the diagram is executable to perform the functionality;
receiving input configuring a first icon in the diagram, wherein the first icon is operable to receive one or more inputs and/or produce one or more outputs, and wherein the input specifies data transfer functionality for the first icon; and displaying a data transfer indicator based on said receiving input configuring the first icon, wherein the data transfer indicator visually indicates the data transfer functionality configuration.

2. The method of claim 1, wherein said displaying the data transfer indicator based on said receiving input configuring the first icon comprises displaying the data transfer indicator proximate to the first icon.

3. The method of claim 1, wherein the data transfer functionality comprises one or more data exchange semantics.

4. The method of claim 3, wherein the one or more data exchange semantics comprise one or more of:
   one or more read policies;
   one or more write policies;
   directionality of the wire;
   one or more associated or included data structures;
   semantics of wire branching;
   one or more queues; or
   one or more buffer sizes.

5. The method of claim 1, wherein the data transfer functionality comprises a data transport protocol.

6. The method of claim 5, wherein the data transport protocol comprises one or more of:
   TCP/IP;
   USB;
   DMA (direct memory access); or
   register access.

7. The method of claim 1, wherein the data transfer functionality comprises a data transport medium.

8. The method of claim 1, wherein the data transfer functionality comprises one or more read and/or write policies of the first icon.

9. The method of claim 1, wherein the data transfer indicator has a plurality of visual appearances, wherein each visual appearance is associated with a respective type of data transfer functionality, and wherein the data transfer indicator visually indicating the data transfer functionality comprises displaying a visual appearance of the plurality of visual appearances associated with the data transfer functionality.

10. The method of claim 9, wherein the plurality of possible visual appearances comprises one or more of different patterns, different colors, and/or different sizes.

11. The method of claim 1, wherein the data transfer indicator comprises an image indicating one or more of:
    a mailbox;
    a FIFO;
    a table;
    a register; or
    a buffer.

12. The method of claim 1, wherein the data transfer indicator indicates a mailbox, wherein the data transfer indicator comprises an arrow and a rectangle.

13. The method of claim 1, wherein the data transfer indicator indicates a circular buffer, wherein the data transfer indicator comprises at least one circle and an arrow.

14. The method of claim 1, wherein the data transfer indicator indicates a FIFO, wherein the data transfer indicator comprises a plurality of rectangles and an arrow.

15. The method of claim 1, wherein the first icon comprises the data transfer indicator.

16. The method of claim 1, wherein the diagram comprises a data flow diagram, wherein the icons represent functions, and wherein the wires indicate that data produced by one icon is used by another icon.

17. The method of claim 1, wherein at least a subset of the plurality of icons each represent a respective processing element, and wherein each processing element has an associated program for execution by the processing element.

18. The method of claim 1,
    wherein said receiving input configuring the first icon in the diagram comprises receiving input configuring a terminal of the first icon in the diagram;
    wherein the data transfer indicator is displayed proximate to the terminal.

19. A non-transitory computer-accessible memory medium comprising program instructions that are executable to:
    display a plurality of icons in a diagram;
    receive user input specifying data transfer functionality of at least one icon of the plurality of icons;
    display a data transfer indicator in the diagram in response to the user input specifying the data transfer functionality of the at least one icon, wherein the data transfer indicator has a visual appearance associated with the specified data transfer functionality, and wherein the data transfer indicator visually indicates the data transfer functionality configuration of the at least one icon.

20. The non-transitory computer-accessible memory medium of claim 19, wherein the data transfer functionality comprises one or more data exchange semantics.

21. The non-transitory computer-accessible memory medium of claim 19, wherein the data transfer functionality comprises a data transport protocol.

22. The non-transitory computer-accessible memory medium of claim 19, wherein the data transfer functionality comprises a data transport medium.

23. The non-transitory computer-accessible memory medium of claim 19, wherein the data transfer indicator has a plurality of visual appearances, wherein each visual appearance is associated with a respective type of data transfer functionality, and wherein said displaying the data transfer indicator comprises displaying the respective visual appearance associated with the type of data transfer functionality specified by the user input.

24. The non-transitory computer-accessible memory medium of claim 19, wherein the visual appearance represents one or more of:
    a mailbox;
    a FIFO;
    a table;
    a register; or
    a buffer.

25. A system, comprising:
    a processor; and
    a memory medium coupled to the processor, wherein the memory medium comprises program instructions executable by the processor to:
      display a first icon in a diagram;
      receive user input selecting a data transfer indicator from a plurality of data transfer indicators, wherein the data transfer indicator has an appearance visually indicating respective data transfer functionality;
      associate the data transfer indicator with the first icon, wherein said associating configures the first icon with the data transfer functionality indicated by the data transfer indicator; and
      display the data transfer indicator in the diagram in response to said associating.

26. The system of claim 25, wherein the visual appearance represents one or more of:
    a mailbox;
    a FIFO;
    a table;
    a register; or
    a buffer.

* * * * *